(12) United States Patent
Kusumoto et al.

(10) Patent No.: US 7,713,800 B2
(45) Date of Patent: May 11, 2010

(54) SEMICONDUCTOR DEVICE AND MANUFACTURING METHOD THEREOF

(75) Inventors: Naoto Kusumoto, Kanagawa (JP); Nobuharu Ohsawa, Kanagawa (JP); Mikio Yukawa, Kanagawa (JP); Yoshitaka Dozen, Tochigi (JP)

(73) Assignee: Semiconductor Energy Laboratory Co., Ltd., Atgusi-shi, Kanagawa-ken (JP)

( * ) Notice: Subject to any disclaimer, the term of this patent is extended or adjusted under 35 U.S.C. 154(b) by 166 days.

(21) Appl. No.: 11/593,651

(22) Filed: Nov. 7, 2006

(65) Prior Publication Data
US 2007/0105285 A1 May 10, 2007

(30) Foreign Application Priority Data
Nov. 9, 2005 (JP) ............................. 2005-325448

(51) Int. Cl.
*H01L 21/00* (2006.01)
(52) U.S. Cl. ............... 438/151; 438/29; 257/E27.111; 313/504
(58) Field of Classification Search ............... 438/29, 438/151, 155; 313/504; 257/E27.111
See application file for complete search history.

(56) References Cited

U.S. PATENT DOCUMENTS

| | | | |
|---|---|---|---|
| 5,206,749 A | 4/1993 | Zavracky et al. | |
| 5,317,236 A | 5/1994 | Zavracky et al. | |
| 5,376,561 A | 12/1994 | Vu et al. | |
| 5,821,138 A | 10/1998 | Yamazaki et al. | |
| 6,043,800 A | 3/2000 | Spitzer et al. | |
| 6,885,030 B2 * | 4/2005 | Onozuka et al. | 257/66 |
| 6,979,837 B2 | 12/2005 | Tripsas et al. | |
| 7,226,848 B2 | 6/2007 | Sugawara et al. | |
| 7,264,979 B2 | 9/2007 | Yamagata et al. | |

(Continued)

FOREIGN PATENT DOCUMENTS

JP 2002-026277 1/2002

(Continued)

OTHER PUBLICATIONS

Invitation to Pay Additional Fees (Application No. PCT/JP2006/322418) dated Nov. 28, 2006.

(Continued)

*Primary Examiner*—Charles D. Garber
*Assistant Examiner*—Stanetta D Isaac
(74) *Attorney, Agent, or Firm*—Eric J. Robinson; Robinson Intellectual Property Law Office, P.C.

(57) ABSTRACT

To provide a semiconductor device which is higher functional and reliable and a technique capable of manufacturing the semiconductor device with a high yield at low cost without complexing the apparatus or process. At least one of a first conductive layer and a second conductive layer is formed containing one kind or plural kinds of indium, tin, lead, bismuth, calcium, manganese, or zinc; or oxidation treatment is performed at least one of interfaces between an organic compound layer and the first conductive layer and between the organic compound layer and the second conductive layer. The first conductive layer, the organic compound layer, and the second conductive layer which are formed over a first substrate with a peeling layer interposed therebetween can be peeled from the first substrate with the peeling layer, and transposed to a second substrate.

23 Claims, 22 Drawing Sheets

U.S. PATENT DOCUMENTS

| | | | |
|---|---|---|---|
| 7,268,487 B2* | 9/2007 | Yamazaki et al. | 313/506 |
| 2002/0113248 A1* | 8/2002 | Yamagata et al. | 257/187 |
| 2004/0026690 A1 | 2/2004 | Bernds et al. | |
| 2004/0056589 A1* | 3/2004 | Yamazaki et al. | 313/506 |
| 2004/0087110 A1* | 5/2004 | Takayama et al. | 438/458 |
| 2004/0232458 A1* | 11/2004 | Natori et al. | 257/295 |
| 2004/0240261 A1 | 12/2004 | Kano | |
| 2005/0005850 A1* | 1/2005 | Yamazaki | 118/719 |
| 2006/0275710 A1 | 12/2006 | Yamazaki et al. | |
| 2007/0004102 A1 | 1/2007 | Dairiki et al. | |
| 2008/0042180 A1* | 2/2008 | Yamazaki et al. | 257/306 |
| 2008/0128517 A1 | 6/2008 | Yukawa et al. | |
| 2008/0144349 A1 | 6/2008 | Kato et al. | |

FOREIGN PATENT DOCUMENTS

| | | |
|---|---|---|
| JP | 2002-026282 | 1/2002 |
| JP | 2004-509458 | 3/2004 |
| JP | 2004-128471 | 4/2004 |
| JP | 2004-304172 | 10/2004 |
| JP | 2004-304179 | 10/2004 |
| WO | WO 2004/015778 | 2/2004 |
| WO | WO 2006-080478 | 8/2006 |
| WO | WO 2006/080550 | 8/2006 |

OTHER PUBLICATIONS

International Search Report (Application No. PCT/JP2006/322418) Dated Feb. 6, 2007.

Written Opinion (Application No. PCT/JP2006/322418) Dated Feb. 6, 2007.

* cited by examiner

275

FIG. 13A
FIG. 13B
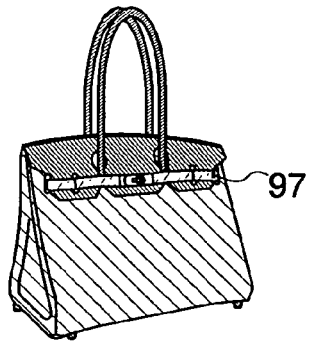
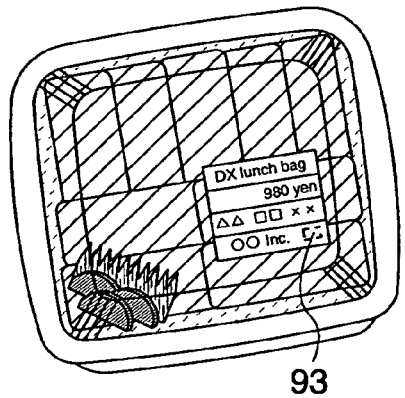
FIG. 13C
FIG. 13D
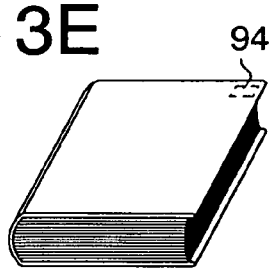
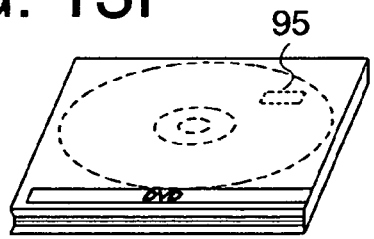
FIG. 13E
FIG. 13F
FIG. 13G
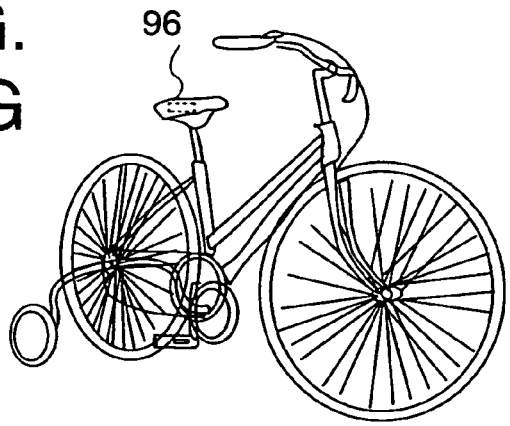

SEMICONDUCTOR DEVICE AND MANUFACTURING METHOD THEREOF

TECHNICAL FIELD

The present invention relates to a semiconductor device and a manufacturing method of the semiconductor device.

BACKGROUND ART

Recently, an individual-recognition technique has drawn attention, in which by giving an ID (individual identification number) to each object, information such as a history of the object is clarified for manufacturing, management, or the like. In particular, a semiconductor device capable of non-contact data transmission and reception has been developed. As such a semiconductor device, an RFID (Radio Frequency Identification: also called an ID tag, an IC tag, an IC chip, an RF (Radio Frequency) tag, a wireless tag, an electronic tag, or a wireless chip) or the like specifically begins to be introduced into companies, markets, or the like.

Such a semiconductor device generally includes an antenna and a circuit (hereinafter, also referred to as an IC (Integrated Circuit) chip) using a semiconductor substrate of silicon (Si) or the like, and the IC chip is constituted from a memory circuit (hereinafter also referred to as a memory), a control circuit, or the like.

In addition, a semiconductor device such as a liquid crystal display device or an electro-luminescence display device, in which thin film transistors (hereinafter also called TFTs) are integrated over a glass substrate, has been developed. In such a semiconductor device, a thin film transistor is formed over a glass substrate by using a thin-film formation technique, and either a liquid crystal element or a light-emitting element (an electro-luminescence element, hereinafter also called an EL element) is formed as a display element over various circuits constituted from the thin film transistors, thereby the semiconductor device functions as a display device.

In a manufacturing process of the above-described semiconductor device, in order to reduce manufacturing cost, a process of transposing an element, a peripheral circuit, or the like manufactured over a glass substrate onto an inexpensive substrate such as a plastic substrate has been performed (e.g., see Reference 1: Japanese Published Patent Application No. 2002-26282).

DISCLOSURE OF INVENTION

However, if adhesion between thin films for constituting the element which is to be transposed is low, there is a problem of being peeled off not properly and destroying the element. In particular, in the case where a memory element is formed by providing an organic compound between a pair of electrodes, film peeling tends to occur at an interface between the electrode and the organic compound layer. In FIGS. 15A to 15C, a step for transposing a memory element using an organic compound layer is shown.

FIG. 15A shows a memory element constituted from a first conductive layer 80a, an organic compound layer 81a, and a second conductive layer 82a; FIG. 15B shows a memory element constituted from a first conductive layer 80b, an organic compound layer 81b, and a second conductive layer 82b; and FIG. 15C shows a memory element constituted from a first conductive layer 80c, an organic compound layer 81c, and a second conductive layer 82c. Although not shown, a first substrate is provided on the side of each of the first conductive layers 80a to 80c, and a second substrate is provided on the side of each of the second conductive layers 82a to 82c. The first substrate is a substrate from which the formed memory element is peeled off, whereas the second substrate is a substrate by which the memory element is peeled off from the first substrate. The memory elements of FIGS. 15A to 15C are subjected to force in the directions denoted by arrows, from the first substrate from which the memory element is peeled off and the second substrate by which the memory element is peeled off, when peeling is performed.

FIG. 15A is the case where the organic compound layer 81a and the second conductive layer 82a are peeled from each other at the interface because of poor adhesion between the organic compound layer 81a and the second conductive layer 82a. FIG. 15B is the case where the organic compound layer 81b and the first conductive layer 80b are peeled from each other at the interface because of poor adhesion between the organic compound layer 81b and the first conductive layer 80b. FIG. 15C is the case where the organic compound layer 81c and the first conductive layer 80c are peeled from each other at the interface, and the organic compound layer 81c and the second conductive layer 82c are peeled from each other at the interface because of poor adhesion between the organic compound layer 81c and both of the first conductive layer 80c and the second conductive layer 82c. As described above, inferior adhesion among the first conductive layer, the organic compound layer, and the second conductive layer may destroy the memory element by causing film peeling at an interface in the peeling process; therefore, it is difficult to transpose the memory element with a good state maintaining the form and properties before the peeling.

In view of the foregoing problem, the present invention provides a technique capable of manufacturing a semiconductor device having a memory element having good adhesion inside the memory element, so that a transposition step can be performed with a good state maintaining the form and properties before peeling. Therefore, it is also an object of the invention to provide a technique capable of manufacturing a semiconductor device having higher reliability with a high yield without complexing the apparatus or process.

In the invention, a memory element in which an organic compound layer is provided between a pair of electrodes is used as a memory element. The memory element is formed over a first substrate which is resistant to a process condition (e.g., the temperature), and then is transposed to a second substrate, thereby completing a semiconductor device having the memory element. In such a case, it is important that adhesion among a first conductive layer, an organic compound layer, and a second conductive layer constituting the memory element is good. If the adhesion among the stacked layers constituting the memory element is poor, film peeling occurs at an interface among the layers in a peeling process so that the element is destroyed, thereby transposition with a good form cannot be performed. In this specification, the "good form" refers to: a state in which appearance is not damaged by film peeling, a peeling residual, or the like, and the form before peeling is maintained; or a state in which electrical properties, reliability, or the like is not reduced by peeling, and the properties before peeling are maintained. Further in this specification, the "transposition" refers that the memory element formed over the first substrate is peeled off from the first substrate and transposed to the second substrate; in other words, a space for providing the memory element is moved to another substrate.

The invention focuses on adhesion between the organic compound layer and the first conductive layer and between the organic compound layer and the second conductive layer. Adhesion between substances is affected by the solubility parameter (SP value). Solubility parameter is a value of the ½-th power of the cohesive energy density (CED) of one molecule per unit volume.

As SP values of substances get closer to each other, adhesion between the substances is increased. In general, the SP value of an organic compound material is smaller as compared to that of a metal material. Therefore, for improving the adhesion between the organic compound layer and the conductive layer, an organic compound material having an SP value as large as possible is preferably selected for the organic compound layer whereas a metal material having an SP value as small as possible is preferably selected for the conductive layer, so that difference between the SP value of the material used for the organic compound layer and the SP value of the material used for the conductive layer can be reduced.

In the invention, as a metal material used for at least one of the first conductive layer and the second conductive layer, one kind or plural kinds of the following are used: indium (In), tin (Sn), lead (Pb), bismuth (Bi), calcium (Ca), antimony (Sb), and zinc (Zn). Further, one kind or plural kinds of the following are used as well: magnesium (Mg), manganese (Mn), cadmium (Cd), thallium (Tl), tellurium (Te), and barium (Ba). A plurality of the above-described metal materials may be contained, or an alloy containing one kind or plural kinds of the above-described materials may be used. In particular, a metal having relatively small solubility parameter, that is indium (In), tin (Sn), lead (Pb), bismuth (Bi), calcium (Ca), manganese (Mn), or zinc (Zn), or an alloy containing the above metal is suitable as an electrode material. As the alloy capable of being used, there is an indium alloy such as an indium-tin alloy (InSn), a magnesium-indium alloy (InMg), an indium-phosphorus alloy (InP), an indium-arsenic alloy (InAs), or indium-chromium alloy (InCr).

Meanwhile, the SP value of an organic material is increased as the polarity becomes large. As an organic compound material used for the organic compound layer, therefore, a material which has a skeleton formed of a sulfonyl group (a thiol group), a cyano group, an amine group, a carbonyl group, or the like within the molecular structure may be preferably used.

In addition, interface tension at an interface between layers within an element also affects adhesion between the layers. As the interface tension between layers gets smaller, adhesion between the layers is increased so that a defect such as film peeling becomes harder to occur in the peeling process. Therefore, a peeling and transposing process of an element can be performed with a good form. Interface tension can be guessed from the surface tension against air, nitrogen, helium, or the like, and the surface tension of a metal is larger than that of an organic material. Further, wettability of a metal material against an organic material is improved by oxidizing a surface of the metal material. Therefore, by performing oxidation treatment to an interface between the conductive layer using a metal material and the organic compound layer using an organic compound material, the interface tension can be reduced. It is preferable that the interface tension is 1.5N/m or less.

As the treatment for reducing the interface tension, the following is performed: the conductive layer is exposed to an oxygen atmosphere; a surface of the conductive layer is oxidized by ozone ($O_3$) which is generated by irradiation with ultraviolet light in an oxygen atmosphere; or the like. Alternatively, oxygen plasma may be contacted; the conductive layer may be oxidized by the organic compound material contained in the organic compound, at the interface between the layers; or the like. Further, in addition to the oxidation treatment, nitriding treatment may also be performed. In this manner, treatment for reducing the interface tension may be performed to a surface which is in contact with the organic compound layer, of at least one of the first conductive layer and the second conductive layer.

In addition, a combination of materials such that an atom of an organic material constituting the organic compound layer and an atom of a metal material constituting the conductive layer bond chemically to each other may be preferably used, thereby improving adhesion between the organic compound layer and the conductive layer.

Note that in this specification, the "semiconductor device" refers to a device which can function by utilizing semiconducting properties. A semiconductor device such as an integrated circuit or a chip having a processor circuit, having a memory element can be manufactured using the invention.

In a semiconductor device of the invention, a memory element which includes an organic compound layer between a first conductive layer and a second conductive layer is included, in which at least one of the first conductive layer and the second conductive layer contains one kind or plural kinds of indium, tin, lead, bismuth, calcium, manganese, and zinc.

In a semiconductor device of the invention, a memory element which includes an organic compound layer between a first conductive layer and a second conductive layer is included, in which at least one of the first conductive layer and the second conductive layer is in contact with the organic compound layer via a film containing an oxide.

In a semiconductor device of the invention, a memory element which includes an organic compound layer between a first conductive layer and a second conductive layer is included, in which the first conductive layer is in contact with the organic compound layer via a film containing an oxide, and the second conductive layer contains one kind or plural kinds of indium, tin, lead, bismuth, calcium, manganese, and zinc.

In a manufacturing method of a semiconductor device of the invention, a memory element is manufactured by forming a first conductive layer, an organic compound layer over the first conductive layer, and a second conductive layer over the organic compound layer, in which at least one of the first conductive layer and the second conductive layer contains one kind or plural kinds of indium, tin, lead, bismuth, calcium, manganese, and zinc.

In a manufacturing method of a semiconductor device of the invention, a memory element is manufactured by forming a first conductive layer, performing oxidation treatment to a surface of the first conductive layer, forming an organic compound layer over the first conductive layer subjected to the oxidation treatment, and forming a second conductive layer over the organic compound layer.

In a manufacturing method of a semiconductor device of the invention, a memory element is manufactured by forming a first conductive layer, performing oxidation treatment to a surface of the first conductive layer, forming an organic compound layer over the first conductive layer subjected to the oxidation treatment, and forming a second conductive layer over the organic compound layer, in which the second conductive layer contains one kind or plural kinds of indium, tin, lead, bismuth, calcium, manganese, and zinc.

In a manufacturing method of a semiconductor device of the invention, a memory element is manufactured by forming a first conductive layer over a first substrate, an organic compound layer over the first conductive layer, and a second conductive layer over the organic compound layer, a second substrate having flexibility is attached to the second conductive layer, the memory element is peeled off from the first substrate, and the memory element is attached to a third substrate with an adhesion layer, in which at least one of the first conductive layer and the second conductive layer contains one kind or plural kinds of indium, tin, lead, bismuth, calcium, manganese, and zinc.

In a manufacturing method of a semiconductor device of the invention, a memory element is manufactured by forming a first conductive layer over a first substrate, performing oxidation treatment to a surface of the first conductive layer, forming an organic compound layer over the first conductive layer subjected to the oxidation treatment, and forming a second conductive layer over the organic compound layer; a second substrate having flexibility is attached to the second conductive layer; the memory element is peeled off from the first substrate; and the memory element is attached to a third substrate with an adhesion layer.

A memory element is manufactured by forming a first conductive layer over a first substrate, performing oxidation treatment to a surface of the first conductive layer, forming an organic compound layer over the first conductive layer subjected to the oxidation treatment, and forming a second conductive layer over the organic compound layer. A second substrate having flexibility is attached to the second conductive layer, the memory element is peeled off from the first substrate, and the memory element is attached to a third substrate with an adhesion layer. The second conductive layer contains one kind or plural kinds of indium, tin, lead, bismuth, calcium, manganese, and zinc. Note that the first conductive layer can also be formed over the first substrate with a peeling layer interposed therebetween.

In the above-described semiconductor device, there is the case where the first conductive layer and the second conductive layer are partially in contact with each other after writing of the semiconductor device, or where the thickness of the organic compound layer is changed.

By the present invention, a semiconductor device including a memory element which has high adhesion inside the memory element so as to perform a transposition step with a good state can be manufactured. Therefore, a semiconductor device having higher reliability can be manufactured with a high yield without complexing the apparatus or process.

BRIEF DESCRIPTION OF DRAWINGS

FIGS. 13A to 13G each show a semiconductor device of the invention.

BEST MODE FOR CARRYING OUT THE INVENTION

Figure 1A:
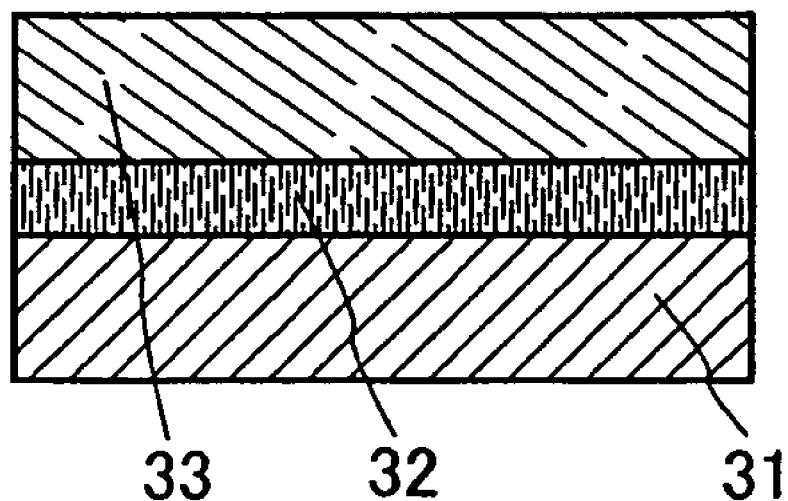
FIGS. 1A and 1B each show the invention.

Although the invention will be described below by way of embodiment modes with reference to the accompanying drawings, it is to be understood that various changes and modifications will be apparent to those skilled in the art. Therefore, unless such changes and modifications depart from the scope of the invention, they should be construed as being included therein. Note that identical portions or the portions having the same functions are denoted by the identical reference numerals in the drawings, thus description thereof is omitted.

Embodiment Mode 1

A memory element to which the present invention is applied will be described in this embodiment mode, using FIGS. 1A and 1B.

The invention focuses on adhesion between the organic compound layer and the first conductive layer and between the organic compound layer and the second conductive layer. Adhesion between substances is affected by the solubility parameter (SP value). Solubility parameter is a value of the ½-th power of the cohesive energy density (CED) of one molecule per unit volume.

As respective SP values of substances get closer to each other, adhesion between the substances is increased. In general, the SP value of an organic compound material is small as compared to that of a metal material. Therefore, for improving the adhesion between the organic compound layer and each conductive layer, an organic compound material having an SP value as large as possible may be selected for the organic compound layer whereas a metal material having an SP value as small as possible may be selected for the conductive layer, so that difference between the SP value of the material used for the organic compound layer and the SP value of the material used for the conductive layer can be reduced. It is preferable that a difference between an SP value of the material used for the organic compound layer and an SP value of the material used for the conductive layer is 120 or less.

In the invention, as a metal material used for at least one of the first conductive layer and the second conductive layer, one kind or plural kinds of the following are used: indium (In), tin (Sn), lead (Pb), bismuth (Bi), calcium (Ca), antimony (Sb), and zinc (Zn). Further, one kind or plural kinds of the following are used as well: magnesium (Mg), manganese (Mn), cadmium (Cd), thallium (Tl), tellurium (Te), and barium (Ba). A plurality of the above-described metal materials may be contained, or an alloy containing one kind or plural kinds of the above-described materials may be used. In particular, a metal having relatively small solubility parameter, that is indium (In), tin (Sn), lead (Pb), bismuth (Bi), calcium (Ca), manganese (Mn), or zinc (Zn), or an alloy containing the above metal is suitable as an electrode material. As the alloy capable of being used, there is an indium alloy such as an indium-tin alloy (InSn), a magnesium-indium alloy (InMg), an indium-phosphorus alloy (InP), an indium-arsenic alloy (InAs), or indium-chromium alloy (InCr).

Meanwhile, the SP value of an organic material is increased as the polarity becomes large. As an organic compound material used for the organic compound layer, therefore, a material which has a skeleton formed of a sulfonyl group (a thiol group), a cyano group, an amine group, a carbonyl group, or the like may be preferably used.

FIG. 1A shows a memory element in which an organic compound layer 32 is provided between a first conductive layer 31 and a second conductive layer 33. In FIG. 1A, as a metal material used for the second conductive layer 33, one kind or plural kinds of the following are used: indium (In), tin (Sn), lead (Pb), bismuth (Bi), calcium (Ca), antimony (Sb), and zinc (Zn). Further, one kind or plural kinds of the following are used as well: magnesium (Mg), manganese (Mn), cadmium (Cd), thallium (Tl), tellurium (Te), and barium (Ba). A plurality of the above-described metal materials may be contained, or an alloy containing one kind or plural kinds of the above-described materials may be used. In particular, a metal having relatively small solubility parameter, that is indium (In), tin (Sn), lead (Pb), bismuth (Bi), calcium (Ca), manganese (Mn), or zinc (Zn), or an alloy containing the above metal is suitable as an electrode material. As the alloy capable of being used, there is an indium alloy such as an indium-tin alloy (InSn), a magnesium-indium alloy (InMg), an indium-phosphorus alloy (InP), an indium-arsenic alloy (InAs), or indium-chromium alloy (InCr).

Adhesion among the first conductive layer 31, the organic compound layer 32, and the second conductive layer 33 is good, and therefore, a defect such as film peeling does not occur at an interface between the layers by force applied at a step of transposition to a second substrate after the formation over a first substrate. Consequently, the memory element can be peeled off and transposed with a good form, to manufacture a semiconductor device.

As the first conductive layer 31, an element, a compound, or the like having high conductivity is used. Typically, a single-layer or a multi-layer structure formed of one kind of the following elements or an alloy containing a plurality of the following elements can be employed: gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), tantalum (Ta), and the like.

Although the conductive layer containing a metal material having small solubility parameter is used as the second conductive layer 33 in FIG. 1A, the conductive layer containing a metal material having small solubility parameter may also be used as the first conductive layer 31. Further, the conductive layers containing a metal material having small solubility parameter may also be used as both the first conductive layer and the second conductive layer; that case is shown in FIG. 16A.

Figure 16A:
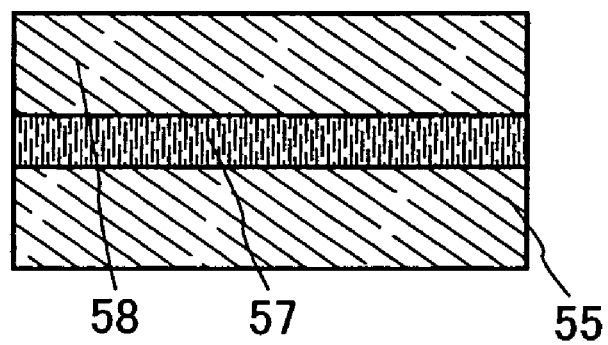
FIGS. 16A to 16C each show the invention.

FIG. 16A shows a memory element in which an organic compound layer 57 is provided between a first conductive layer 55 and a second conductive layer 58. As a metal material each used for the first conductive layer 55 and the second conductive layer 58, one kind or plural kinds of the following are used: indium (In), tin (Sn), lead (Pb), bismuth (Bi), calcium (Ca), antimony (Sb), and zinc (Zn). Further, one kind or plural kinds of the following are used as well: magnesium (Mg), manganese (Mn), cadmium (Cd), thallium (Tl), tellurium (Te), and barium (Ba). A plurality of the above-described metal materials may be contained, or an alloy containing one kind or plural kinds of the above-described materials may be used. In particular, a metal having relatively small solubility parameter, that is indium (In), tin (Sn), lead (Pb), bismuth (Bi), calcium (Ca), manganese (Mn), or zinc (Zn), or an alloy containing the above metal is suitable as an electrode material. As the alloy capable of being used, there is an indium alloy such as an indium-tin alloy (InSn), a magnesium-indium alloy (InMg), an indium-phosphorus alloy (InP), an indium-arsenic alloy (InAs), or indium-chromium alloy (InCr).

Adhesion among the first conductive layer 55, the organic compound layer 57, and the second conductive layer 58 is good, and therefore, a defect such as film peeling does not occur at an interface between the layers by force applied at a step of transposition to a second substrate after the formation over a first substrate. Consequently, the memory element can be peeled off and transposed with a good form, to manufacture a semiconductor device.

In addition, interface tension at an interface between layers within an element also affects adhesion between the layers. As the interface tension between layers gets smaller, adhesion between the layers is increased so that a defect such as film peeling becomes harder to occur in the peeling and transposing process. Therefore, a peeling and transposing process of an element can be performed with a good form. Interface tension can be guessed from the surface tension against air, nitrogen, helium, or the like, and the surface tension of a metal is larger than that of an organic material. Further, wettability of a metal material to an organic material is improved by oxidizing a surface of the metal material. Therefore, by performing oxidation treatment or the like to an interface between the conductive layer using a metal material and the organic compound layer using an organic compound material, the interface tension can be reduced.

As the treatment for reducing the interface tension, the following is performed: the conductive layer is exposed to an oxygen atmosphere; a surface of the conductive layer is oxidized by ozone ($O_3$) which is generated by irradiation with ultraviolet radiation in an oxygen atmosphere; or the like. Alternatively, oxygen plasma may be contacted; the conductive layer may be oxidized by the organic compound material contained in the organic compound, at the interface between the layers; or the like. Further, formation of the conductive layer may be performed in an oxygen atmosphere as well. Further, in addition to the oxidation treatment, nitriding treatment may also be performed; for example, nitriding treatment may be performed after oxidation treatment is performed.

Figure 1B:
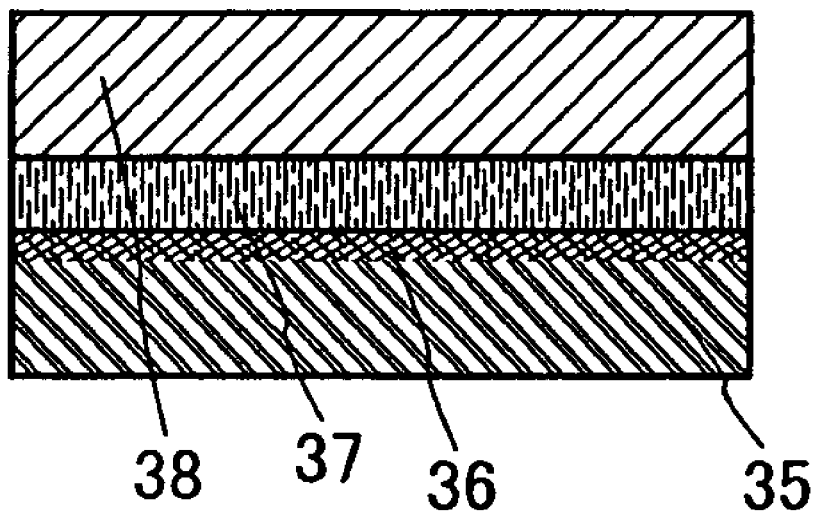

FIG. 1B shows a memory element in which an organic compound layer 37 is provided between a first conductive layer 35 and a second conductive layer 38. The treatment for reducing the interface tension is performed to an interface between the first conductive layer 35 and the organic compound layer 37. In this embodiment mode, a processing region 36 is formed by performing oxidation treatment to the interface between the first conductive layer 35 and the organic compound layer 37.

As shown in FIG. 1B, by forming the processing region 36 of oxidation for reducing the interface tension at the interface (a surface) which is in contact with the organic compound layer 37, of the first conductive layer 35, adhesion between the first conductive layer 35 and the organic compound layer 37 can be improved. Therefore, a defect such as film peeling does not occur at an interface between the layers by force applied at a step of transposition to a second substrate after the formation over a first substrate. Consequently, the memory element can be peeled off and transposed with a good form, to manufacture a semiconductor device.

As each of the first conductive layer 35 and the second conductive layer 38, an element, a compound, or the like having high conductivity is used. Typically, a single-layer or a multi-layer structure formed of one kind of the following elements or an alloy containing a plurality of the following elements can be employed: gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), tantalum (Ta), and the like.

The processing region 36 is formed by performing the treatment for reducing the interface tension such as oxidation treatment to the interface (surface) which is in contact with the organic compound layer, of the first conductive layer 35. For example, a titanium film is formed using titanium as the first conductive layer 35, and oxidation treatment is performed to the titanium film so that an oxidized titanium film may be formed in a surface layer of the titanium film; In this case, the processing region 36 is the oxidized titanium film, and the interface tension between the oxidized titanium film and the organic compound layer 37 is small.

Shown in FIG. 1B is the case where the processing region is formed by performing the treatment for reducing the interface tension to the surface which is in contact with the organic compound layer, of the first conductive layer. However, a processing region where the interface tension is small may also be formed in a surface which is in contact with the organic compound layer, of the second conductive layer by performing the similar treatment for reducing the interface tension. Further, the treatment for reducing the interface tension may also be performed in respective interfaces between the organic compound layer and the first conductive layer and between the organic compound layer and the second conductive layer; that case is shown in FIG. 16B.

Figure 16B:
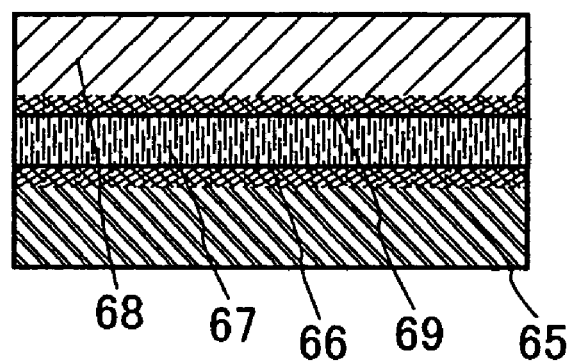

FIG. 16B shows a memory element in which an organic compound layer 67 is provided between a first conductive layer 65 and a second conductive layer 68. The treatment for reducing the interface tension is performed to an interface between the first conductive layer 65 and the organic compound layer 67 and an interface between the second conductive layer 68 and the organic compound layer 67. In this embodiment mode, a processing region 66 is formed by performing oxidation treatment to the interface between the first conductive layer 65 and the organic compound layer 67, and a processing region 69 is formed by performing oxidation treatment to the interface between the second conductive layer 68 and the organic compound layer 67.

As shown in FIG. 16B, by forming the oxidation processing regions 66 and 69 for reducing the interface tension at the interface (a surface) which is in contact with the organic compound layer 67, of the first conductive layer 65, and at the interface (a surface) which is in contact with the organic compound layer 67, of the second conductive layer 68 respectively, adhesion among the first conductive layer 65, the organic compound layer 67, and the second conductive layer 68 can be improved. Therefore, a defect such as film peeling does not occur at an interface between the layers by force applied at a step of transposition to a second substrate after the formation over a first substrate. Consequently, the memory element can be peeled off and transposed with a good form, to manufacture a semiconductor device.

Figure 16C:
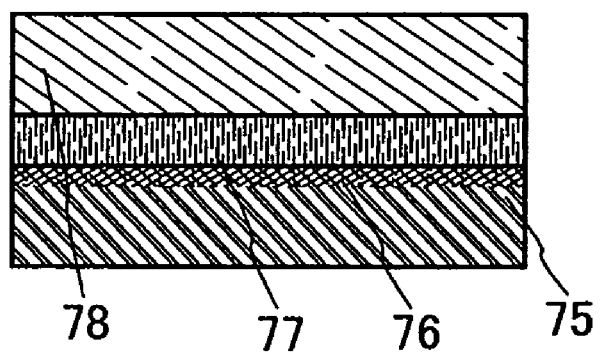

FIG. 16C shows a memory element in which an organic compound layer 77 is provided between a first conductive layer 75 and a second conductive layer 78. As a metal material used for the second conductive layer 78, one kind or plural kinds of the following are used: indium (In), tin (Sn), lead (Pb), bismuth (Bi), calcium (Ca), antimony (Sb), and zinc (Zn). Further, one kind or plural kinds of the following are used as well: magnesium (Mg), manganese (Mn), cadmium (Cd), thallium (Tl), tellurium (Te), and barium (Ba). A plurality of the above-described metal materials may be contained, or an alloy containing one kind or plural kinds of the above-described materials may be used. In particular, a metal having relatively small solubility parameter, that is indium (In), tin (Sn), lead (Pb), bismuth (Bi), calcium (Ca), manganese (Mn), or zinc (Zn), or an alloy containing the above metal is suitable as an electrode material. As the alloy capable of being used, there is an indium alloy such as an indium-tin alloy (InSn), a magnesium-indium alloy (InMg), an indium-phosphorus alloy (InP), an indium-arsenic alloy (InAs), or indium-chromium alloy (InCr).

Further, treatment for reducing the interface tension is performed to an interface between the first conductive layer 75 and the organic compound layer 77. In this embodiment mode, a processing region 76 is formed by performing oxidation treatment to the interface between the first conductive layer 75 and the organic compound layer 77.

Shown in FIG. 16C is the case where the processing region 76 is formed so as to be in contact with the organic compound layer 77 by performing oxidation treatment to a surface of the first conductive layer 75, and the above-described metal material having relatively small solubility parameter is used for the second conductive layer 78. However, the above-described metal material having relatively small solubility parameter used as the second conductive layer 78 may also be used for the first conductive layer 75, and a region where the oxidation treatment or the like for reducing the interface tension is performed may be formed at an interface between the second conductive layer 78 and the organic compound layer 77.

Further, in each of the memory elements shown in FIGS. 1A, 1B, and 16A to 16C, as long as the structures and materials at the interface between the first conductive layer and the organic compound layer and the interface between the second conductive layer and the organic compound layer are the same as those described above, another conductive layer may be stacked on the first conductive layer (under the first conductive layer in FIGS. 1A and 1B) and another conductive layer may be stacked on the second conductive layer (above the second conductive layer in FIGS. 1A and 1B), so that a memory element having the stacked conductive layers may be formed as well.

As each conductive layer stacked on the first conductive layer and the second conductive layer, an element, a compound, or the like having high conductivity is used. Typically, a single-layer or a multi-layer structure formed of one kind of the following elements or an alloy containing a plurality of the following elements can be employed: gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), tantalum (Ta), and the like. As the alloy containing a plurality of the above-described elements, for example, an alloy containing Al and Ti, an alloy containing Ti and C, an alloy containing Al and Ni, an alloy containing Al and C, an alloy containing Al, Ni, and C, an alloy containing Al and Mo, or the like can be used.

The organic compound layer 32, the organic compound layer 37, the organic compound layer 57, the organic compound layer 67, and the organic compound layer 77 are formed of an organic compound of which the conductivity is changed by optical action or electrical action. In addition, the organic compound layer 57, the organic compound layer 67, and the organic compound layer 77 can be structured by either a single layer or a plurality of layers.

As an organic compound for forming the organic compound layer 32, the organic compound layer 37, the organic compound layer 57, the organic compound layer 67, and the organic compound layer 77, an organic resin typified by polyimide, acrylic, polyamide, benzocyclobutene, epoxy, or the like can be used.

In addition, as the organic compound of which the conductivity is changed by optical action or electrical action, for forming the organic compound layer 32, the organic compound layer 37, the organic compound layer 57, the organic compound layer 67, and the organic compound layer 77, an organic compound material having a hole-transporting property or an organic compound material having an electron-transporting property can be used.

As the organic compound material having a hole-transporting property, an aromatic amine compound (namely, a compound having a bond of a benzene ring and nitrogen) such as 4,4'-bis[N-(1-naphthyl)-N-phenyl-amino)-biphenyl (abbreviation: NPB); 4,4'-bis[N-(3-methylphenyl)-N-phenyl-amino)-biphenyl (abbreviation: TPD); 4,4',4''-tris(N,N-diphenyl-amino)-triphenylamine (abbreviation: TDATA); 4,4',4''-tris[N-(3-methylphenyl)-N-phenyl-amino]-triphenyl-lamine (abbreviation: MTDATA); or 4,4'-bis(N-(4-(N,N-di-m-tolylamino)phenyl)-N-phenylamino)biphenyl (abbreviation: DNTPD), or a phthalocyanine compound such as phthalocyanine (abbreviation: $H_2Pc$); copper phthalocyanine (abbreviation: CuPc), or vanadyl phthalocyanine (abbreviation: VOPc) can be used. The substances described above are mainly substances having a hole mobility of $10^{-6}$ cm$^2$/Vs or more.

As the organic compound material having an electron-transporting property, a material composed of: a metal complex having a quinoline skeleton or benzoquinoline skeleton such as tris(8-quinolinolato)aluminum (abbreviation: $Alq_3$); tris(4-methyl-8-quinolinolato)aluminum (abbreviation: $Almq_3$); bis (10-hydroxybenzo[h]-quinolinato)beryllium (abbreviation: $BeBq_2$); or bis (2-methyl-8-quinolinolato)-4-phenylphenolato-aluminum (abbreviation: BAlq); or the like can be used. In addition, a metal complex material having an oxazole ligand or a thiazole ligand such as bis[2-(2-hydroxyphenyl)benzoxazolato]zinc (abbreviation: $Zn(BOX)_2$) or bis[2-(2-hydroxyphenyl)benzothiazolato]zinc (abbreviation: $Zn(BTZ)_2$), or the like can also be used. Further, as well as the metal complex, 2-(4-biphenyl)-5-(4-tert-butylphenyl)-1,3,4-oxadiazole (abbreviation: PBD); 1,3-bis[5-(p-tert-butylphe-nyl)-1,3,4-oxadiazol-2-yl]benzene (abbreviation: OXD-7); 3-(4-tert-butylphenyl)-4-phenyl-5-(4-biphenylyl)-1,2,4-tria-zole (abbreviation: TAZ); 3-(4-tert-butylphenyl)-4-(4-eth-ylphenyl)-5-(4-biphenylyl)-1,2,4-triazole (abbreviation: p-EtTAZ); bathophenanthroline (abbreviation: BPhen); bathocuproin (abbreviation: BCP) or the like can be used. The substances described above are substances having an electron mobility of $10^{-6}$ cm$^2$/Vs or more.

The organic compound layer 32, the organic compound layer 37, the organic compound layer 57, the organic compound layer 67, and the organic compound layer 77 can be formed by evaporation, electron-beam evaporation, sputtering, CVD, or the like. Further, when the organic compound layer is formed by using a plurality of materials, the materials are stacked at the same time, in which methods of the same kind or different kinds are used in combination for forming the organic compound layer, such as co-evaporation by resistance-heating evaporation, co-evaporation by electron-beam evaporation, co-evaporation by resistance-heating evaporation and electron-beam evaporation, deposition by resistance-heating evaporation and sputtering, or deposition by electron-beam evaporation and sputtering.

Further, each of the organic compound layer 32, the organic compound layer 37, the organic compound layer 57, the organic compound layer 67, and the organic compound layer 77 is formed at a thickness to change the conductivity of the memory element by optical action or electrical action. The memory element having the above-described structure which changes the conductivity between before and after voltage is applied, can store two values corresponding to an "initial state" and "after change of conductivity".

Figure 19A:
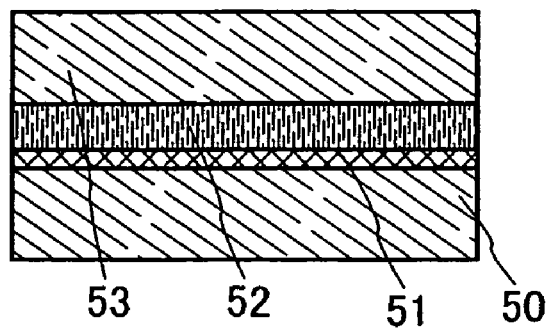
FIGS. 19A to 19C each show a semiconductor device of the invention.
Figure 19B:
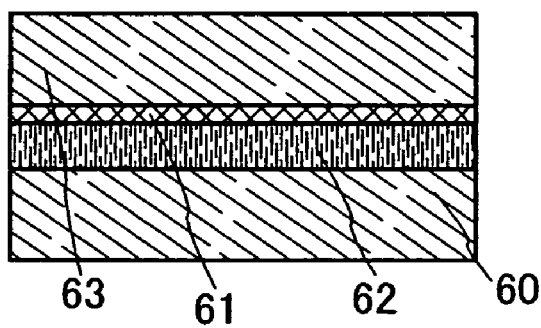
Figure 19C:
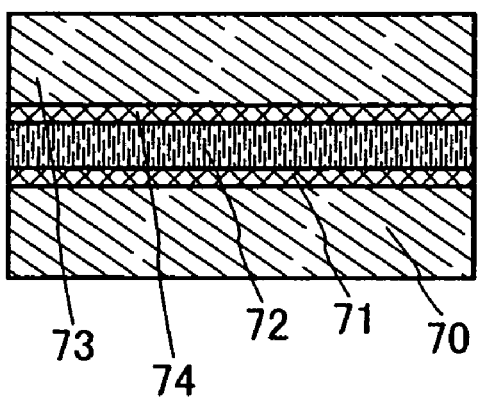

Further, as shown in FIGS. 19A to 19C, a structure in which an insulating layer is provided between an organic compound layer and a conductive layer may also be employed. As for each of a first conductive layer 50, a first conductive layer 60, a first conductive layer 70, a second conductive layer 53, a second conductive layer 63, and a second conductive layer 73 in FIGS. 19A to 19C, like the first conductive layer 55 and the second conductive layer 58 in FIG. 16A, the metal material of one kind or plural kinds of the following are used: indium (In), tin (Sn), lead (Pb), bismuth (Bi), calcium (Ca), antimony (Sb), and zinc (Zn). Further, one kind or plural kinds of the following are used as well: magnesium (Mg), manganese (Mn), cadmium (Cd), thallium (Tl), tellurium (Te), and barium (Ba). A plurality of the above-described metal materials may be contained, or an alloy containing one kind or plural kinds of the above-described materials may be used. In particular, a metal having relatively small solubility parameter, that is indium (In), tin (Sn), lead (Pb), bismuth (Bi), calcium (Ca), manganese (Mn), or zinc (Zn), or an alloy containing the above metal is suitable as an electrode material. As the alloy capable of being used, there is an indium alloy such as an indium-tin alloy (InSn), a magnesium-indium alloy (InMg), an indium-phosphorus alloy (InP), an indium-arsenic alloy (InAs), or indium-chromium alloy (InCr).

Of course, a conductive layer which is formed similarly to each of those of FIGS. 1A, 1B, 16B, and 16C may also be used as the first conductive layer and the second conductive layer in each of FIGS. 19A to 19C, and oxidation treatment or the like for reducing the interface tension may be performed to an interface between the conductive layer and the organic compound layer.

An organic compound layer 52, an organic compound layer 62, and an organic compound layer 72 may be formed similarly of the same material as that of the organic compound layer 32 or the organic compound layer 37 in FIGS. 1A and 1B.

FIG. 19A shows the case where an insulating layer 51 is provided between the first conductive layer 50 and the organic compound layer 52, in which the second conductive layer 53 is provided over the organic compound layer 52. In FIG. 19B, an insulating layer 61 is formed over the organic compound layer 62 provided over the first conductive layer 60, and the second conductive layer 63 is provided over the insulating layer 61. In FIG. 19C, the first conductive layer 70, a first insulating layer 71, the organic compound layer 72, a second insulating layer 74, and the second conductive layer 73 are stacked, in which the first insulating layer 71 is provided between the first conductive layer 70 and the organic compound layer 72, and the second insulating layer 74 is provided between the organic compound layer 72 and the second conductive layer 73.

In this embodiment mode, each of the insulating layer 51, the insulating layer 61, the first insulating layer 71, and the second insulating layer 74 has an insulating property, and may be a very thin film (the film thickness of the insulating layer is 4 nm or less, preferably 1 nm or more and 2 nm or less), and depending on the material and manufacturing method of the insulating layer, the insulating layer may have not a shape as a continuous film but a discontinuous island-like shape. Although the insulating layer is illustrated as a continuous film in the drawings in this specification, the case where the insulating layer has a discontinuous island-like shape is also included.

The insulating layer which is at the interface between the conductive layer and the organic compound layer allows tunnel injection of carriers; therefore, a tunnel current flows. Accordingly, when a voltage is applied between the first and second conductive layers, current flows to the organic compound layer; thereby generating heat. When the temperature of the organic compound layer reaches to its glass-transition temperature, the material forming the organic compound layer turns into a fluid composition. The fluid composition flows (moves) without maintaining the form of a solid state, and the form is changed. Consequently, the thickness of the organic compound layer becomes uneven and the organic compound layer changes its form, and the first and second conductive layers are partially brought into contact with each other so that they are short-circuited. Further, the first and second conductive layers may also be short-circuited by an effect of a high electric field which is caused by an electric field concentrated in a region where the thickness of the organic compound layer is small. Accordingly, conductivity of the memory element is changed between before and after a voltage is applied.

In the semiconductor device, after writing of the semiconductor device, there is the case where the first and second conductive layers are partially in contact with each other, or where the thickness of the organic compound layer is changed.

By providing the insulating layer 51, the insulating layer 61, the first insulating layer 71, and the second insulating layer 74, characteristics such as a writing voltage of a memory element are stabilized without fluctuation, and normal writing can be performed in each element. Further, since the carrier injection property is improved by the tunnel current, thickness of the organic compound layer can be increased; therefore, a defect of short-circuit of a memory element in the initial state before electrical conduction is provided can be prevented.

As a voltage that is applied to the memory element of the present invention, a voltage that is applied to the first conductive layer may be higher than that of the second conductive layer; alternatively, a voltage that is applied to the second conductive layer may be higher than that of the first conductive layer. Even in the case where the memory element has a rectifying property, a potential difference may be provided between the first conductive layer and the second conductive layer so as to apply a voltage either in the forward-bias direction or the reverse-bias direction.

In the present invention, the insulating layer is formed using a thermally and chemically stable inorganic insulator or organic compound in which carriers are not injected. Specific examples of the inorganic insulator and organic compound that can be used for the insulating layer will be described below.

In the invention, as an inorganic insulator that can be used for the insulating layer, an oxide such as the following can be used: lithium oxide ($Li_2O$), sodium oxide ($Na_2O$), potassium oxide ($K_2O$) rubidium oxide ($Rb_2O$), beryllium oxide (BeO), magnesium oxide (MgO), calcium oxide (CaO), strontium oxide (SrO), barium oxide (BaO), scandium oxide ($Sc_2O_3$), zirconium oxide ($ZrO_2$), hafnium oxide ($HfO_2$), rutherfordium oxide ($RfO_2$), tantalum oxide (TaO), technetium oxide (TcO), ion oxide ($Fe_2O_3$), cobalt oxide (CoO), palladium oxide (PdO), silver oxide ($Ag_2O$), aluminum oxide ($Al_2O_3$), gallium oxide ($Ga_2O_3$), or bismuth oxide ($Bi_2O_3$).

In the invention, as another inorganic insulator that can be used for the insulating layer, a fluoride such as the following can be used: lithium fluoride (LiF), sodium fluoride (NaF), potassium fluoride (KF), rubidium fluoride (RbF), cesium fluoride (CsF), beryllium fluoride ($BeF_2$), magnesium fluoride ($MgF_2$), calcium fluoride ($CaF_2$), strontium fluoride ($SrF_2$), barium fluoride ($BaF_2$), aluminum fluoride ($AlF_3$), nitrogen trifluoride ($NF_3$), sulfur hexafluoride ($SF_6$), silver fluoride (AgF), or manganese fluoride ($MnF_3$).

In the invention, as another inorganic insulator that can be used for the insulating layer, a chloride such as the following can be used: lithium chloride (LiCl), sodium chloride (NaCl), potassium chloride (KCl), beryllium chloride ($BeCl_2$), calcium chloride ($CaCl_2$), barium chloride ($BaCl_2$), aluminum chloride ($AlCl_3$), silicon chloride ($SiCl_4$), germanium chloride ($GeCl_4$), tin chloride ($SnCl_4$), silver chloride (AgCl), zinc chloride (ZnCl), titanium tetrachloride ($TiCl_4$), titanium trichloride ($TiCl_3$), zirconium chloride ($ZrCl_4$), iron chloride ($FeCl_3$), palladium chloride ($PdCl_2$), antimony trichloride ($SbCl_3$), antimony dichloride ($SbCl_2$), strontium chloride ($SrCl_2$), thallium chloride (TlCl), copper chloride (CuCl), manganese chloride ($MnCl_2$), or ruthenium chloride ($RuCl_2$).

In the invention, as another inorganic insulator that can be used for the insulating layer, a bromide such as the following can be used: potassium bromide (KBr), cesium bromide (CsBr), silver bromide (AgBr), barium bromide ($BaBr_2$), silicon bromide ($SiBr_4$), or lithium bromide (LiBr).

In the invention, as another inorganic insulator that can be used for the insulating layer, an iodide such as the following can be used: sodium iodide (NaI), potassium iodide (KI), barium iodide ($BaI_2$), thallium iodide (TlI), silver iodide (AgI), titanium iodide ($TiI_4$), calcium iodide ($CaI_2$), silicon iodide ($SiI_4$), or cesium iodide (CsI).

In the invention, as another inorganic insulator that can be used for the insulating layer, a carbonate such as the following can be used: lithium carbonate ($Li_2CO_3$), potassium carbonate ($K_2CO_3$), sodium carbonate ($Na_2CO_3$), magnesium carbonate ($MgCO_3$), calcium carbonate ($CaCO_3$), strontium carbonate ($SrCO_3$), barium carbonate ($BaCO_3$), manganese carbonate ($MnCO_3$), iron carbonate ($FeCO_3$), cobalt carbonate ($CoCO_3$), nickel carbonate ($NiCO_3$), copper carbonate ($CuCO_3$), silver carbonate ($Ag_2CO_3$), or zinc carbonate ($ZnCO_3$).

In the invention, as another inorganic insulator that can be used for the insulating layer, a sulfate such as the following can be used: lithium sulfate ($Li_2SO_4$), potassium sulfate ($K_2SO_4$), sodium sulfate ($Na_2SO_4$), magnesium sulfate ($MgSO_4$), calcium sulfate ($CaSO_4$), strontium sulfate ($SrSO_4$), barium sulfate ($BaSO_4$), titanium sulfate ($Ti_2(SO_4)_3$), zirconium sulfate ($Zr(SO_4)_2$), manganese sulfate ($MnSO_4$), iron sulfate ($FeSO_4$), ferric trisulfate ($Fe_2(SO_4)_3$), cobalt sulfate ($CoSO_4$), cobalt sulfate ($CO_2(SO_4)$), nickel sulfate ($NiSO_4$), copper sulfate ($CuSO_4$), silver sulfate ($Ag_2SO_4$), zinc sulfate ($ZnSO_4$), aluminium sulfate ($Al_2(SO_4)_3$), indium sulfate ($In_2(SO_4)_3$), tin sulfate ($SnSO_4$) or ($Sn(SO_4)_2$), antimony sulfate ($Sb_2(SO_4)_3$), or bismuth sulfate ($Bi_2(SO_4)_3$).

In the invention, as another inorganic insulator that can be used for the insulating layer, a nitrate such as the following can be used: lithium nitrate ($LiNO_3$), potassium nitrate ($KNO_3$), sodium nitrate ($NaNO_3$), magnesium nitrate ($Mg(NO_3)_2$), calcium nitrate ($Ca(NO_3)_2$), strontium nitrate ($Sr(NO_3)_2$), barium nitrate ($Ba(NO_3)_2$), titanium nitrate ($Ti(NO_3)_4$), strontium nitrate ($Sr(NO_3)_2$), barium nitrate ($Ba(NO_3)_2$), zirconium nitrate ($Zr(NO_3)_4$), manganese nitrate ($Mn(NO_3)_2$), iron nitrate ($Fe(NO_3)_2$) or ($Fe(NO_3)_3$), cobalt nitrate ($Co(NO_3)_2$), nickel nitrate ($Ni(NO_3)_2$), copper nitrate ($Cu(NO_3)_2$), silver nitrate ($AgNO_3$), zinc nitrate ($Zn(NO_3)_2$), aluminum nitrate ($Al(NO_3)_3$), indium nitrate ($InTNO_3)_3$), tin nitrate ($Sn(NO_3)_2$), or bismuth nitrate ($Bi(NO_3)_3$).

In the invention, as another inorganic insulator that can be used for the insulating layer, the following can be used: a nitride such as aluminum nitride (AlN) or silicon nitride (SiN), or a carboxylate such as lithium carboxylate ($LiCOOCH_3$), potassium acetate ($KCOOCH_3$), sodium acetate ($NaCOOCH_3$), magnesium acetate ($Mg(COOCH_3)_2$), calcium acetate ($Ca(COOCH_3)_2$), strontium acetate ($Sr(COOCH_3)_2$), or barium acetate ($Ba(COOCH_3)_2$) can be used.

In the invention, one kind or plural kinds of the above-described inorganic insulators can be used as an inorganic insulator for the insulating layer.

In the invention, as an organic compound that can be used for the insulating layer, the following can be used: polyimide, acrylic, polyamide, benzocyclobutene, polyester, novolac resin, melamine resin, phenol resin, epoxy resin, silicon resin, fran resin, diallyl phthalate resin, or siloxane resin.

In the invention, as another organic compound that can be used for the insulating layer, the following can be used: an aromatic amine compound (namely, a compound having a bond of a benzene ring and nitrogen) such as 4,4'-bis[N-(1-naphthyl)-N-phenyl-amino]-biphenyl (abbreviation: NPB), 4,4'-bis[N-(3-methylphenyl)-N-phenyl-amino]-biphenyl (abbreviation: TPD), 4,4',4''-tris(N,N-diphenyl-amino)-triphenylamine (abbreviation: TDATA), 4,4',4''-tris[N-(3-methylphenyl)-N-phenyl-amino]-triphenylamine (abbreviation: MTDATA), or 4,4'-bis(N-(4-(N,N-di-m-tolylamino)phenyl)-N-phenylamino)biphenyl (abbreviation: DNTPD); a phthalocyanine compound such as phthalocyanine (abbreviation: $H_2Pc$), copper phthalocyanine (abbreviation: CuPc), or vanadyl phthalocyanine (abbreviation: VOPc); 2Me-TPD; FTPD; TPAC; OTPAC; Diamine; PDA; triphenylmethane (abbreviation: TPM); or STB.

In the invention, as another organic compound that can be used for the insulating layer, the following can be used: a material made of a metal complex or the like having a quinoline skeleton or a benzoquinoline skeleton such as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), or bis(2-methyl-8-quinolinolato)-4-phenylphenolato-aluminum (abbreviation: BAlq); a material made of a metal complex or the like having an oxazole based or thiazole based ligand such as bis[2-(2-hydroxyphenyl)benzoxazolato]zinc (abbreviation: $Zn(BOX)_2$), or bis[2-(2-hydroxyphenyl)benzothiazolato]zinc (abbreviation: $Zn(BTZ)_2$); 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP); 5,6,11,12-tetraphenyltetracene (abbreviation: rubrene); hexaphenylbenzene; t-butylperylene; 9,10-di(phenyl)anthracene; coumarin 545T; dendrimer; 4-dicyanomethylene-2-methyl-6-[2-(1,1,7,7-tetramethyl-9-julolidyl)ethenyl]-4H-pyran (abbreviation: DCJT); 4-dicyanomethylene-2-t-butyl-6-[2-(1,1,7,7-tetramethyljulolidin-9-yl)ethenyl]-4H-pyran (abbreviation: DCJTB); periflanthene; 2,5-dicyano-1,4-bis[2-(10-methoxy-1,1,7,7-tetramethyljulolidin-9-yl)ethenyl]benzene; N,N'-dimethylquinacridone (abbreviation: DMQd); coumarin 6; 9,9'-bianthryl; 9,10-diphenylanthracene (abbreviation: DPA); 9,10-bis(2-naphthyl)anthracene (abbreviation: DNA); 2,5,8,11-tetra-t-butylperylene (abbreviation: TBP); BMD; BDD; 2,5-bis(1-naphthyl)-1,3,4-oxadiazol (abbreviation: BND); BAPD; BBOT; TPQ1; TPQ2; MBDQ; or the like.

In the invention, as another organic compound that can be used for the insulating layer, polyacetylene, polyphenylenevinylene, polythiophene, polyaniline, polyphenyleneethynylene, or the like can be used. Polyparaphenylenvinylene includes in its category a derivative of poly(paraphenylenvinylene)[PPV], poly(2,5-dialkoxy-1,4-phenylenevinylene)[RO-PPV], poly(2-(2'-ethyl-hexoxy)-5-methoxy-1,4-phenylenevinylene)[MEH-PPV], poly(2-(dialkoxyphenyl)-1,4-phenylenevinylene)[ROPh-PPV], and the like. Polyparaphenylen includes in its category a derivative of polyparaphenylen [PPP], poly(2,5-dialkoxy-1,4-phenylene)[RO-PPP], poly(2,5-dihexoxy-1,4-phenylene), and the like. Polythiophene includes in its category a derivative of polythiophene [PT], poly(3-alkylthiophene)[PAT], poly(3-hexylthiophene)[PHT], poly(3-cyclohexylthiophene)[PCHT], poly(3-cyclohexyl-4-methylthiophene)[PCHMT], poly(3,4-dicyclohexylthiophene)[PDCHT], poly[3-(4-octylphenyl)-thiophene][POPT], poly[3-(4-octylphenyl)-2,2 bithiophene][PTOPT], and the like. Polyfluorenee includes in its category a derivative of polyfluorenee [PF], poly(9,9-dialkylfluorene)[PDAF], poly(9,9-dioctylfluorene)[PDOF]), and the like.

In the invention, as another organic compound that can be used for the insulating layer, the following can be used: PFBT, a carbazole derivative, anthracene, coronene, peryrene, PPCP, BPPC, BorylAnthracene, DCM, QD, Eu(TTA)3Phen, or the like.

In the invention, one kind or plural kinds of the above-described organic compounds can be used as an organic compound for the insulating layer.

In the invention, one kind or plural kinds of the above-described inorganic insulators and organic compounds can be used for forming the insulating layer. The insulating layer has an insulating property in the invention.

The insulating layer can be formed by evaporation such as co-evaporation, a coating method such as spin coating, or a sol-gel method. Further, the following can also be used: a droplet discharge (ejection) method (also called an ink-jet method, depending on its manner) capable of forming a predetermined pattern by selectively discharging (ejecting) liquid droplets of a compound mixed for a specific purpose, a method capable of transferring or drawing an object with a desired pattern, that is for example, any printing method (a method of forming with a desired pattern, such as screen (permeographic) printing, offset (lithography) printing, relief printing, or gravure (intaglio) printing), or the like.

Since the semiconductor device having a memory element manufactured in this embodiment mode has good adhesion inside the memory element, a peeling and transposing process can be performed with a good state. Thus, transposition can be freely performed to any substrate, and therefore, selectivity for a substrate material is increased. Further, an inexpensive material can also be selected for the substrate, so that the semiconductor device can be manufactured at low cost as well as having a wide function in accordance with the intended purpose.

By the present invention, a semiconductor device having a memory element having good adhesion inside the memory element, so that a transposition step can be performed with a good state can be manufactured. Therefore, a semiconductor device having higher reliability can be manufactured with a high yield without complexing the apparatus or process.

Embodiment Mode 2

In this embodiment mode, one structural example of the memory element included in the semiconductor device of the present invention will be described using the drawings. In particular, the case where the semiconductor device is a passive matrix type will be described.

The memory element of the present invention and an operation mechanism thereof are described using FIGS. 2A to 2C, 6A, and 6B. The memory element in this embodiment mode can be manufactured by the same material and with the same structure as those in Embodiment Mode 1, and therefore, detailed description of the material or the like is omitted here.

Figure 3A:
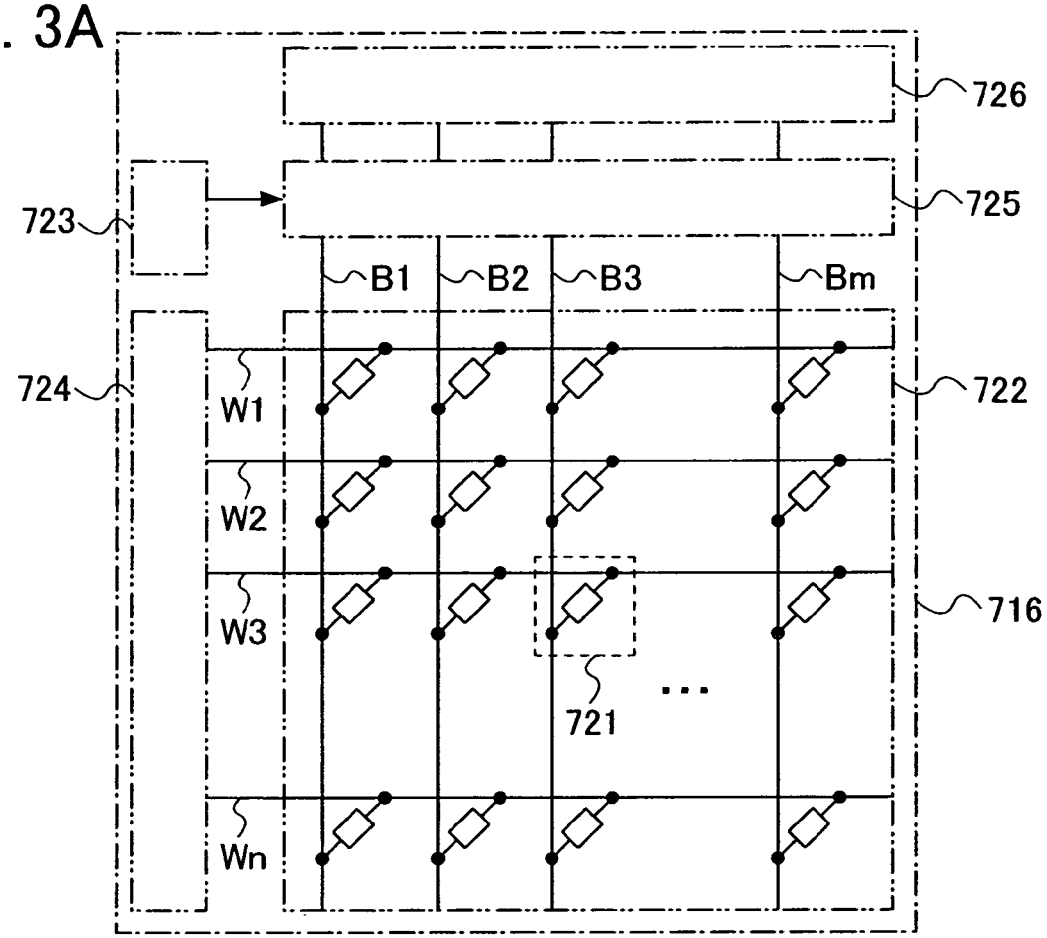
FIGS. 3A to 3C each show a semiconductor device of the invention.
Figure 3B:
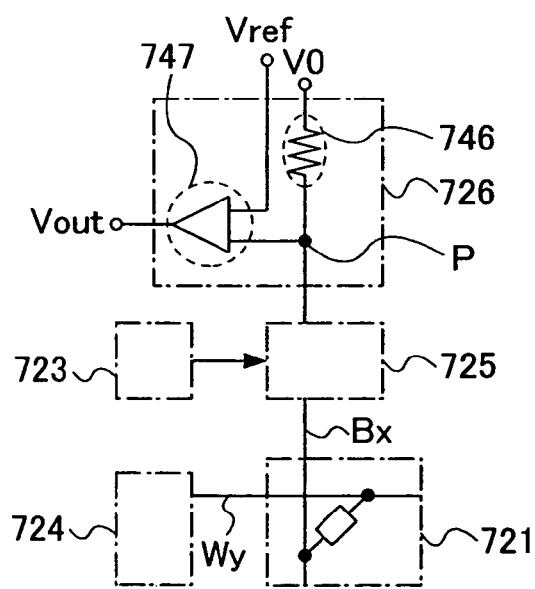
Figure 3C:
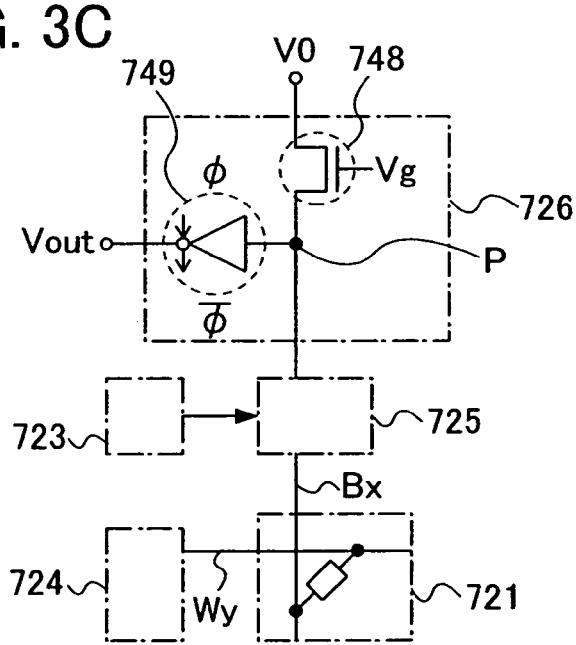

FIGS. 3A to 3C each show one constitution example of the semiconductor device of the invention, which include a memory cell array 722 including memory cells 721 provided in matrix, a circuit 726 including a reading circuit and a writing circuit, a decoder 724, and a decoder 723. It is to be noted that the constitution of a semiconductor device 716 shown here is only one example; the semiconductor device may include another circuit such as a sense amplifier, an output circuit, or a buffer, and the writing circuit may be provided in a bit-line driver circuit.

The memory cell 721 includes a first conductive layer which is connected to a bit line Bx ($1 \leq x \leq m$), a second conductive layer which is connected to a word line Wy ($1 \leq y \leq n$), and an organic compound layer. The organic compound layer is provided between the first conductive layer and the second conductive layer, with a single layer or a plurality of layers.

Figure 2A:
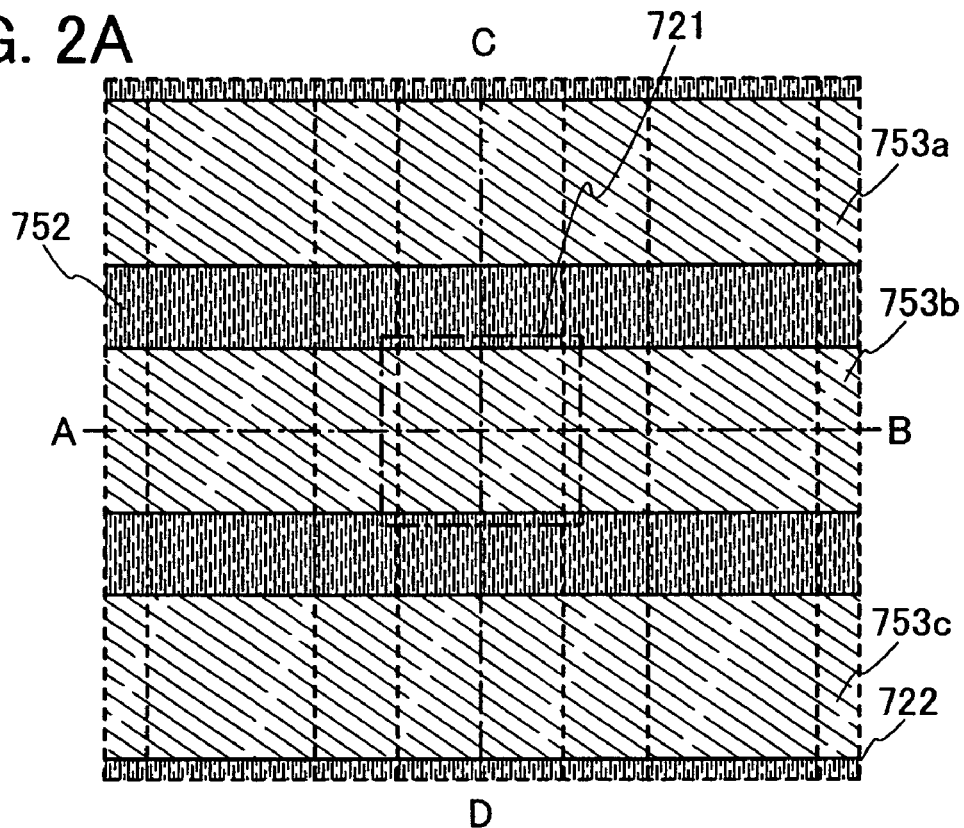
FIGS. 2A to 2C each show a semiconductor device of the invention.
Figure 2B:
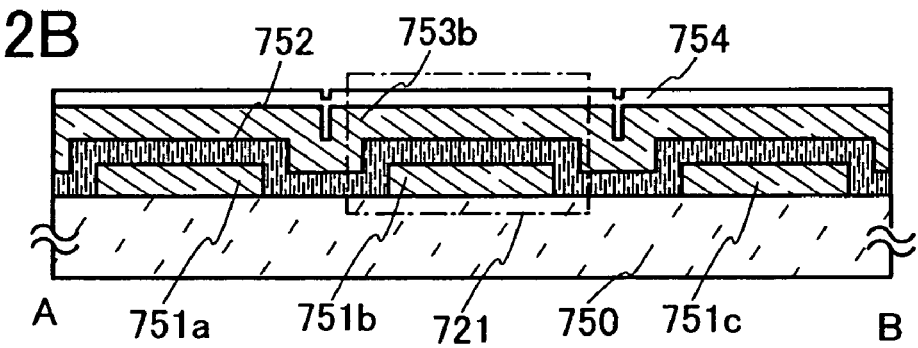
Figure 2C:
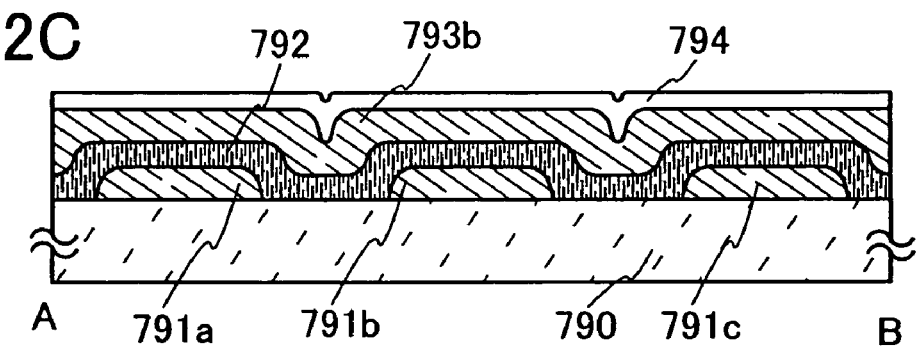

FIG. 2A is a top view of the memory cell array 722, and each of FIGS. 2B and 2C is a cross-sectional view taken along a line A-B in FIG. 2A. An insulating layer 754 is provided as shown in FIG. 2B, though not shown in FIG. 2A.

The memory cell array 722 includes: a first conductive layer 751a, a first conductive layer 751b, and a first conductive layer 751c which are extended in a first direction; an organic compound layer 752 which is provided covering the first conductive layers 751a, 751b, and 751c; and a second conductive layer 753a, a second conductive layer 753b, and a second conductive layer 753c which are extended in a second direction that is perpendicular to the first direction (see FIG. 2A). The organic compound layer 752 is provided between the first conductive layers 751a, 751b, and 751c and the second conductive layers 753a, 753b, and 753c. Further, the insulating layer 754 functioning as a protection film is provided covering the second conductive layers 753a, 753b, and 753c (see FIG. 2B). If there may be influence of an electric field in a lateral direction between adjacent memory cells, respective organic compound layers 752 provided for the memory cells may also be separated from one another.

FIG. 2C is a modification example of FIG. 2B, in which a first conductive layer 791a, a first conductive layer 791b, a first conductive layer 791c, an organic compound layer 792, a second conductive layer 793b, and an insulating layer 794 which is a protection layer are provided over a substrate 790.

Like the first conductive layers 791a, 791b, and 791c in FIG. 2C, the first conductive layer may have a tapered shape and may have a shape in which the curvature radius changes continuously. Such a shape as the first conductive layers 791a, 791b, and 791c can be formed by using a droplet discharge method or the like. In the case where the first conductive layer has such a curved surface with curvature, coverage of an organic compound layer or a conductive layer that is to be stacked is good.

Further, a partition (an insulating layer) may be formed so as to cover an end portion of the first conductive layer. The partition (insulating layer) serves as a wall separating one memory element from another memory element. Each of FIGS. 6A and 6B shows a structure in which an end portion of the first conductive layer is covered with the partition (insulating layer).

Figure 6A:
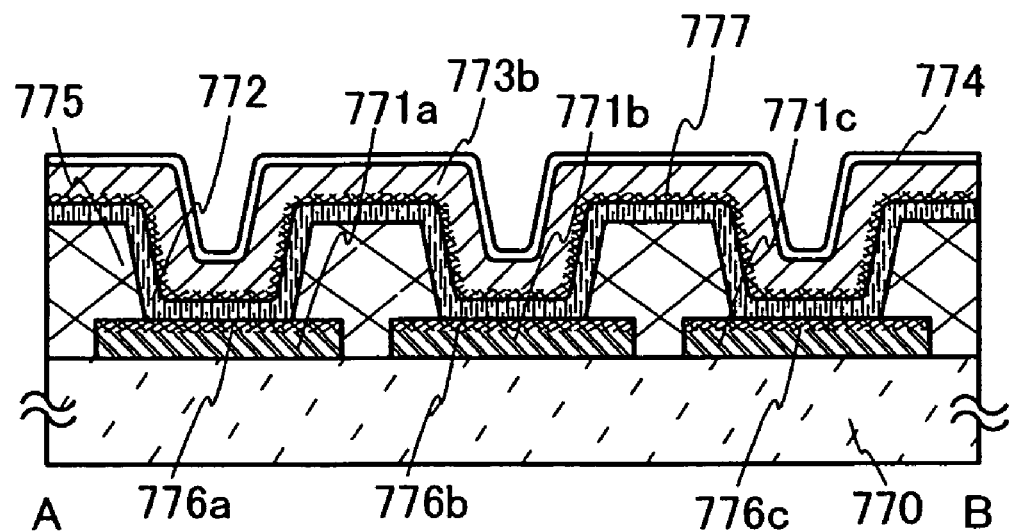
FIGS. 6A and 6B each show a semiconductor device of the invention.

FIG. 6A shows an example in which, as shown in FIG. 16B, processing regions 776a, 776b, and 776c subjected to treatment for reducing the interface tension are formed in surfaces of first conductive layers 771a, 771b, and 771c respectively so as to be in contact with an organic compound layer 772, and then a second conductive layer 773b having a processing region 777 subjected to treatment for reducing the interface tension is formed over the organic compound layer. In this embodiment mode, a partition (an insulating layer) 775 is formed with a tapered shape so as to cover each end portion of the first conductive layers 771a, 771b, and 771c. The partition (insulating layer) 775, the organic compound layer 772, the second conductive layer 773b, and an insulating layer 774 are formed in this order over the first conductive layers 771a, 771b, and 771c, and the insulating layer 776 that are provided over a substrate 770.

Figure 6B:
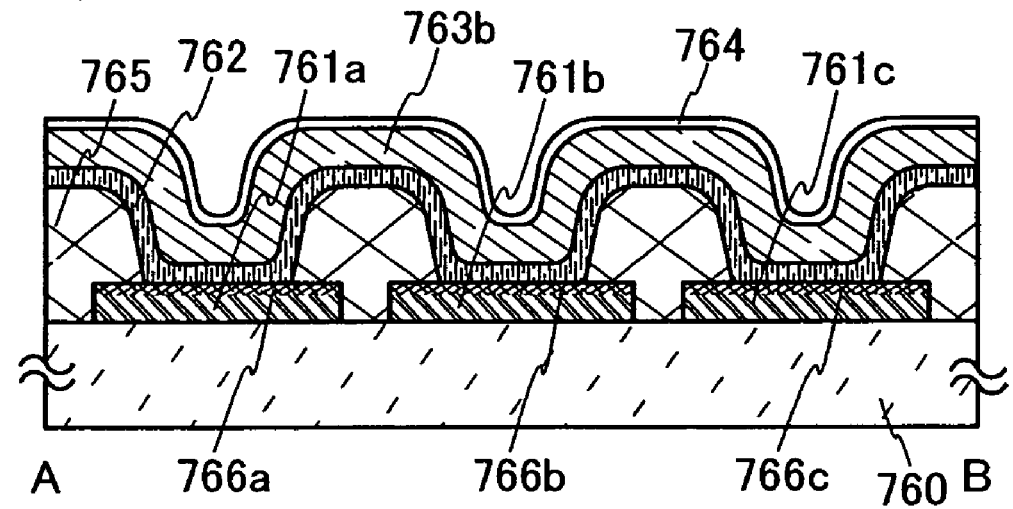

In a semiconductor device shown in FIG. 6B, a partition (an insulating layer) 765 has curvature and a shape in which the curvature radius changes continuously. As shown in FIG. 16C, processing regions 766a, 766b, and 766c subjected to treatment for reducing the interface tension are formed in surfaces of first conductive layers 761a, 761b, and 761c respectively so as to be in contact with an organic compound layer 762, and then a second conductive layer 763b is formed over the organic compound layer 762. Over the second conductive layer 763b, an insulating layer 764 which is a protection layer is formed. The insulating layer 764 is not necessarily formed.

The second conductive layer 763b is formed using one kind or plural kinds of the following: indium (In), tin (Sn), lead (Pb), bismuth (Bi), calcium (Ca), antimony (Sb), and zinc (Zn). Further, one kind or plural kinds of the following are used as well: magnesium (Mg), manganese (Mn), cadmium (Cd), thallium (Tl), tellurium (Te), and barium (Ba). A plurality of the above-described metal materials may be contained, or an alloy containing one kind or plural kinds of the above-described materials may be used. In particular, a metal having relatively small solubility parameter, that is indium (In), tin (Sn), lead (Pb), bismuth (Bi), calcium (Ca), manganese (Mn), or zinc (Zn), or an alloy containing the above metal is suitable as an electrode material. As the alloy capable of being used, there is an indium alloy such as an indium-tin alloy (InSn), a magnesium-indium alloy (InMg), an indium-phosphorus alloy (InP), an indium-arsenic alloy (InAs), or indium-chromium alloy (InCr).

Of course, a conductive layer which is formed similarly to each of those of FIGS. 1A, 1B, and 16A to 16C may also be used as the first conductive layer and the second conductive layer in each of FIGS. 2A to 2C, 6A, and 6B. A conductive layer containing the metal material having small solubility parameter is used as at least one of the first conductive layer and the second conductive layer, or alternatively, oxidation treatment or the like for reducing the interface tension is performed to at least one of interfaces between the first conductive layer and the organic compound layer and between the second conductive layer and the organic compound layer. A structure as shown in FIG. 16A in which the metal material having small solubility parameter is used for forming the first conductive layer and the second conductive layer may be employed; a structure as shown in FIG. 16B in which a region with small surface tension is formed at both interfaces between the first conductive layer and the organic compound layer and between the second conductive layer and the organic compound layer may be employed; or a structure as shown in FIG. 16C in which the metal material having small solubility parameter is used for forming one of the first conductive layer and the second conductive layer and a region where the surface tension is small is formed at an interface between the organic compound layer and the other one of the first conductive layer and the second conductive layer may be employed.

As each substrate in the above-described structures of the memory cell, a quartz substrate, a silicon substrate, a metal substrate, a stainless-steel substrate, or the like can be used as well as a glass substrate or a flexible substrate. A flexible substrate is a substrate that can be bent (flexible), such as a plastic substrate or the like made of polycarbonate, polyarylate, polyethersulfone, or the like. Further, a film (made of polypropylene, polyester, vinyl, polyvinyl fluoride, polyvinyl chloride, or the like), paper made of a fibrous material, a base film (e.g., polyester, polyamide, an inorganic deposition film, or paper), or the like can also be used. Further alternatively, the memory cell array 722 can also be provided above a field-effect transistor (FET) that is formed over a semiconductor substrate of Si or the like, or above a thin film transistor (TFT) that is formed over a substrate of glass or the like.

The semiconductor device having a memory element manufactured in this embodiment mode has good adhesion inside the memory element; therefore, a peeling and transposing process can be performed with a good state. Therefore, transposition can be freely performed to any substrate, and therefore, selectivity for a substrate material is increased. Further, an inexpensive material can also be selected for the substrate, so that the semiconductor device can be manufactured at low cost as well as having a wide function in accordance with the intended purpose.

As the partitions (insulating layers) 765 and 775, the following may also be used: an inorganic insulating material such as silicon oxide, silicon nitride, silicon oxynitride, aluminum oxide, aluminum nitride, or aluminum oxynitride; acrylic acid, methacrylic acid, or a derivative thereof; a heat-resistant high molecule such as polyimide, aromatic polyamide, or polybenzimidazole; or a siloxane resin. Note that the siloxane resin corresponds to a resin containing a Si—O—Si bond. The skeletal structure of siloxane is constituted by a bond of silicon (Si) and oxygen (O). As a substituent, an organic group containing at least hydrogen (e.g., an alkyl group or an aromatic hydrocarbon) is used. As the substituent, a fluoro group may also be used. Alternatively, an organic group containing at least hydrogen, and a fluoro group may be used as the substituents. Further, the following resin material may also be used: a vinyl resin such as polyvinyl alcohol or polyvinyl butyral; or an epoxy resin, a phenol resin, a novolac resin, an acrylic resin, a melamine resin, or a urethane resin. Further, an organic material such as benzocyclobutene, parylene, fluorinated-arylene-ether, or polyimide, or a composition material containing a water-soluble homopolymer and a water-soluble copolymer may also be used. As a manufacturing method of the partition (insulating layer), a vapor growth method such as plasma CVD or thermal CVD, or sputtering can be used. Further, a droplet discharge method or a printing method (a method of forming a pattern, such as screen printing or offset printing) can also be used. A coating film which is obtained by a coating method, or the like can also be used.

Further, after forming a conductive layer, an insulating layer, or the like by discharging a composition by a droplet discharge method, the surface thereof may be pressed with pressure to be planarized in order to increase planarity. As a method for pressing, unevenness may be reduced by scanning the surface with a roller-shaped object, or the surface may be pressed perpendicularly with a flat, plate-like object: at the time of pressing, heating may be performed. Alternatively, the surface may be softened or melted by flux or the like, and the uneven portion of the surface may be removed with an air knife. Further alternatively, it may be polished using a CMP method. This step can be applied to planarize the surface when unevenness occurs as a result of a droplet discharge method.

Further, as shown in FIGS. 19A to 19C in Embodiment Mode 1, an insulating layer may be provided between the organic compound layer and the first conductive layer; between the organic compound layer and the second conductive layer; or between the first conductive layer and the organic compound layer and between the second conductive layer and the organic compound layer. By providing the insulating layer, characteristics such as a writing voltage of a memory element are stabilized without fluctuation, and normal writing can be performed in each element. Further, since the carrier injection property is improved by the tunnel current, thickness of the organic compound layer can be increased; therefore, a defect of short-circuit of a memory element in the initial state before electrical conduction is provided can be prevented.

Further, in the above-described structures of this embodiment mode, an element having a rectifying property may be provided between the first conductive layers 751a to 751c and the organic compound layer 752, between the first conductive layers 761a to 761c and the organic compound layer 762, between the first conductive layers 771a to 771c and the organic compound layer 772, and between the first conductive layers 791a to 791c and the organic compound layer 792. The element having a rectifying property is a transistor in which a gate electrode and a drain electrode are connected, or a diode. As described above, by providing the diode having a rectifying property, error is reduced and the reading margin is improved since a current flows only in one direction. Note that the element having a rectifying property may also be provided each of between the organic compound layer 752 and the second conductive layers 753a to 753c, between the organic compound layer 762 and the second conductive layers 763a to 763c, between the organic compound layer 772 and the second conductive layers 773a to 773c, and between the organic compound layer 792 and the second conductive layers 793a to 793c.

Even in the case where the element having a rectifying property is provided, required is a structure in which at least one of the first and second conductive layers which are in contact with the organic compound layer is either a conductive layer formed by using the metal material having small solubility parameter as shown in FIG. 1A, or a conductive layer the surface of which is subjected to oxidation treatment or the like in order to reduce the interface tension as shown in FIG. 1B.

By the present invention, a semiconductor device having a memory element having good adhesion inside the memory element, so that a transposition step can be performed with a good state can be manufactured. Therefore, a semiconductor device having higher reliability can be manufactured with a high yield without complexing the apparatus or process.

Embodiment Mode 3

In this embodiment mode, a semiconductor device having constitution different from that of Embodiment Mode 2 will be described. In particular, the case where the semiconductor device is an active matrix type will be described. A memory element in this embodiment mode can be manufactured by using the same material and with the same structure as that in Embodiment Mode 1, and therefore, detailed description of the material or the like is omitted here.

Figure 5A:
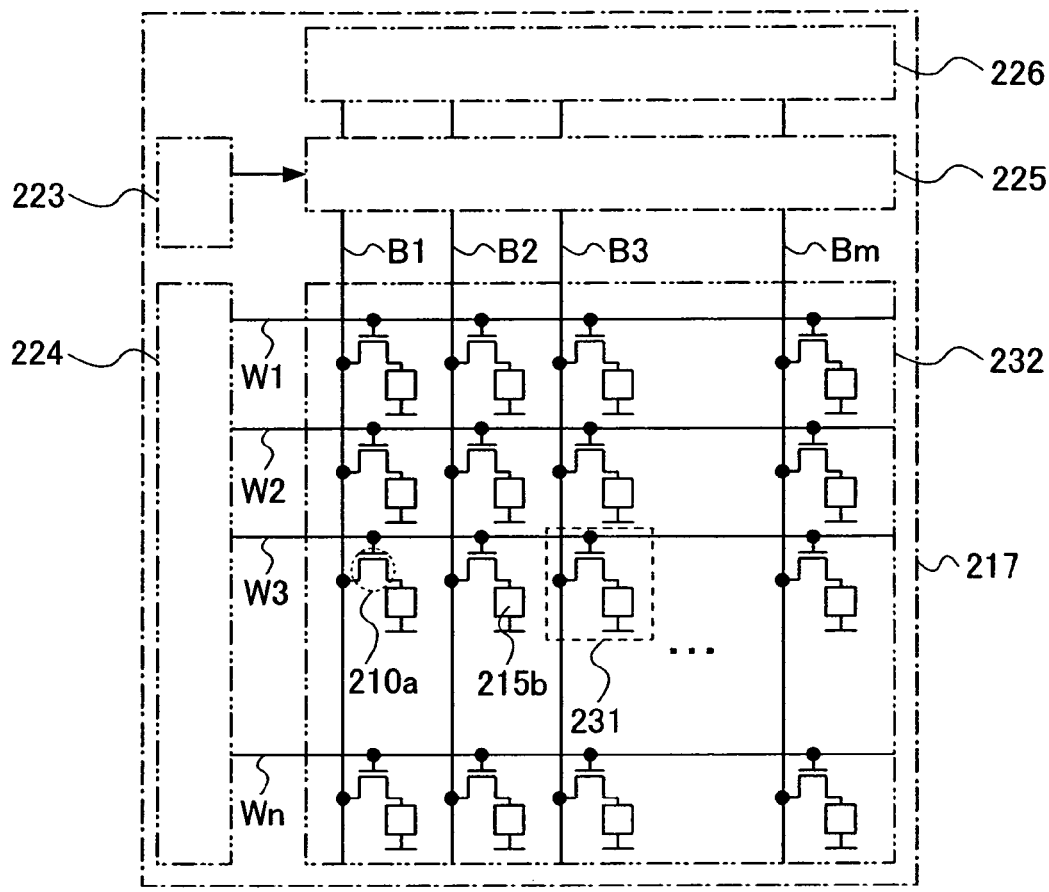
FIGS. 5A to 5C each show a semiconductor device of the invention.
Figure 5B:
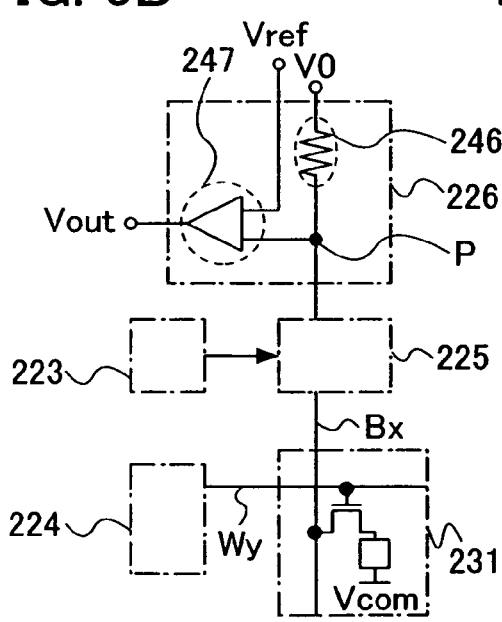
Figure 5C:
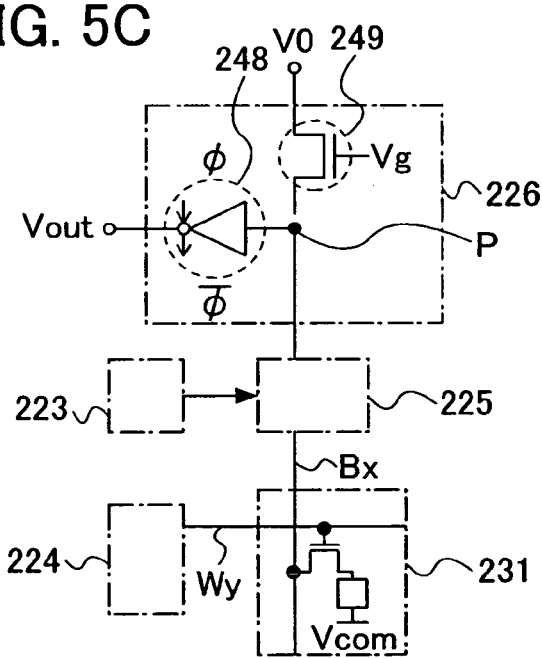

FIGS. 5A to 5C show one constitution example of the semiconductor device of this embodiment mode, which include a memory cell array 232 including memory cells 231 in matrix, a circuit 226, a decoder 224, and a decoder 223. The circuit 226 includes a reading circuit and a writing circuit. It is to be noted that the constitution of a semiconductor device 217 shown here is only one example; the semiconductor device may include another circuit such as a sense amplifier, an output circuit, or a buffer, and the writing circuit may be provided in a bit-line driver circuit.

The memory cell array 232 includes first conductive layers each of which is connected to a bit line Bx (1≦x≦m), second conductive layers each of which is connected to a word line Wy (1≦y≦n), transistors 210a, memory elements 215b, and the memory cells 231. The memory element 215b has a structure in which the organic compound layer is sandwiched between the pair of conductive layers. A gate electrode of the transistor is connected to the word line, one of a source electrode and a drain electrode thereof is connected to the bit line, and the other of the source electrode and the drain electrode thereof is connected to one of two terminals of the memory element. The other terminal of the two terminals of the memory element is connected to a common electrode (a potential of Vcom).

Figure 4A:
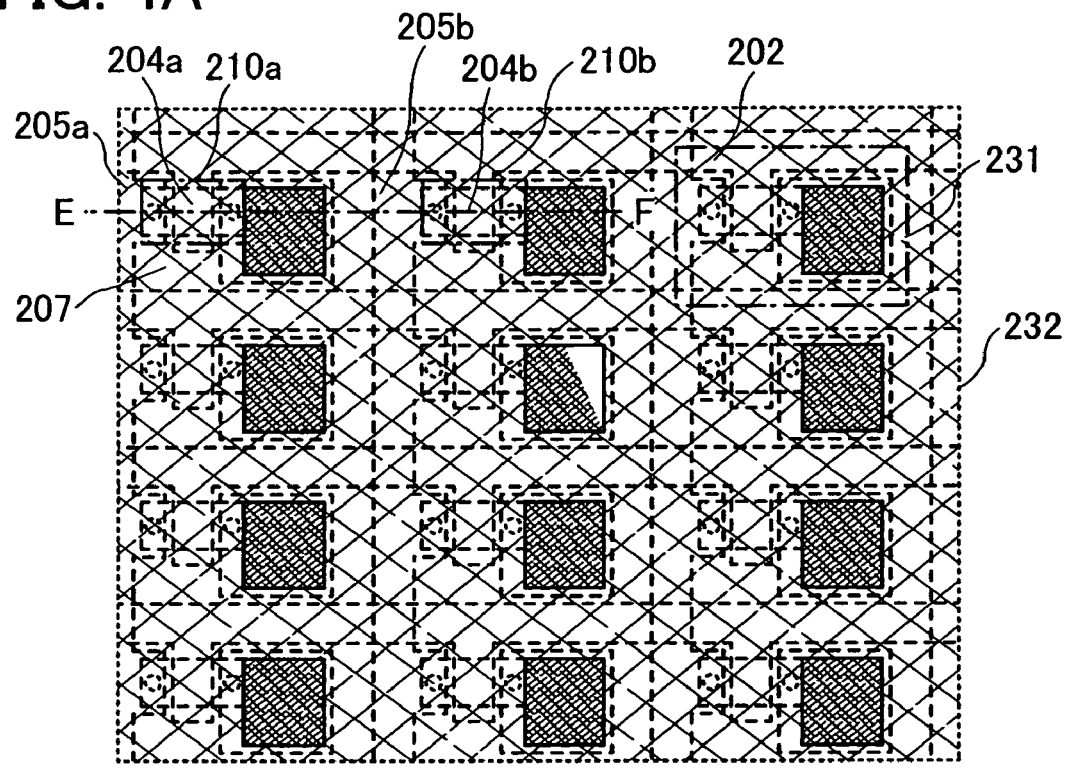
FIGS. 4A and 4B each show a semiconductor device of the invention.
Figure 4B:
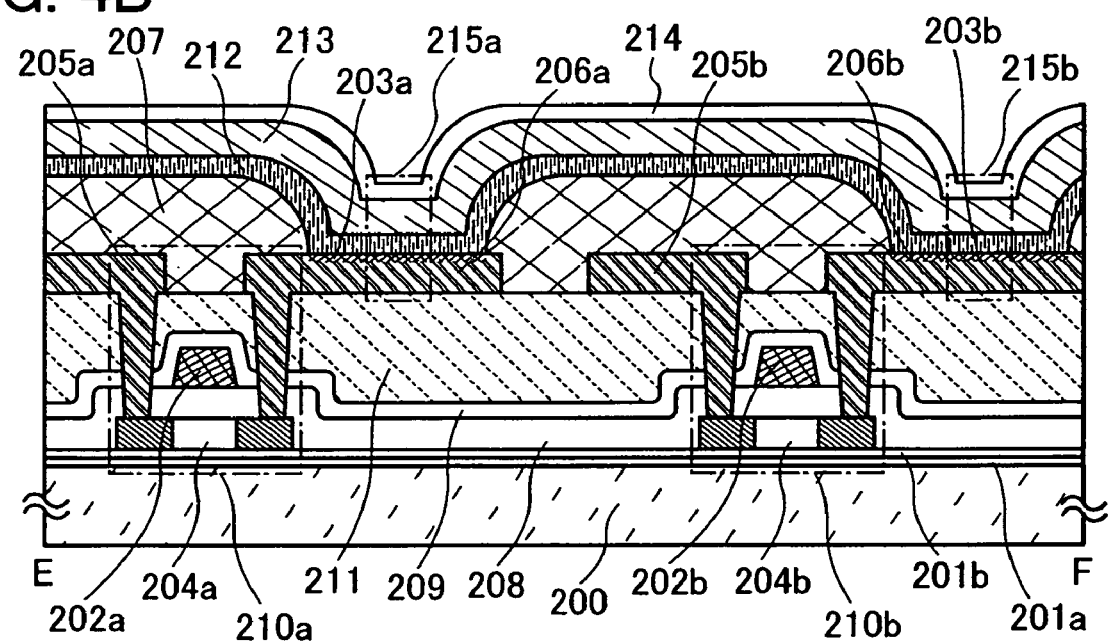

FIG. 4A is a top view of the memory cell array 232, and FIG. 4B is a cross-sectional view taken along a line E-F in FIG. 4A. An insulating layer 216, an organic compound layer 212, a second conductive layer 213, and an insulating layer 214 are provided as shown in FIG. 4B, though not shown in FIG. 4A.

In the memory cell array 232, a first wiring 205a and a first wiring 205b which are extended in a first direction, and a second wiring 202 which is extended in a second direction that is perpendicular to the first direction are provided in matrix. The first wirings 205a and 205b connected to one of a source electrode and a drain electrode of the transistor 210a and a transistor 210b respectively, whereas the second wiring 202 is connected to gate electrodes of the transistor 210a and the transistor 210b. The others of the source electrodes and the drain electrodes of the transistor 210a and the transistor 210b are connected to a first conductive layer 206a and a first conductive layer 206b respectively. A memory element 215a and the memory element 215b are provided by stacking the first conductive layer 206a, the organic compound layer 212, and the second conductive layer 213, and by stacking the first conductive layer 206b, the organic compound layer 212, and the second conductive layer 213, respectively. Further, a partition (an insulating layer) 207 is provided between the memory cells 231 which are adjacent to each other, and over the first conductive layer and the partition (insulating layer) 207, the organic compound layer 212 and the second conductive layer 213 are stacked. The insulating layer 214 which is a protection layer is provided over the second conductive layer 213. Further, a thin film transistor is used as each of the transistors 210a and 210b (see FIG. 4B).

Treatment for reducing the interface tension is performed to respective regions of the first conductive layer 206a and the first conductive layer 206b where the organic compound layer 212 is stacked, thereby forming processing regions 203a and 203b.

As the treatment for reducing the interface tension, the following is performed: the conductive layer is exposed to an oxygen atmosphere; a surface of the conductive layer is oxidized by ozone ($O_3$) which is generated by irradiation with ultraviolet radiation in an oxygen atmosphere; or the like. Alternatively, oxygen plasma may be contacted; the conductive layer may be oxidized by the organic compound material contained in the organic compound, at the interface between the layers; or the like. Further, formation of the conductive layer may be performed in an oxygen atmosphere as well. Further, in addition to the oxidation treatment, nitriding treatment may also be performed; for example, nitriding treatment may be performed after oxidation treatment is performed.

By forming the processing regions 203a and 203b for reducing the interface tension at an interface (a surface) which is in contact with the organic compound layer 212, of the first conductive layer 206a and at an interface (a surface) which is in contact with the organic compound layer 212, of the first conductive layer 206b respectively, adhesion between the first conductive layer 206a and the organic compound layer 212 and between the first conductive layer 206b and the organic compound layer 212 can be improved.

As a metal material used for the second conductive layer 213, one kind or plural kinds of the following are used: indium (In), tin (Sn), lead (Pb), bismuth (Bi), calcium (Ca), antimony (Sb), and zinc (Zn). Further, one kind or plural kinds of the following are used as well: magnesium (Mg), manganese (Mn), cadmium (Cd), thallium (Tl), tellurium (Te), and barium (Ba). A plurality of the above-described metal materials may be contained, or an alloy containing one kind or plural kinds of the above-described materials may be used. In particular, a metal having relatively small solubility parameter, that is indium (In), tin (Sn), lead (Pb), bismuth (Bi), calcium (Ca), manganese (Mn), or zinc (Zn), or an alloy containing the above metal is suitable as an electrode material. As the alloy capable of being used, there is an indium alloy such as an indium-tin alloy (InSn), a magnesium-indium alloy (InMg), an indium-phosphorus alloy (InP), an indium-arsenic alloy (InAs), or indium-chromium alloy (InCr).

By using the material having small solubility parameter for the second conductive layer 213, adhesion between the second conductive layer 213 and the organic compound layer 212 can be improved. Therefore, a defect such as film peeling does not occur at an interface between the layers by force applied at a step of transposition to a second substrate after the formation over a first substrate. Even if a glass substrate which is capable of resisting the manufacturing condition such as temperature is used in an element-manufacturing process, a flexible substrate such as a film can be used as the substrate 200 by transposing to the second substrate later. Consequently, the memory element can be peeled off and transposed with a good form, to manufacture a semiconductor device.

Of course, a conductive layer which is formed similarly to each of those of FIGS. 1A, 1B, 16A, and 16B may also be used as each of the first conductive layer and the second conductive layer in the semiconductor device shown in FIGS. 4A and 4B. A conductive layer containing the metal material having small solubility parameter is used as at least one of the first conductive layer and the second conductive layer, or alternatively, oxidation treatment or the like for reducing the interface tension is performed to at least one of interfaces between the first conductive layer and the organic compound layer and between the second conductive layer and the organic compound layer. A structure as shown in FIG. 16A in which the metal material having small solubility parameter is used for forming the first conductive layer and the second conductive layer may be employed; or a structure as shown in FIG. 16B in which a region with small surface tension is formed at both interfaces between the first conductive layer and the organic compound layer and between the second conductive layer and the organic compound layer may be employed.

The semiconductor device having a memory element manufactured in this embodiment mode has good adhesion inside the memory element; therefore, a peeling and transposing process can be performed with a good state. Therefore, transposition can be freely performed to any substrate, and therefore, selectivity for a substrate material is increased. Further, an inexpensive material can also be selected for the substrate, so that the semiconductor device can be manufactured at low cost as well as having a wide function in accordance with the intended purpose.

The semiconductor device shown in FIG. 4B is provided over the substrate 200, and includes an insulating layer 201a, an insulating layer 201b, an insulating layer 208, an insulating layer 209, an insulating layer 211, the transistor 210a which includes a semiconductor layer 204a, a gate electrode layer 202a, and the wiring 205a which functions as a source electrode layer or a drain electrode layer, and the transistor 210b which includes a semiconductor layer 204b and a gate electrode layer 202b.

Further, as shown in FIGS. 19A to 19C in Embodiment Mode 1, an insulating layer may be provided between the organic compound layer and the first conductive layer; between the organic compound layer and the second conductive layer; or between the first conductive layer and the organic compound layer and between the second conductive layer and the organic compound layer. By providing the insulating layer, characteristics such as a writing voltage of a memory element are stabilized without fluctuation, and normal writing can be performed in each element. Further, since the carrier injection property is improved by the tunnel current, thickness of the organic compound layer can be increased; therefore, a defect of short-circuit of a memory element in the initial state before electrical conductivity is provided is provided can be prevented.

An interlayer insulating layer may also be provided over the transistors 210a and 210b. In the constitution of FIG. 4B, each of the memory elements 215a and 215b is required to be provided in a region other than the source electrode layer or the drain electrode layer of each of the transistors 210a and 210b; however, by providing the interlayer insulating layer, for example, the memory elements 215a and 215b can be formed above the transistors 210a and 210b respectively. Consequently, higher integration of the semiconductor device 217 can be achieved.

The transistors 210a and 210b can have any structure as long as they can function as switching elements. Various semiconductors such as an amorphous semiconductor, a crystalline semiconductor, a polycrystalline semiconductor, and a microcrystalline semiconductor can be used for the semiconductor layer, and an organic transistor may be formed using an organic compound. Although FIG. 4B shows the case where a planar thin film transistor is provided over a substrate having an insulating property, a staggered or inversely-staggered transistor may also be formed.

Figure 7:
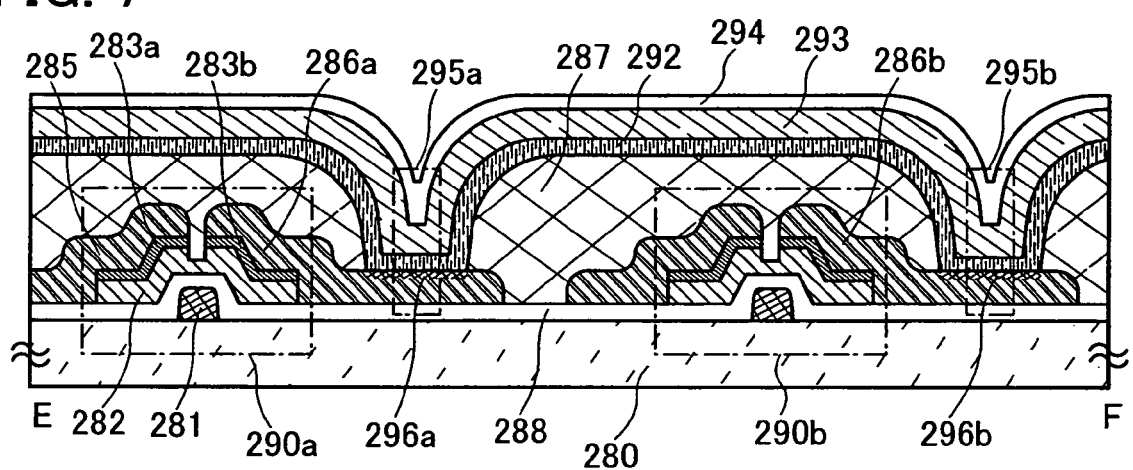
FIG. 7 shows a semiconductor device of the invention.

FIG. 7 shows the case of using an inversely-staggered thin film transistor. Transistors 290a and 290b which are inversely-staggered thin film transistors are provided over a substrate 280. The transistor 290a includes an insulating layer 288, a gate electrode layer 281, an amorphous semiconductor layer 282, a semiconductor layer 283a having one conductivity type, a semiconductor layer 283b having one conductivity type, and a source electrode layer or a drain electrode layer 285. The other of the source electrode layer or the drain electrode layer is a first conductive layer 286a for structuring a memory element. A partition (an insulating layer) 287 is stacked so as to cover end portions of the first conductive layer 286a and a first conductive layer, and over the first conductive layers 286a and 286b and the partition (insulating layer) 287, an organic compound layer 292, a second conductive layer 293, and an insulating layer 294 which is a protection layer are formed, thereby forming memory elements 295a and 295b.

Treatment for reducing the interface tension is performed to respective regions of the first conductive layers 286a and 286b where the organic compound layer 292 is stacked, thereby forming processing regions 296a and 296b.

As the treatment for reducing the interface tension, the following is performed: the conductive layer is exposed to an oxygen atmosphere; a surface of the conductive layer is oxidized by ozone ($O_3$) which is generated by irradiation with ultraviolet radiation in an oxygen atmosphere; or the like. Alternatively, oxygen plasma may be contacted; the conductive layer may be oxidized by the organic compound material contained in the organic compound, at the interface between the layers; or the like. Further, formation of the conductive layer may be performed in an oxygen atmosphere as well. Further, in addition to the oxidation treatment, nitriding treatment may also be performed; for example, nitriding treatment may be performed after oxidation treatment is performed.

By forming the processing regions 296a and 296b for reducing the interface tension at an interface (a surface) which is in contact with the organic compound layer 292, of the first conductive layer 286a and at an interface (a surface) which is in contact with the organic compound layer 292, of the first conductive layer 286b respectively, adhesion between the first conductive layer 286a and the organic compound layer 292 and between the first conductive layer 286b and the organic compound layer 292 can be improved.

As a metal material used for the second conductive layer 293, one kind or plural kinds of the following are used: indium (In), tin (Sn), lead (Pb), bismuth (Bi), calcium (Ca), antimony (Sb), and zinc (Zn). Further, one kind or plural kinds of the following are used as well: magnesium (Mg), manganese (Mn), cadmium (Cd), thallium (Tl), tellurium (Te), and barium (Ba). A plurality of the above-described metal materials may be contained, or an alloy containing one kind or plural kinds of the above-described materials may be used. In particular, a metal having relatively small solubility parameter, that is indium (In), tin (Sn), lead (Pb), bismuth (Bi), calcium (Ca), manganese (Mn), or zinc (Zn), or an alloy containing the above metal is suitable as an electrode material. As the alloy capable of being used, there is an indium alloy such as an indium-tin alloy (InSn), a magnesium-indium alloy (InMg), an indium-phosphorus alloy (InP), an indium-arsenic alloy (InAs), or indium-chromium alloy (InCr).

By using the material having small solubility parameter for the second conductive layer 293, adhesion between the second conductive layer 293 and the organic compound layer 292 can be improved. Therefore, a defect such as film peeling does not occur at an interface between the layers by force applied at a step of transposition to a second substrate after the formation over a first substrate. Even if a glass substrate which is capable of resisting the manufacturing condition such as temperature is used in an element-manufacturing process, a flexible substrate such as a film can be used as the substrate 280 by transposing to the second substrate later. Consequently, the memory element can be peeled off and transposed with a good form, to manufacture a semiconductor device.

In the semiconductor device shown in FIG. 7, the gate electrode layer 281, the source electrode layer or the drain electrode layer 285, the first conductive layers 286a and 286b, and the partition (insulating layer) 287 may be formed using a droplet discharge method. The droplet discharge method is a method in which a composition containing a component-forming material that is fluid is discharged (ejected) as droplets to form a desired pattern. The droplets containing the component-forming material is discharged in a formation region of the component, and is baked, dried, or the like to be solidified, thereby forming a component with a desired pattern.

In the case of forming a conductive layer by using a droplet discharge method, the conductive layer is formed in the following manner: a composition containing a particle-shaped conductive material is discharged, and fused or welded and joined by baking to solidify the composition. Such a conductive layer (or an insulating layer) formed by discharging a composition containing a conductive material and baking it, tends to have a polycrystalline state having many grain boundaries, whereas a conductive layer (or an insulating layer) formed by sputtering or the like tends to have a columnar structure.

Further, the semiconductor layer in each transistor may have any structure. For example, an impurity region (including a source region, a drain region, and an LDD region) may be formed; and either a p-channel type or an n-channel type may be employed. In addition, an insulating layer (a sidewall) may be formed in contact with a side surface of a gate electrode; and a silicide layer may be formed in one or both of a source/drain region and the gate electrode. As a material of the silicide layer, nickel, tungsten, molybdenum, cobalt, platinum, or the like can be used.

As the materials and forming methods of the first conductive layers 206a, 206b, 286a, and 286b and the second conductive layer 213, a second conductive layer 263, and the second conductive layer 293, any of the materials and forming methods described in Embodiment Mode 1 can be used similarly.

Further, the organic compound layers 212 and 292 can be provided using the same material and forming method as that of the organic compound layer described in Embodiment Mode 1.

Further, an element having a rectifying property may be provided between the first conductive layers 206a and 206b and the organic compound layer 212 and between the first conductive layers 286a and 286b and the organic compound layer 292. The element having a rectifying property is a transistor in which a gate electrode and a drain electrode are connected, or a diode. For example, a pn junction diode which is provided by stacking an n-type semiconductor layer and a p-type semiconductor layer may be used. As described above, by providing the diode having a rectifying property, error is reduced and the reading margin is improved since a current flows only in one direction. In the case of providing a diode, a diode other than the pn junction diode, such as a pin junction diode or an avalanche diode may also be used. Note that the element having a rectifying property may also be provided each of between the organic compound layer 212 and the second conductive layer 213 and between the organic compound layer 292 and the second conductive layer 293.

Even in the case where the element having a rectifying property is provided, required is a structure in which at least one of the first and second conductive layers which are in contact with the organic compound layer is either a conductive layer formed by using the metal material having small solubility parameter as shown in FIG. 1A, or a conductive layer the surface of which is subjected to oxidation treatment or the like in order to reduce the interface tension as shown in FIG. 1B.

By the present invention, a semiconductor device having a memory element having good adhesion inside the memory element, so that a transposition step can be performed with a good state can be manufactured. Therefore, a semiconductor device having higher reliability can be manufactured with a high yield without complexing the apparatus or process.

Embodiment Mode 4

In this embodiment mode, a manufacturing method of a semiconductor device will be described using FIGS. 8A, 8B, 9A, and 9B. A memory element in this embodiment mode can be manufactured by using the same material and with the same structure as that in Embodiment Mode 1, and therefore, detailed description of the material or the like is omitted here.

Figure 8A:
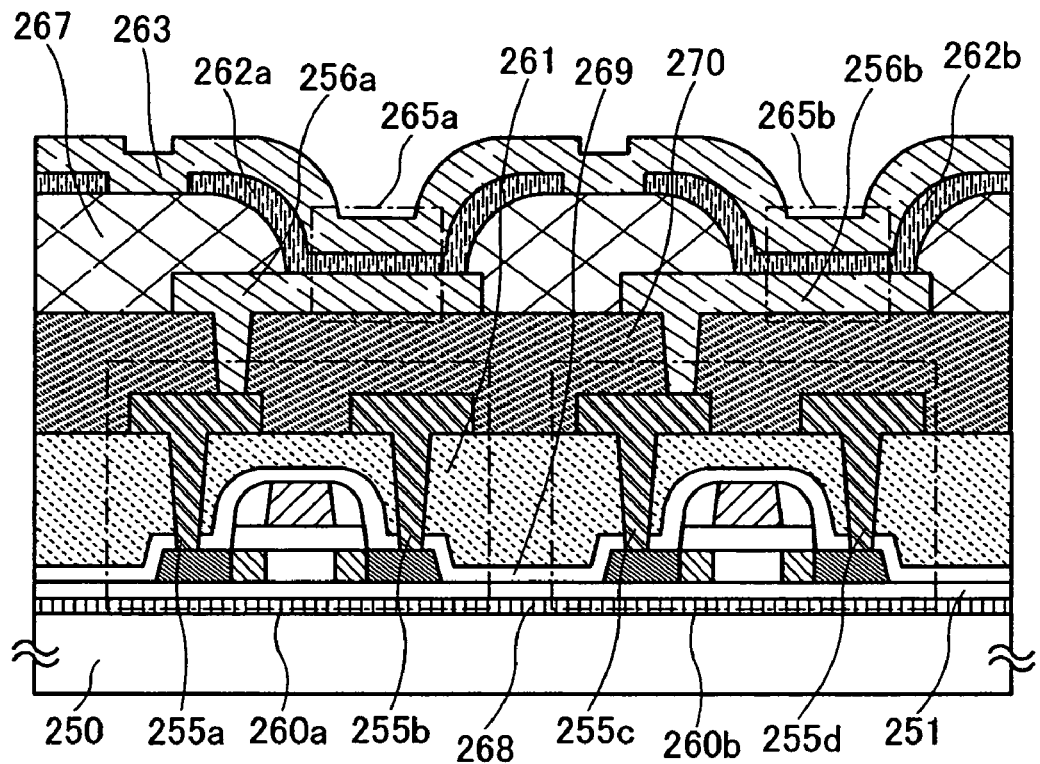
FIGS. 8A and 8B show a manufacturing method of a semiconductor device of the invention.
Figure 8B:
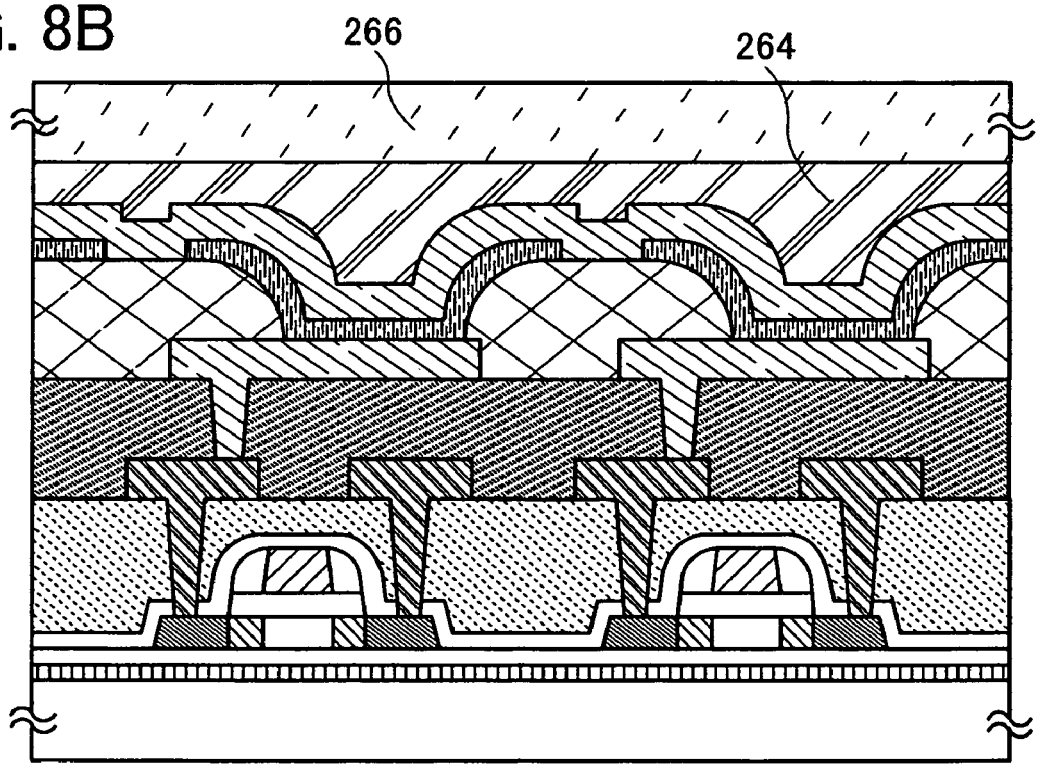

As shown in FIGS. 8A and 8B, a peeling layer 268 and an insulating layer 251 are formed over a substrate 250. Over the insulating layer 251, a transistor 260a and a transistor 260b are formed. Each of the transistors 260a and 260b in FIGS. 8A and 8B is a top-gate planar thin film transistor in which a sidewall is provided on an end portion of a gate electrode layer; however, the invention is not limited to this structure. Over the transistors 260a and 260b, an insulating layer 269 and an insulating layer 261 are stacked. In the insulating layers 269 and 261, openings reaching respective impurity regions which are source regions and drain regions in semiconductor layers of the transistors 260a and 260b are formed. In the openings, a wiring layer 255a, a wiring layer 255b, a wiring layer 255c, and a wiring layer 255d are formed.

An insulating layer 270 is formed over the wiring layers 255a, 255b, 255c, and 255d. In the insulating layer 270, respective openings reaching the wiring layers 255a and 255c are formed. A first conductive layer 256a and a first conductive layer 256b are formed in the openings, and the first conductive layer 256a and the first conductive layer 256b are electrically connected to the transistor 260a and the transistor 260b via the wiring layer 255a and the wiring layer 255c respectively.

A partition (an insulating layer) 267 is formed which has openings above the first conductive layer 256a and the first conductive layer 256b and covers end portions of the first conductive layers 256a and 256b. An organic compound layer 262a is stacked on the first conductive layer 256a while an organic compound layer 262b is stacked on the first conductive layer 256b, and the second conductive layer 263 is formed over the organic compound layers 262a and 262b and the partition (insulating layer) 267 (see FIG. 8A). In this manner, a memory element 265a which includes the first conductive layer 256a, the organic compound layer 262a, and the second conductive layer 263, and a memory element 265b which includes the first conductive layer 256b, the organic compound layer 262b, and the second conductive layer 263 are provided over the substrate 250.

As the substrate 250, a glass substrate made of barium borosilicate glass, alumino borosilicate glass, or the like; a quartz substrate; a metal substrate or a stainless-steel substrate having an insulating layer on a surface thereof; or a plastic substrate which can withstand the process temperature of the manufacturing process in this embodiment mode is used. A surface of the substrate 250 may be polished by a CMP method or the like so as to be planarized.

The peeling layer 268 is formed by sputtering, plasma CVD, a coating method, printing, or the like, using a single layer or a multi-layer of a layer formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir) and silicon (Si); or an alloy material or a compound material containing any of the elements as its main component. A layer containing silicon may have any of an amorphous structure, a microcrystalline structure, or a polycrystalline structure. Note that a coating method includes a spin-coating method, a droplet discharge method, and a dispensing method in its category here.

In the case where the peeling layer 268 has a single-layer structure, a tungsten layer, a molybdenum layer, or a layer containing a mixture of tungsten and molybdenum is preferably formed. Alternatively, a layer containing oxide or oxynitride of tungsten, a layer containing oxide or oxynitride of molybdenum, or a layer containing oxide or oxynitride of a mixture of tungsten and molybdenum is formed. The mixture of tungsten and molybdenum corresponds to, for example, an alloy of tungsten and molybdenum.

In the case where the peeling layer 268 has a multi-layer structure, preferably, a tungsten layer, a molybdenum layer, or a layer containing a mixture of tungsten and molybdenum is formed as the first layer thereof, and a layer containing tungsten, molybdenum, or oxide, nitride, oxynitride or nitride oxide of a mixture of tungsten and molybdenum is formed as the second layer thereof.

In the case where the peeling layer 268 has a multi-layer structure of a layer containing tungsten and a layer containing tungsten oxide, the layer containing tungsten may be formed first and an insulating layer formed of oxide may be formed on the layer containing tungsten so that a layer containing tungsten oxide can be formed at an interface between the tungsten layer and the insulating layer. Alternatively, thermal oxidization treatment, oxygen plasma treatment, or treatment with a solution having strong oxidizability such as ozone water may be performed to a surface of a layer containing tungsten so that a layer containing tungsten oxide is formed; the plasma treatment or thermal treatment may be performed in an atmosphere of oxygen, nitrogen, dinitrogen monoxide, an elementary substance of dinitrogen monoxide, or a mixed gas of the gas and another gas. The same can be applied to the case of forming a layer containing a nitride, an oxynitride, or a nitride oxide of tungsten over a layer containing tungsten; after forming the layer containing tungsten, a silicon nitride layer, a silicon oxynitride layer, or a silicon nitride oxide layer is preferably formed.

Tungsten oxide is denoted by WOx. The "x" is within the range of 2 to 3, and there are $WO_2$ (where x is 2), $W_2O_5$ (where x is 2.5), $W_4O_{11}$ (where x is 2.75), $WO_3$ (where x is 3), and the like.

Further, although the peeling layer 268 is formed so as to be in contact with the substrate 250 in the above-described process, the invention is not limited to this process. An insulating layer which is a base may be formed so as to be in contact with the substrate 250, and the peeling layer 268 may be formed so as to be in contact with the insulating layer.

The insulating layer 251 is formed using an inorganic compound with a single-layer structure or a multi-layer structure by sputtering, plasma CVD, a coating method, printing, or the like. As a typical example of the inorganic compound, there is oxide of silicon and nitride of silicon. As a typical example of oxide of silicon, there is silicon oxide, silicon oxynitride, silicon nitride oxide, and the like. As a typical example of nitride of silicon, there is silicon nitride, silicon oxynitride, silicon nitride oxide, and the like.

Moreover, the insulating layer 251 may have a multi-layer structure. For example, a multi-layer may be formed by using an inorganic compound; typically, silicon oxide, silicon nitride oxide, and silicon oxynitride may be stacked.

As a material for forming the semiconductor layer included in the transistors 260a and 260b, an amorphous semiconductor (hereinafter also called an "AS") manufactured using a semiconductor material gas typified by silane or germane by a vapor phase growth method or sputtering; a polycrystalline semiconductor that is formed by crystallizing the amorphous semiconductor by utilizing light energy or thermal energy; a semiamorphous (also called microcrystalline or microcrystal) semiconductor (hereinafter also called a "SAS"); or the like can be used. The semiconductor layer can be formed by a known method (e.g., sputtering, LPCVD, or plasma CVD).

SAS is a semiconductor having an intermediate structure between an amorphous structure and a crystalline (including a single crystal and a polycrystal) structure and having a third state which is stable in free energy, and contains a crystalline region having short-range order and lattice distortion. The SAS is formed by glow discharge decomposition (plasma CVD) of a gas containing silicon. As the gas containing silicon, $Si_2H_6$, $SiH_2Cl_2$, $SiHCl_3$, $SiCl_4$, $SiF_4$, or the like, as well as $SiH_4$, can be used. Further, $F_2$ or $GeF_4$ may be mixed into the above-described gas containing silicon. This gas containing silicon may be diluted with $H_2$, or $H_2$ and one or more rare gas elements of He, Ar, Kr, and Ne. Further, as the semiconductor layer, an SAS layer formed using a hydrogen-based gas may be stacked on a SAS layer formed using a fluorine-based gas.

The amorphous semiconductor is typified by hydrogenated amorphous silicon, and the crystalline semiconductor is typified by polysilicon or the like. Polysilicon (polycrystalline silicon) includes so-called high-temperature polysilicon which contains polysilicon that is formed at a process temperature of 800° C. or more as its main component, so-called low-temperature polysilicon which contains polysilicon that is formed at a process temperature of 600° C. or less as its main component, polysilicon which is crystallized by adding an element for promoting crystallization, or the like in its category. As described above, of course, either a semiconductor which contains a crystalline phase in a portion of the semiconductor layer or a semiamorphous semiconductor can also be used.

Further, as a material of the semiconductor, a compound semiconductor such as GaAs, InP, SiC, ZnSe, GaN, or SiGe can be used as well as an elementary substance such as silicon (Si) or germanium (Ge). Further, an oxide semiconductor such as zinc oxide (ZnO) or tin oxide ($SnO_2$) can also be used; in the case of using ZnO for the semiconductor layer, the gate insulating layer may be preferably formed of $Y_2O_3$, $Al_2O_3$, $TiO_2$, a multi-layer thereof, or the like, and the gate electrode layer, the source electrode layer, and the drain electrode layer may be preferably formed of ITO, Au, Ti, or the like. In addition, In, Ga, or the like can also be added into ZnO.

In the case where a crystalline semiconductor layer is used as the semiconductor layer, a known method (e.g., laser crystallization, thermal crystallization, or thermal crystallization using an element for promoting crystallization such as nickel) may be employed as a manufacturing method of the crystalline semiconductor layer. Alternatively, a microcrystalline semiconductor which is a SAS can be crystallized by laser irradiation to improve the crystallinity. In the case where the element for promoting crystallization is not injected, hydrogen is released until the concentration of hydrogen contained in an amorphous silicon film becomes $1 \times 10^{20}$ atoms/cm$^3$ or less by heating the amorphous silicon film at a temperature of 500° C. for one hour in a nitrogen atmosphere before irradiating the amorphous silicon film with laser light. This is because the amorphous silicon film containing much hydrogen is damaged when the film is irradiated with laser light.

Any method can be used for injecting a metal element into the amorphous semiconductor layer as long as the metal element can exist on a surface of or inside the amorphous semiconductor layer. For example, sputtering, CVD, plasma treatment (including plasma CVD), an adsorption method, or a method of applying a metal salt solution can be employed. Among them, the method using a solution is simple, easy, and advantageous in easy control of the concentration of the metal element. In addition, at this time, it is preferable to form an oxide film by UV light irradiation in an oxygen atmosphere, a thermal oxidation method, a treatment with ozone water including a hydroxyl radical, or hydrogen peroxide, or the like in order to improve wettability of a surface of the amorphous semiconductor layer and to spread the aqueous solution on the entire surface of the amorphous semiconductor layer.

Further, at the crystallization step for forming a crystalline semiconductor layer by crystallizing the amorphous semiconductor layer, an element (also referred to as a catalytic element or a metal element) which promotes crystallization may be added into the amorphous semiconductor layer and heat treatment (at 550° C. to 750° C. for 3 minutes to 24 hours) may be performed for crystallization. As the element which promotes crystallization, one kind or plural kinds of metal elements of iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

In order to remove or reduce the element which promotes crystallization from the crystalline semiconductor layer, a semiconductor layer containing an impurity element is formed in contact with the crystalline semiconductor layer, and the semiconductor layer functions as a gettering sink. As the impurity element, an impurity element imparting n-type conductivity, an impurity element imparting p-type conductivity, a rare gas element, or the like can be used; for example, one kind or plural kinds of elements of phosphorus (P), nitrogen (N), arsenic (As), antimony (Sb), bismuth (Bi), boron (B), helium (He), neon (Ne), argon (Ar), krypton (Kr), and xenon (Xe) can be used. The semiconductor layer containing a rare gas element is formed on the crystalline semiconductor layer containing the element which promotes crystallization, and heat treatment (at 550° C. to 750° C. for 3 minutes to 24 hours) is performed. The element which promotes crystallization in the crystalline semiconductor layer moves into the semiconductor layer containing the rare gas element, so that the element which promotes crystallization in the crystalline semiconductor layer is removed or reduced. After that, the semiconductor layer containing the rare gas element, which functions as the gettering sink, is removed.

Heat treatment and laser light irradiation may be combined to crystallize the amorphous semiconductor layer. Alternatively, only one of heat treatment and laser light irradiation may be performed plural times.

Further, a crystalline semiconductor layer may be directly formed over the substrate by a plasma method as well. Alternatively, a crystalline semiconductor layer may be selectively formed over the substrate by a plasma method.

The semiconductor layer can be formed using an organic semiconductor material by a printing method, a spray method, a spin-coating method, a droplet discharge method, or the like. In this case, since the above etching step is not required, the number of steps can be reduced. A low-molecular material, a high-molecular material, or the like is used as the organic semiconductor material, and a material such as an organic pigment or a conductive high-molecular material can be used as well. A n-electron conjugated high-molecular material having a skeleton including conjugated double bonds is preferably used as the organic semiconductor material. Typically, a soluble high-molecular material such as polythiophene, polyfluorene, poly(3-alkylthiophene), a polythiophene derivative, or pentacene can be used.

As well as the above, there is a material which can form the semiconductor layer by processing after the deposition of a soluble precursor, as the organic semiconductor material applicable to the present invention. As such an organic semiconductor material, there is polythienylenevinylene, poly(2, 5-thienylenevinylene), polyacetyrene, a polyacetyrene derivative, polyarylenevinylene, or the like.

For converting the precursor into an organic semiconductor, a reaction catalyst such as a hydrogen chloride gas is added in addition to heat treatment. The following can be employed as a typical solvent which dissolves the soluble organic semiconductor material: toluene, xylene, chlorobenzene, dichlorobenzene, anisole, chloroform, dichloromethane, gamma butyl lactone, butyl cellosolve, cyclohexane, NMP (N-methyl-2-pyrrolidone), cyclohexanone, 2-butanone, dioxane, dimethylformamide (DMF), THF (tetrahydrofuran), or the like.

The gate electrode layer can be formed by CVD, sputtering, a droplet discharge method, or the like. The gate electrode layer may be formed of an element selected from Ag, Au, Cu, Ni, Pt, Pd, Ir, Rh, W, Al, Ta, Mo, Cd, Zn, Fe, Ti, Si, Ge, Zr, and Ba; or an alloy material or a compound material containing any of the elements as its main component. Further, a semiconductor film which is typified by a polycrystalline silicon film doped with an impurity element such as phosphorous, or an AgPdCu alloy may be used as well. Further, either a single-layer structure or a multi-layer structure may be employed; for example, a two-layer structure of a tungsten nitride film and a molybdenum film may be employed or a three-layer structure in which a tungsten film with a thickness of 50 nm, a film of an aluminum-silicon alloy (Al—Si) with a thickness of 500 nm, and a titanium nitride film with a thickness of 30 nm are stacked in this order may be employed. In the case of employing a three-layer structure, tungsten nitride may be used instead of the tungsten for the first conductive film, a film of an aluminum-titanium alloy (Al—Ti) may be used instead of the film of an aluminum-silicon alloy (Al—Si) as the second conductive film, and a titanium film may be used instead of the titanium nitride film as the third conductive film.

A light-transmitting material having transmitting property to visible light can also be used for the gate electrode layer. As the light-transmitting conductive material, indium tin oxide (ITO), indium tin oxide containing silicon oxide (ITSO), organic indium, organic tin, zinc oxide, or the like can be used. Further, indium zinc oxide (IZO) containing zinc oxide (ZnO), ZnO doped with gallium (Ga), tin oxide ($SnO_2$), indium oxide containing tungsten oxide, indium zinc oxide containing tungsten oxide, indium oxide containing titanic oxide, indium tin oxide containing titanic oxide, or the like may be used as well.

If etching processing is required to form the gate electrode layer, a mask may be formed and dry etching or wet etching may be performed. The electrode layer can be etched into a tapered shape by using an ICP (Inductively Coupled Plasma) etching method and appropriately adjusting the etching condition (e.g., the amount of electric power applied to a coiled electrode, the amount of electric power applied to an electrode on a substrate side, or the temperature of the electrode on the substrate side). As the etching gas, a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be appropriately used.

Although the description is made of a single gate structure in this embodiment mode, a multi-gate structure such as a double-gate structure may also be employed; In this case, gate electrode layers may be provided above and below the semiconductor layer or a plurality of gate electrode layers may be provided only one side of (that is, above or below) the semiconductor layer. The semiconductor layer may include impurity regions having different concentrations; for example, a region where the gate electrode layer is stacked in the vicinity of a channel region of the semiconductor layer may be formed to be a low-concentration impurity region while a region outside the low-concentration impurity region may be formed to be a high-concentration impurity region.

The wiring layers 255a, 255b, 255c, and 255d can be formed by forming a conductive layer by PVD, CVD, an evaporation method, or the like and then etching the conductive layer into a desired shape. Further, the source electrode layer and the drain electrode layer can be formed selectively in a predetermined position by a printing method, an electric field plating method, or the like; moreover, a reflow method or a damascene method may also be used. As a material of the source electrode layer and the drain electrode layer, a metal such as Ag, Au, Cu, Ni, Pt, Pd, Ir, Rh, W, Al, Ta, Mo, Cd, Zn, Fe, Ti, Zr, or Ba, a semiconductor such as Si or Ge, or an alloy or a nitride thereof can be used. Further, a light-transmitting material can also be used.

As the light-transmitting conductive material, indium tin oxide (ITO), indium tin oxide containing silicon oxide (ITSO), indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanic oxide, indium tin oxide containing titanic oxide, or the like can be used.

The insulating layer 261, the insulating layer 270, and the partition (insulating layer) 267 may be formed of the following: an inorganic insulating material such as silicon oxide, silicon nitride, silicon oxynitride, aluminum oxide, aluminum nitride, or aluminum oxynitride; acrylic acid, methacrylic acid, or a derivative thereof; a heat-resistant high molecule such as polyimide, aromatic polyamide, or polybenzimidazole; or a resin material such as a vinyl resin such as polyvinyl alcohol or polyvinyl butyral, an epoxy resin, a phenol resin, a novolac resin, an acrylic resin, a melamine resin, an urethane resin, or a siloxane resin. The acrylic or the polyimide may be either a photosensitive material or a non-photosensitive material. In particular, the partition (insulating layer) 267 may preferably be formed into a shape where the curvature radius is continuously changed, so that coatability of the organic compound layers 262a and 262b and the second conductive layer 263 which are formed over the partition (insulating layer) 267 can be improved. The insulating layer can be formed by CVD, plasma CVD, sputtering, a droplet discharge method, a printing method (e.g., screen printing, offset printing, relief printing, or gravure (intaglio) printing), a coating method such as spin coating, a dipping method, or the like.

In this embodiment mode, as a metal material used for the first conductive layers 256a and 256b and the second conductive layer 263, one kind or plural kinds of the following are used: indium (In), tin (Sn), lead (Pb), bismuth (Bi), calcium (Ca), antimony (Sb), and zinc (Zn). Further, one kind or plural kinds of the following are used as well: magnesium (Mg), manganese (Mn), cadmium (Cd), thallium (Tl), tellurium (Te), and barium (Ba). A plurality of the above-described metal materials may be contained, or an alloy containing one kind or plural kinds of the above-described materials may be used. In particular, a metal having relatively small solubility parameter, that is indium (In), tin (Sn), lead (Pb), bismuth (Bi), calcium (Ca), manganese (Mn), or zinc (Zn), or an alloy containing the above metal is suitable as an electrode material. As the alloy capable of being used, there is an indium alloy such as an indium-tin alloy (InSn), a magnesium-indium alloy (InMg), an indium-phosphorus alloy (InP), an indium-arsenic alloy (InAs), or indium-chromium alloy (InCr).

Of course, a conductive layer which is formed similarly to each of those of FIGS. 1A, 1B, and 16A to 16C may also be used as each of the first conductive layer and the second conductive layer shown in FIGS. 8A, 8B, 9A, and 9B. A conductive layer containing the metal material having small solubility parameter is used as at least one of the first conductive layer and the second conductive layer, or alternatively, oxidation treatment or the like for reducing the interface tension is performed to at least one of interfaces between the first conductive layer and the organic compound layer and between the second conductive layer and the organic compound layer. A structure as shown in FIG. 16A in which the metal material having small solubility parameter is used for forming the first conductive layer and the second conductive layer may be employed; a structure as shown in FIG. 16B in which a region with small surface tension is formed at both interfaces between the first conductive layer and the organic compound layer and between the second conductive layer and the organic compound layer may be employed; or a structure as shown in FIG. 16C in which the metal material having small solubility parameter is used for forming one of the first conductive layer and the second conductive layer and a region where the surface tension is small is formed at an interface between the organic compound layer and the other of the first conductive layer and the second conductive layer may be employed.

Further, also in this embodiment mode (the semiconductor device shown in FIGS. 8A, 8B, 9A, and 9B), as shown in FIGS. 19A to 19C in Embodiment Mode 1, an insulating layer may be provided between the organic compound layer and the first conductive layer; between the organic compound layer and the second conductive layer; or between the first conductive layer and the organic compound layer and between the second conductive layer and the organic compound layer. By providing the insulating layer, characteristics such as a writing voltage of a memory element are stabilized without fluctuation, and normal writing can be performed in each element. Further, since the carrier injection property is improved by the tunnel current, thickness of the organic compound layer can be increased; therefore, a defect of short-circuit of a memory element in the initial state before electrical conduction is provided can be prevented.

The organic compound layers 262a and 262b may be formed similarly of the same material as that of the organic compound layer 32 or the organic compound layer 37 in FIGS. 1A and 1B.

Next, as shown in FIG. 8B, an insulating layer 264 is formed over the second conductive layer 263. Then, a substrate 266 is attached to a surface of the insulating layer 264.

The insulating layer 264 is preferably formed by applying a composition using a coating method and then drying and heating. The insulating layer 264 which is provided as a protection layer used at a later peeling step is preferably an insulating layer with less unevenness on the surface. Such an insulating layer 264 can be formed by a coating method. Alternatively, an insulating film may be formed by a thin-film forming method such as CVD or sputtering, and a surface thereof is polished by a CMP method to form the insulating layer 264. The insulating layer 264 formed using the coating method is formed of the following: an organic compound such as an acrylic resin, a polyimide resin, a melamine resin, a polyester resin, a polycarbonate resin, a phenol resin, an epoxy resin, polyacetal, polyether, polyurethane, polyamide (nylon), a furan resin, or a diallylphthalate resin; an inorganic siloxane polymer including a Si—O—Si bond among compounds including silicon, oxygen, and hydrogen formed by using a siloxane polymer-based material typified by silica glass as a starting material; or an organic siloxane polymer in which hydrogen bonded to silicon is substituted by an organic group such as methyl or phenyl, typified by an alkylsiloxane polymer, an alkylsilsesquioxane polymer, a silsesquioxane hydride polymer, an alkylsilsesquioxane hydride polymer. The insulating layer formed by the aforementioned thin-film forming method, which is then subjected to surface polishing by a CMP method, is formed of silicon oxide, silicon oxynitride, silicon nitride oxide, silicon nitride, or the like. The insulating layer 264 is not necessarily formed, and the substrate 266 may be directly attached to the second conductive layer 263.

A flexible substrate which is thin and light-weight may be preferably used as the substrate 266. Typically, a substrate made from PET (polyethylene terephthalate), PEN (polyethylene naphthalate), PES (polyethersulfone), polypropylene, polypropylene sulfide, polycarbonate, polyetherimide, polyphenylene sulfide, polyphenylene oxide, polysulfone, polyphthalamide, or the like can be used. Further, paper made from a fibrous material, a multilayer film of a base material film (e.g., polyester, polyamide, an inorganic evaporated film, or paper) and an adhesive organic resin film (e.g., an acrylic-based organic resin, or an epoxy-based organic resin), or the like can also be used. In the case of using the above-described substrate, the insulating layer 264 and the substrate 266 may be attached to each other by providing an adhesion layer, though not shown, between the insulating layer 264 and the substrate 266.

Alternatively, a film having an adhesion layer (made from polypropylene, polyester, vinyl, polyvinyl fluoride, vinyl chloride, or the like) which is attached to an object to be processed by thermocompression may be used as the substrate 266. Such a film can be attached to an object to be processed by melting the adhesion layer provided in the outermost surface of the film or a layer (which is not the adhesion layer) provided in the outermost layer of the film by heat treatment and then by applying pressure thereto. In this case, the adhesion layer is not necessarily provided between the insulating layer 264 and the substrate 266.

Here, the insulating layer 264 is formed using an epoxy resin in the following manner: a composition containing an epoxy resin material is applied using a coating method, and then is dried and baked. Next, the substrate 266 is attached over the insulating layer 264 by thermocompressing the film to a surface of the insulating layer 264.

Figure 9A:
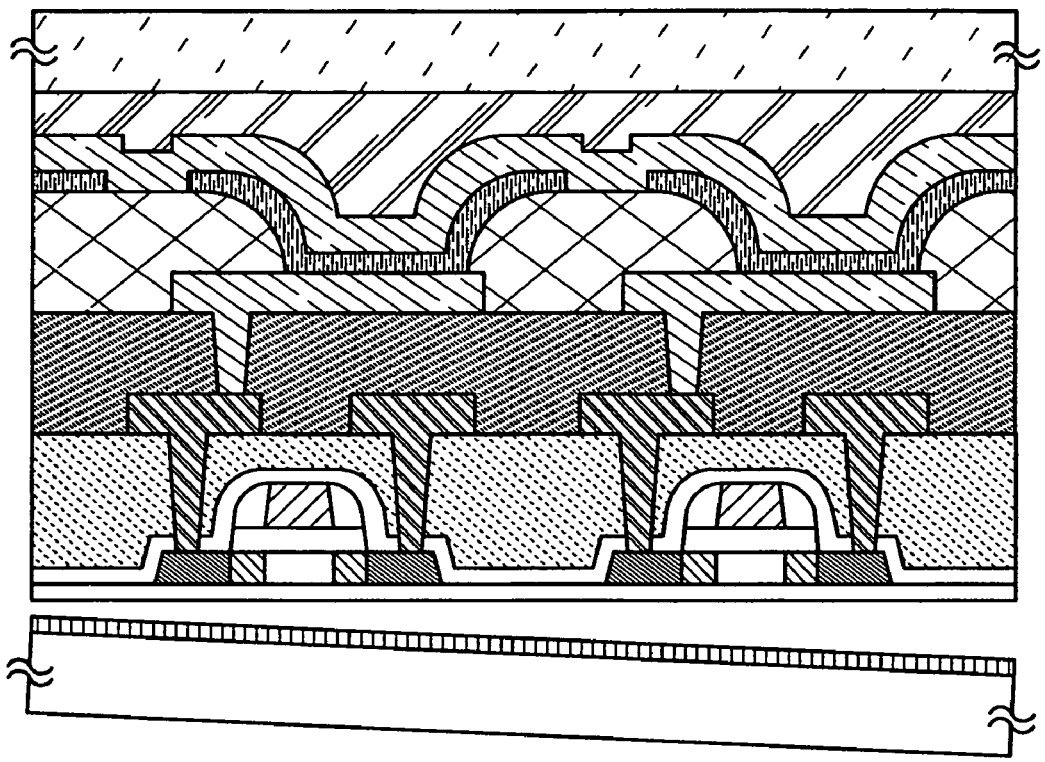
FIGS. 9A and 9B show a manufacturing method of a semiconductor device of the invention.

Next, as shown in FIG. 9A, the peeling layer 268 and the insulating layer 251 are peeled off from each other. In this manner, an element-formed layer including a memory element and a circuit portion is peeled from the substrate 250, and transposed to the insulating layer 264 and the substrate 266.

Although this embodiment mode uses a method for peeling the element-formed layer, in which the peeling layer and the insulating layer are formed between the substrate and the element-formed layer, the metal oxide film is provided between the peeling layer and the insulating layer, and the metal oxide film is weakened by crystallization, the present invention is not limited to this. Any of the following methods can also be arbitrarily used: (1) a method in which an amorphous silicon film containing hydrogen is provided between a substrate having high heat resistance and an element-formed layer, and the amorphous silicon film is irradiated with laser light or etched to remove the amorphous silicon film, thereby peeling the element-formed layer; (2) a method in which a peeling layer and an insulating layer are formed between a substrate and an element-formed layer, a metal oxide film is provided between the peeling layer and the insulating layer, the metal oxide film is weakened by crystallization, a part of the peeling layer is etched away using a solution or a halogen fluoride gas such as $NF_3$, $BrF_3$, or $ClF_3$, and peeling is performed at the weakened metal oxide film; (3) a method in which a substrate over which an element-formed layer is formed is mechanically removed or is etched away using a solution or a halogen fluoride gas such as $NF_3$, $BrF_3$, or $ClF_3$; or the like. Alternatively, a method in which a film containing nitrogen, oxygen, or hydrogen (e.g., an amorphous silicon film containing hydrogen, an alloy film containing hydrogen, or an alloy film containing oxygen) is used as a peeling layer, and the peeling layer is irradiated with laser light to release the nitrogen, oxygen, or hydrogen contained in the peeling layer, thereby promoting peeling between an element-formed layer and a substrate, may be used.

By combining the above-described peeling methods, the transposing step can be more easily performed. That is, peeling can also be performed with physical force (by a human hand, a machine, or the like) after performing laser light irradiation; etching to the peeling layer with a gas, a solution, or the like; or mechanical removal with a sharp knife, scalpel, or the like, so as to create a condition where the peeling layer and the element-formed layer can be easily peeled off from each other. Further, the above-described peeling methods are examples, and the invention is not limited to them. By applying the present invention, an element can be transposed with a good state since the element is not damaged by force applied at a peeling step.

Figure 9B:
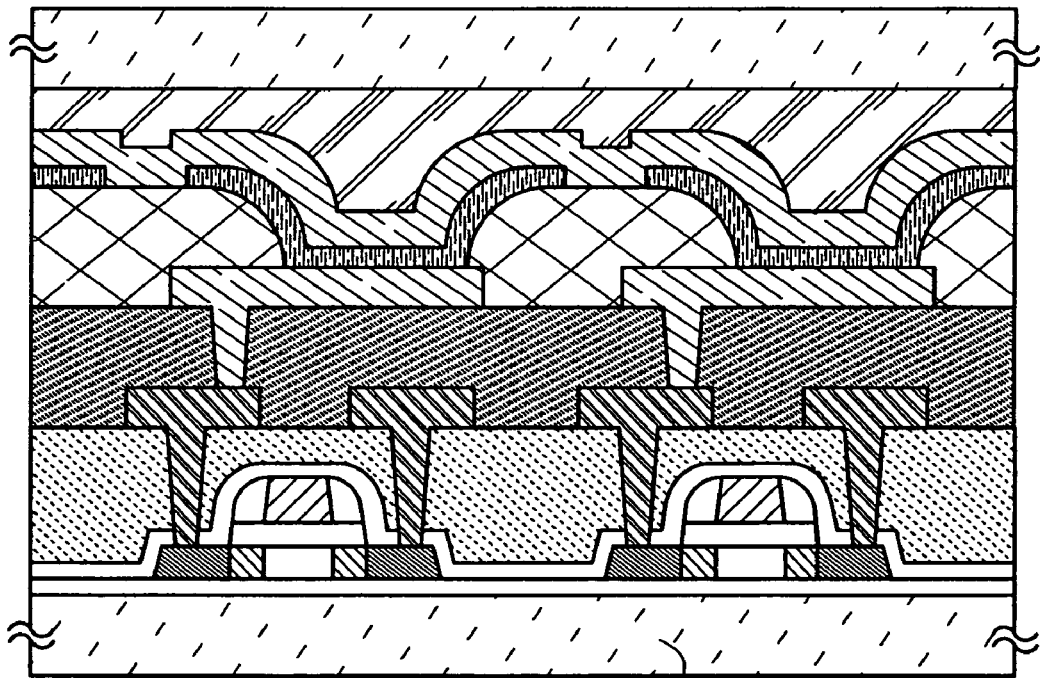

Next, as shown in FIG. 9B, a substrate 275 is attached to a surface of the insulating layer 251. The same as the substrate 266 can be arbitrarily used as the substrate 275. Here, the substrate 275 is attached to the insulating layer 251 by thermocompression of a film.

Note that after the element-formed layer including the memory element is transposed to the substrate 266, the element-formed layer may be peeled from the substrate 266 again. For example, the element-formed layer may be peeled from the substrate 250 which is a first substrate, transposed to the substrate 266 which is a second substrate, and transposed to the substrate 275 which is a third substrate, and then the substrate 266 which is the second substrate may be peeled from the element-formed layer.

As for the memory element 265a including the first conductive layer 256a, the organic compound layer 262a, and the second conductive layer 263, and the memory element 265b including the first conductive layer 256b, the organic compound layer 262b, and the second conductive layer 263, since adhesion inside each memory element is good, a defect such as film peeling does not occur at an interface between the layers by force applied at a step of transposition to the substrate 266 which is the second substrate after the formation over the substrate 250 which is the first substrate. Consequently, the memory element can be peeled off and transposed with a good form, to manufacture a semiconductor device.

The semiconductor device having a memory element manufactured in this embodiment mode has good adhesion inside the memory element; therefore, a peeling and transposing process can be performed with a good state. Therefore, transposition can be freely performed to any substrate, and therefore, selectivity for a substrate material is increased. Further, an inexpensive material can also be selected for the substrate, so that the semiconductor device can be manufactured at low cost as well as a having wide function in accordance with the intended purpose.

By the present invention, a semiconductor device having a memory element having good adhesion inside the memory element, so that a transposition step can be performed with a good state can be manufactured. Therefore, a semiconductor device having higher reliability can be manufactured with a high yield without complexing the apparatus or process.

Embodiment Mode 5

In this embodiment mode, an example of the semiconductor devices described in the above embodiment modes will be described using the drawings.

A semiconductor device described in this embodiment mode is capable of non-contact reading and writing of data. Data transmission method is broadly classified into three methods of an electromagnetic coupling method in which communication is performed by mutual induction with a pair of coils disposed opposite to each other, an electromagnetic induction method in which communication is performed by an inductive electromagnetic field, and an electric wave method in which communication is performed by using electric waves; any of the methods may be employed. An antenna that is used for transmitting data can be provided in two ways. One way is to provide an antenna over a substrate provided with a plurality of elements and memory elements, and the other way is to provide a terminal portion for a substrate provided with a plurality of elements and memory elements, and connect an antenna provided over another substrate to the terminal portion.

First, an example of a structure of the semiconductor device in the case where an antenna is provided over a substrate provided with a plurality of elements and memory elements will be described using FIG. 10.

Figure 10:
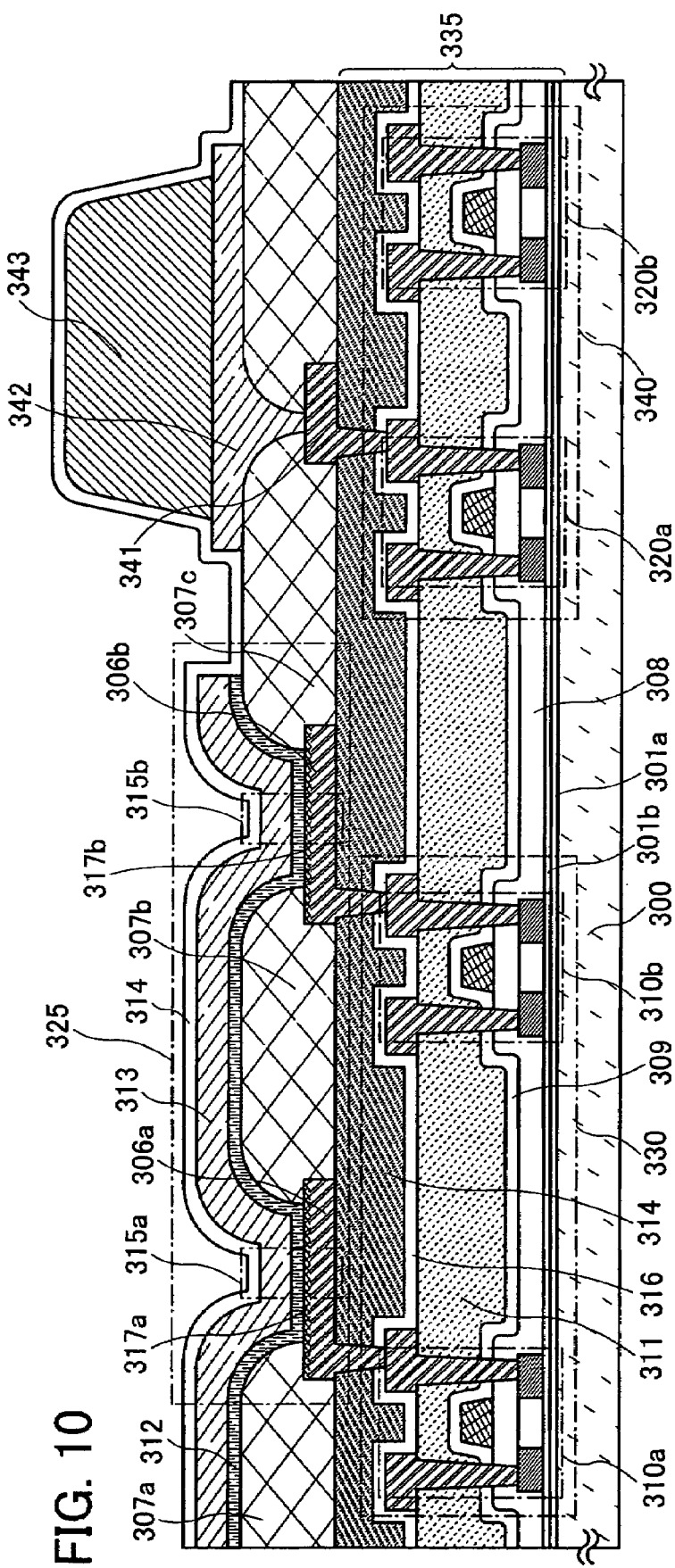
FIG. 10 shows a semiconductor device of the invention.

FIG. 10 shows the semiconductor device of active matrix type. An element-formed layer 335 which includes a transistor portion 330 including transistors 310a and 310b, a transistor portion 340 including transistors 320a and 320b, and insulating layers 301a, 301b, 308, 311, 316, and 314 is provided over a substrate 300, and a memory element portion 325 and a conductive layer 343 functioning as an antenna are provided above the element-formed layer 335.

Although the case where the memory element portion 325 or the conductive layer 343 functioning as an antenna is provided above the element-formed layer 335 is shown here, the structure is not limited thereto. The memory element portion 325 or the conductive layer 343 functioning as an antenna may also be provided below the element-formed layer 335 or in the same layer as the element-formed layer 335.

The memory element portion 325 is constituted from memory elements 315a and 315b; the memory element 315a is structured by stacking a partition (an insulating layer) 307a, a partition (an insulating layer) 307b, an organic compound layer 312, and a second conductive layer 313 over a first conductive layer 306a, and the memory element 315b is structured by stacking the partition (insulating layer) 307b, a partition (an insulating layer) 307c, the organic compound layer 312, and the second conductive layer 313 over a first conductive layer 306b. The insulating layer 314 which functions as a protection film is formed covering the second conductive layer 313. The first conductive layers 306a and 306b for structuring the memory elements 315a and 315b are connected to source electrode layers or drain electrode layers of the transistors 310a and 310b respectively. That is, each memory element is connected to one transistor. In addition, the organic compound layer 312 which is formed over an entire surface so as to cover the first conductive layers 306a and 306b, and the partitions (insulating layers) 307a, 307b, and 307c here may be formed selectively for each memory cell as well. Note that the memory elements 315a and 315b can be formed using any of the materials and manufacturing methods described in the above embodiment modes.

Treatment for reducing the interface tension is performed to respective regions of the first conductive layer 306a and the first conductive layer 306b where the organic compound layer 312 is stacked, thereby forming processing regions 317a and 317b.

As the treatment for reducing the interface tension, the following is performed: the conductive layer is exposed to an oxygen atmosphere; a surface of the conductive layer is oxidized by ozone ($O_3$) which is generated by irradiation with ultraviolet radiation in an oxygen atmosphere; or the like. Alternatively, oxygen plasma may be contacted; the conductive layer may be oxidized by the organic compound material contained in the organic compound, at the interface between the layers; or the like. Further, the conductive layer may also be formed in an oxygen atmosphere. Further, in addition to the oxidation treatment, nitriding treatment may also be performed; for example, nitriding treatment may be performed after oxidation treatment is performed.

By forming the processing regions 317a and 317b for reducing the interface tension at the interface (surface) which is in contact with the organic compound layer 312, of the first conductive layer 306a and at the interface (surface) which is in contact with the organic compound layer 312, of the first conductive layer 306b respectively, adhesion between the first conductive layer 306a and the organic compound layer 312 and between the first conductive layer 306b and the organic compound layer 312 can be improved.

As a metal material used for the second conductive layer 313, one kind or plural kinds of the following are used: indium (In), tin (Sn), lead (Pb), bismuth (Bi), calcium (Ca), antimony (Sb), and zinc (Zn). Further, one kind or plural kinds of the following are used as well: magnesium (Mg), manganese (Mn), cadmium (Cd), thallium (Tl), tellurium (Te), and barium (Ba). A plurality of the above-described metal materials may be contained, or an alloy containing one kind or plural kinds of the above-described materials may be used. In particular, a metal having relatively small solubility parameter, that is indium (In), tin (Sn), lead (Pb), bismuth (Bi), calcium (Ca), manganese (Mn), or zinc (Zn), or an alloy containing the above metal is suitable as an electrode material. As the alloy capable of being used, there is an indium alloy such as an indium-tin alloy (InSn), a magnesium-indium alloy (InMg), an indium-phosphorus alloy (InP), an indium-arsenic alloy (InAs), or indium-chromium alloy (InCr).

By using the material having small solubility parameter for the second conductive layer 313, adhesion between the second conductive layer 313 and the organic compound layer 312 can be improved. Therefore, a defect such as film peeling does not occur at an interface between the layers by force applied at a step of transposition to a second substrate after the formation over a first substrate. Even if a glass substrate which is capable of resisting the manufacturing condition such as temperature is used in an element-manufacturing process, a flexible substrate such as a film can be used as the substrate 300 by transposing to the second substrate later. Consequently, the memory element can be peeled off and transposed with a good form, to manufacture a semiconductor device.

Further, as described in the above embodiment modes, in the memory element 315a, an element having a rectifying property may be provided between the first conductive layer 306a and the organic compound layer 312, or between the organic compound layer 312 and the second conductive layer 313. As the element having a rectifying property also, the same as the above-described one can be used. The same can be applied to the memory element 315b.

Even in the case where the element having a rectifying property is provided, required is a structure in which at least one of the first and second conductive layers which are in contact with the organic compound layer is either a conductive layer formed by using the metal material having small solubility parameter as shown in FIG. 1A, or a conductive layer the surface of which is subjected to oxidation treatment or the like in order to reduce the interface tension as shown in FIG. 1B.

Here, the conductive layer 343 functioning as an antenna is provided over a conductive layer 342 formed of the same layer as the second conductive layer 313. Note that the conductive layer functioning as an antenna may also be formed of the same layer as the second conductive layer 313.

As a material of the conductive layer 343 functioning as an antenna, one kind of elements of gold (Au), platinum (Pt), nickel (Ni), tungsten (W), molybdenum (Mo), cobalt (Co), copper (Cu), aluminum (Al), manganese (Mn), and titanium (Ti), an alloy containing a plurality of the elements, or the like can be used. In addition, as a forming method of the conductive layer 343 functioning as an antenna, vapor deposition, sputtering, CVD, any printing method such as screen printing or gravure printing, a droplet discharge method, or the like can be used.

Any of a p-channel TFT, an n-channel TFT, or a CMOS combining them can be provided as each of the transistors 310a, 310b, 320a, and 320b included in the element-formed layer 335. Further, the semiconductor layer in each transistor can have any structure. For example, an impurity region (including a source region, a drain region, and an LDD region) may be formed; and either a p-channel type or an n-channel type may be employed. In addition, an insulating layer (a sidewall) may be formed in contact with a side surface of a gate electrode; and a silicide layer may be formed in one or both of a source/drain region and the gate electrode. As a material of the silicide layer, nickel, tungsten, molybdenum, cobalt, platinum, or the like can be used.

Further, an organic transistor in which a semiconductor layer is formed of an organic compound may also be provided as each of the transistors 310a, 310b, 320a, and 320b included in the element-formed layer 335. In this case, the element-formed layer 335 including the organic transistors can be formed by printing, a droplet discharge method, or the like. By forming the element-formed layer 335 by using printing, a droplet discharge method, or the like, a semiconductor device can be manufactured at lower cost.

Further, the element-formed layer 335, the memory elements 315a and 315b, and the conductive layer 343 functioning as an antenna can be formed by deposition, sputtering, CVD, printing, a droplet discharge method, or the like as described above. In addition, different methods may be used depending on portions. For example, the transistor which requires high-speed operation is provided by crystallizing, using heat treatment, a semiconductor layer of Si or the like which is formed over a substrate, and then the transistor which functions as a switching element is provided using printing or a droplet discharge method, as an organic transistor above the element-formed layer.

In addition, a sensor connecting to the transistor may be provided. As the sensor, an element which detects properties such as temperature, humidity, illuminance, gas, gravity, pressure, sound (vibration), or acceleration by a physical or chemical means can be used. The sensor is typically formed of a semiconductor element such as a resistor, a capacitive coupling element, an inductive coupling element, a photovoltaic element, a photoelectric conversion element, a thermoelectromotive force element, a transistor, a thermistor, or a diode.

Next, an example of a structure of the semiconductor device in the case where a terminal portion is provided for a substrate provided with a plurality of elements and memory elements, and an antenna provided over another substrate is connected to the terminal portion will be described using FIG. 11.

Figure 11:
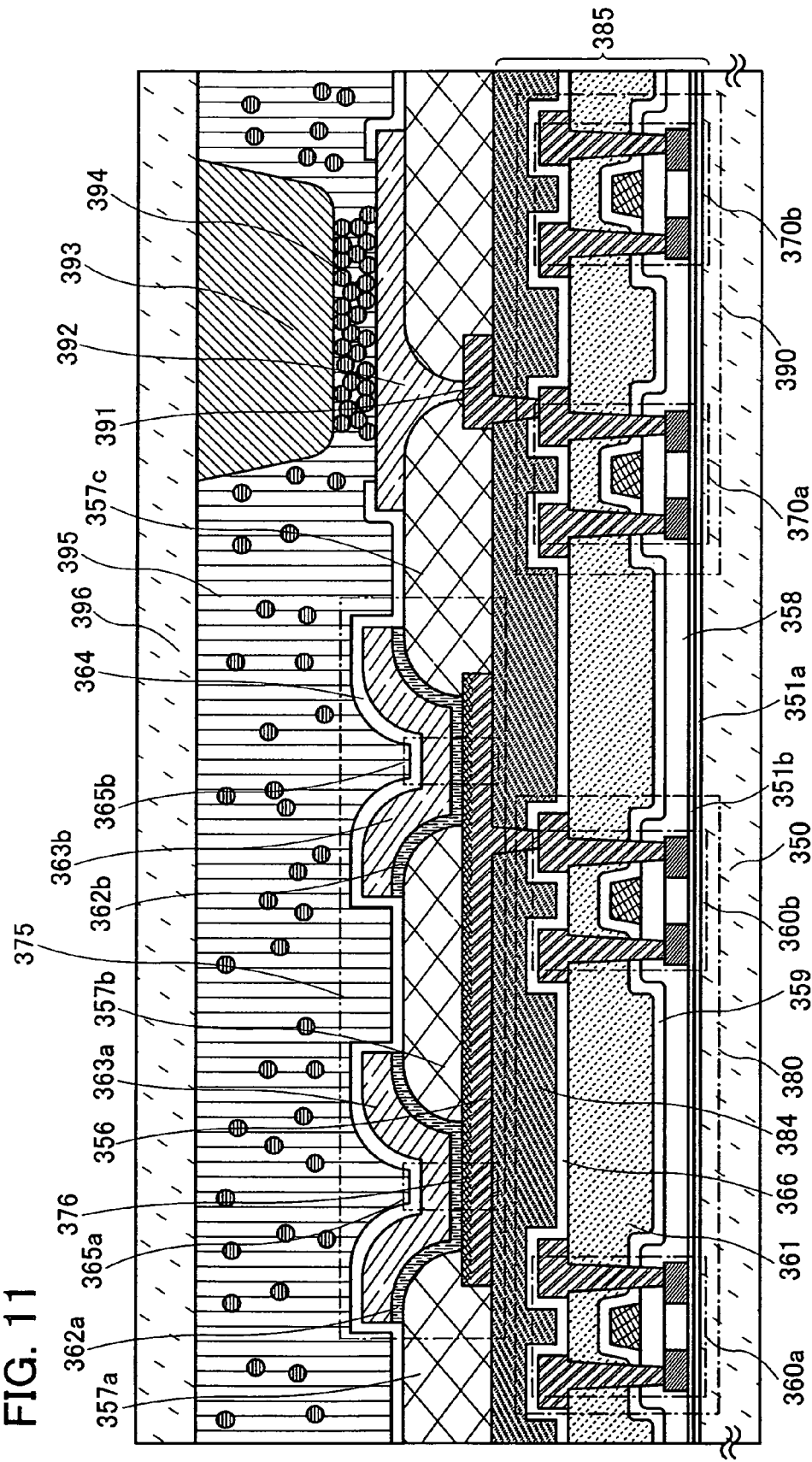
FIG. 11 shows a semiconductor device of the invention.

FIG. 11 shows the semiconductor device of passive matrix type. An element-formed layer 385 is provided over a substrate 350, a memory element portion 375 is provided above the element-formed layer 385, and a conductive layer 393 functioning as an antenna, which is formed over a substrate 396, is provided so as to connect to the element-formed layer 335. Note that although the case where the memory element portion 375 or the conductive layer 393 functioning as an antenna is provided above the element-formed layer 385 is shown here, the structure is not limited thereto. The memory element portion 375 may also be provided below the element-formed layer 385 or in the same layer as the element-formed layer 385, or the conductive layer 393 functioning as an antenna may also be provided below the element-formed layer 385.

The memory element portion 375 is constituted from memory elements 365a and 365b; the memory element 365a is structured by stacking a partition (an insulating layer) 357a, a partition (an insulating layer) 357b, an organic compound layer 362a, and a second conductive layer 363a over a first conductive layer 356, and the memory element 365b is structured by stacking the partition (insulating layer) 357b, a partition (an insulating layer) 357c, an organic compound layer 362b, and a second conductive layer 363b over the first conductive layer 356. An insulating layer 364 which functions as a protection layer is formed covering the second conductive layers 363a and 363b. The first conductive layer 356 for structuring the memory elements 365a and 365b is connected to either a source electrode layer or a drain electrode layer of one transistor 360b. That is, the memory elements are connected to one transistor. In addition, although the organic compound layer 362a and the second conductive layer 363a are separated from the organic compound layer 362b and the second conductive layer 363b by each memory cell by providing the partitions (insulating layers) 357a, 357b, and 357c, they may also be formed over an entire surface if there is no fear of influence of electric field in a lateral direction between adjacent memory cells. Note that the memory elements 365a and 365b can be formed using any of the materials and manufacturing methods described in the above embodiment modes.

Treatment for reducing the interface tension is performed to regions of the first conductive layer 356 where the organic compound layer 362a is stacked and where the organic compound layer 362b is stacked, thereby forming a processing region 376.

By forming the processing region 376 for reducing the interface tension at an interface (a surface) which is in contact with the organic compound layer 362a, of the first conductive layer 356 and at an interface (a surface) which is in contact with the organic compound layer 362b, of the first conductive layer 356, adhesion between the first conductive layer 356 and the organic compound layer 362a and between the first conductive layer 356 and the organic compound layer 362b can be improved.

As a metal material used for the second conductive layers 363a and 363b, one kind or plural kinds of the following are used: indium (In), tin (Sn), lead (Pb), bismuth (Bi), calcium (Ca), antimony (Sb), and zinc (Zn). Further, one kind or plural kinds of the following are used as well: magnesium (Mg), manganese (Mn), cadmium (Cd), thallium (Tl), tellurium (Te), and barium (Ba). A plurality of the above-described metal materials may be contained, or an alloy containing one kind or plural kinds of the above-described materials may be used. In particular, a metal having relatively small solubility parameter, that is indium (In), tin (Sn), lead (Pb), bismuth (Bi), calcium (Ca), manganese (Mn), or zinc (Zn), or an alloy containing the above metal is suitable as an electrode material. As the alloy capable of being used, there is an indium alloy such as an indium-tin alloy (InSn), a magnesium-indium alloy (InMg), an indium-phosphorus alloy (InP), an indium-arsenic alloy (InAs), or indium-chromium alloy (InCr).

By using the material having small solubility parameter for the second conductive layers 363a and 363b, adhesion between the second conductive layer 363a and the organic compound layer 362a and between the second conductive layer 363b and the organic compound layer 362b can be improved. Therefore, a defect such as film peeling does not occur at an interface between the layers by force applied at a step of transposition to a second substrate after the formation over a first substrate. Even if a glass substrate which is capable of resisting the manufacturing condition such as temperature is used in an element-manufacturing process, a flexible substrate such as a film can be used as the substrate 350 by transposing to the second substrate later. Consequently, the memory element can be peeled off and transposed with a good form, to manufacture a semiconductor device.

Of course, a conductive layer which is formed similarly to each of those of FIGS. 1A, 1B, 16A, and 16B may also be used as the first conductive layer and the second conductive layer in the semiconductor devices of FIGS. 10 and 11. A conductive layer containing the metal material having small solubility parameter is used as at least one of the first conductive layer and the second conductive layer, or alternatively, oxidation treatment or the like for reducing the interface tension is performed to at least one of interfaces between the first conductive layer and the organic compound layer and between the second conductive layer and the organic compound layer. A structure as shown in FIG. 16A in which the metal material having small solubility parameter is used for forming the first conductive layer and the second conductive layer may be employed; or a structure as shown in FIG. 16B in which a region with small surface tension is formed at both interfaces between the first conductive layer and the organic compound layer and between the second conductive layer and the organic compound layer may be employed.

Further, in this embodiment mode (the semiconductor devices shown in FIGS. 10 and 11) also, as shown in FIGS. 19A to 19C in Embodiment Mode 1, an insulating layer may be provided between the organic compound layer and the first conductive layer; between the organic compound layer and the second conductive layer; or between the first conductive layer and the organic compound layer and between the second conductive layer and the organic compound layer. By providing the insulating layer, characteristics such as a writing voltage of a memory element are stabilized without fluctuation, and normal writing can be performed in each element. Further, since the carrier injection property is improved by the tunnel current, thickness of the organic compound layer can be increased; therefore, a defect of short-circuit of a memory element in the initial state before electrical conduction is provided can be prevented.

The substrate provided with the element-formed layer 385 and the memory element portion 375 is attached to the substrate 396 provided with the conductive layer 393 functioning as an antenna, with an adhesive resin 395. The element-formed layer 385 and the conductive layer 393 are electrically connected via a conductive fine particle 394 contained in the resin 395. Alternatively, the substrate provided with the element-formed layer 385 and the memory element portion 375 may be attached to the substrate 396 provided with the conductive layer 393 functioning as an antenna, by a conductive adhesive such as silver paste, copper paste, or carbon paste, or by solder bonding.

A semiconductor device provided with a memory element and an antenna can be thus formed. Further, in this embodiment mode, an element-formed layer may be provided by forming a thin film transistor over a substrate, or an element-formed layer may be provided by forming a filed-effect transistor over a substrate which is a semiconductor substrate of Si or the like. Alternatively, an SOI substrate may be used as a substrate and an element-formed layer may be provided over the substrate. In this case, the SOI substrate may be formed by attaching wafers or by using a method called SIMOX in which an insulating layer is formed inside a Si substrate by implanting oxygen ions into the Si substrate.

Further, the element-formed layer may also be provided over the substrate provided with the conductive layer functioning as an antenna. Further, a sensor connecting to the transistor may also be provided.

This embodiment mode can be implemented freely combining with the above embodiment modes. Further, the semiconductor device manufactured according to this embodiment mode can be provided over a flexible base to obtain flexibility, by peeling off from a substrate in a peeling process and attaching to a flexible substrate. The flexible base corresponds to a film formed of polypropylene, polyester, vinyl, polyvinyl fluoride, vinyl chloride, or the like; paper formed of a fibrous material; a stacked film of a base material film (e.g., polyester, polyamide, an inorganic evaporated film, or paper) and an adhesive synthetic resin film (e.g., an acrylic synthetic resin or an epoxy synthetic resin); or the like. The film is attached to an object to be processed by beat treatment and pressure treatment. When heat treatment and pressure treatment are performed, an adhesion layer provided in the outermost surface of the film or a layer provided in the outermost layer (not the adhesion layer) is melted by the heat treatment, and attached by pressure. The adhesion layer is not necessarily provided in the base. The adhesion layer corresponds to a layer containing an adhesive such as a thermosetting resin, an ultraviolet curing resin, an epoxy resin adhesive, or a resin additive.

By the invention, a semiconductor device including a memory element which has high adhesion inside the memory element so as to perform transposition with a good state can be manufactured. Therefore, a semiconductor device having higher reliability can be manufactured with a high yield without complexing the apparatus or process.

Embodiment Mode 6

Figure 14A:
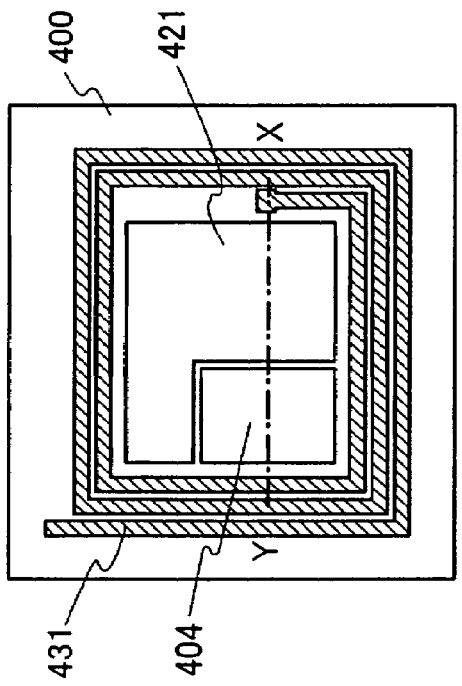
FIGS. 14A and 14B each show a semiconductor device of the invention.

In this embodiment mode, an example of the semiconductor devices including the memory element described in the above embodiment modes will be described using the drawings. FIG. 14A is a top view of a semiconductor device of this embodiment mode, and FIG. 14B is a cross-sectional view taken along a line X-Y in FIG. 14A.

As shown in FIG. 14A, a memory element portion 404 which is a semiconductor device including a memory element, a circuit portion 421, and an antenna 431 are formed over a substrate 400. A state shown in FIGS. 14A and 14B is in the middle of a manufacturing process, in which the memory element portion, the circuit portion, and the antenna have been formed over the substrate 400 capable of resisting the manufacturing condition. The material and manufacturing process can be selected similarly to Embodiment Mode 4 for manufacturing.

Over the substrate 400, a transistor 441 is provided in the memory element portion 404 while a transistor 442 is provided in the circuit portion 421, with a peeling layer 452 and an insulating layer 453 interposed therebetween. Insulating layers 461, 454, and 455 are formed over the transistors 441 and 442, and a memory element 443 structured by a first conductive layer 457d, an organic compound layer 458, and a second conductive layer 459 is formed over the insulating layer 455. The organic compound layer 458 is separated individually by an insulating layer 460b functioning as a partition. The first conductive layer 457d is connected to a wiring layer of the transistor 441, so that the memory element 443 is electrically connected to the transistor 441.

Figure 14B:
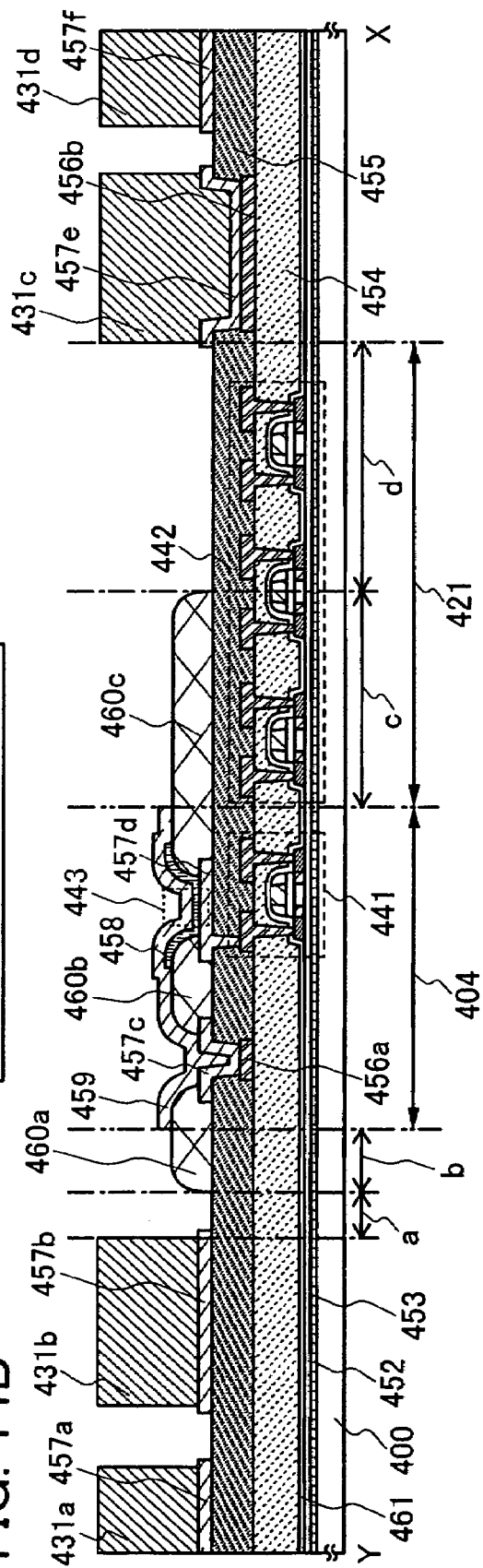
Figure 15A:
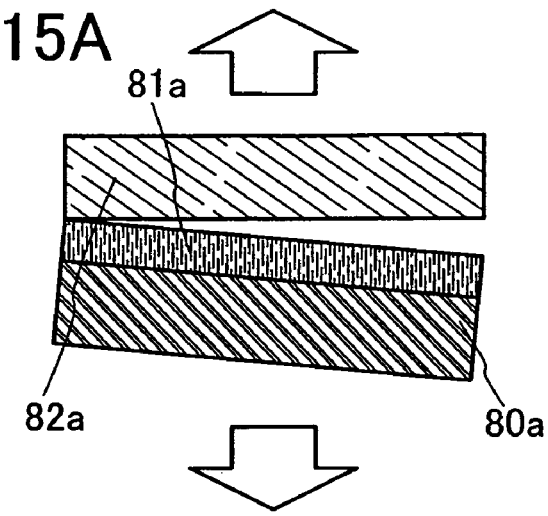
FIGS. 15A to 15C each show a semiconductor device used for an explanation of the disclosure of invention.
Figure 15B:
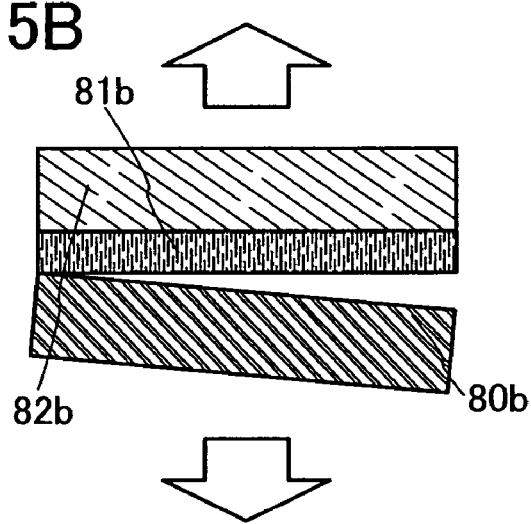
Figure 15C:
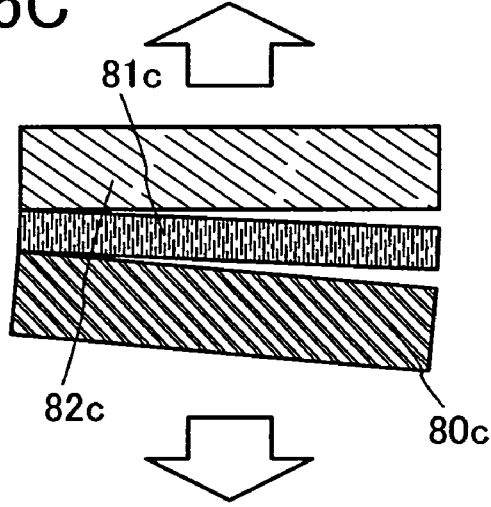

In the semiconductor device shown in FIG. 14B, the second conductive layer 459 is stacked on a wiring layer 456a and a conductive layer 457c so as to electrically connect to each other. Over the insulating layer 455, respective stacked-layers of a conductive layer 457a and an antenna 431a, a conductive layer 457b and an antenna 431b, a conductive layer 457e and an antenna 431c, and a conductive layer 457f and an antenna 431d are formed. The conductive layer 457e is formed in contact with a wiring layer 456b in an opening which is formed in the insulating layer 455 so as to reach the wiring layer 456b, which electrically connect the antenna to the memory element portion 404 and the circuit portion 421. The conductive layers 457a, 457b, 457e, and 457f under the antennas 431a, 431b, 431c, and 431d also improve adhesion between the insulating layer 455 and the antennas 431a, 431b, 431c, and 431d. In this embodiment mode, a polyimide film is used as the insulating layer 455, a titanium film is used as each of the conductive layers 457a, 457b, 457e, and 457f, and an aluminum film is used as each of the antennas 431a, 431b, 431c, and 431d.

Openings (also called contact holes) are formed in the insulating layer 455 such that the first conductive layer 457d and the transistor 441, the conductive layer 457c and the wiring layer 456a, and the conductive layer 457e and the wiring layer 456b are connected to each other. Since resistance is decreased as the contact area between conductive layers are increased by enlarging the opening, the openings are set in this embodiment mode such that the opening for connecting the first conductive layer 457d to the transistor 441 is the smallest, the opening for connecting the conductive layer 457c to the wiring layer 456a is followed, and the opening for connecting the conductive layer 457e to the wiring layer 456b is the largest. In this embodiment mode, the opening for connecting the first conductive layer 457d to the transistor 441 is 5 μm×5 μm, the opening for connecting the conductive layer 457c to the wiring layer 456a is 50 μm×50 μm, and the opening for connecting the conductive layer 457e to the wiring layer 456b is 500 μm×500 μm.

In this embodiment mode, distance a from the insulating layer 460a to the antenna 431b is 500 μm or longer, distance b from an end portion of the second conductive layer 459 to an end portion of the insulating layer 460a is 250 Fm or longer, distance c from an end portion of the second conductive layer 459 to an end portion of the insulating layer 460c is 500 μm or longer, and distance d from the end portion of the insulating layer 460c to the antenna 431c is 250 pun or longer. The insulating layer 460c is formed partially in the circuit portion 421, and thus, a part of the transistor 442 is covered with the insulating layer 460c and the other part thereof is not covered with the insulating layer 460c.

Figure 17A:
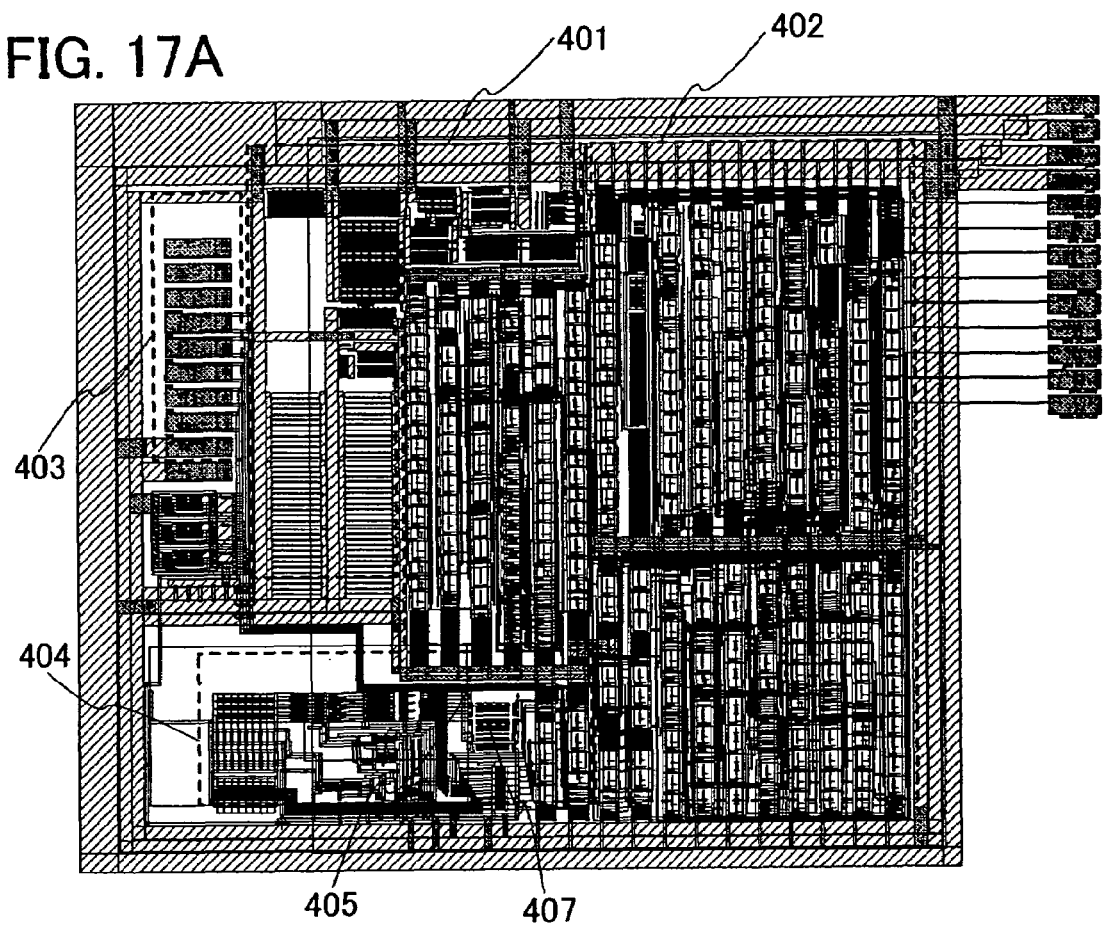
FIGS. 17A and 17B each show a semiconductor device of the invention.
Figure 17B:
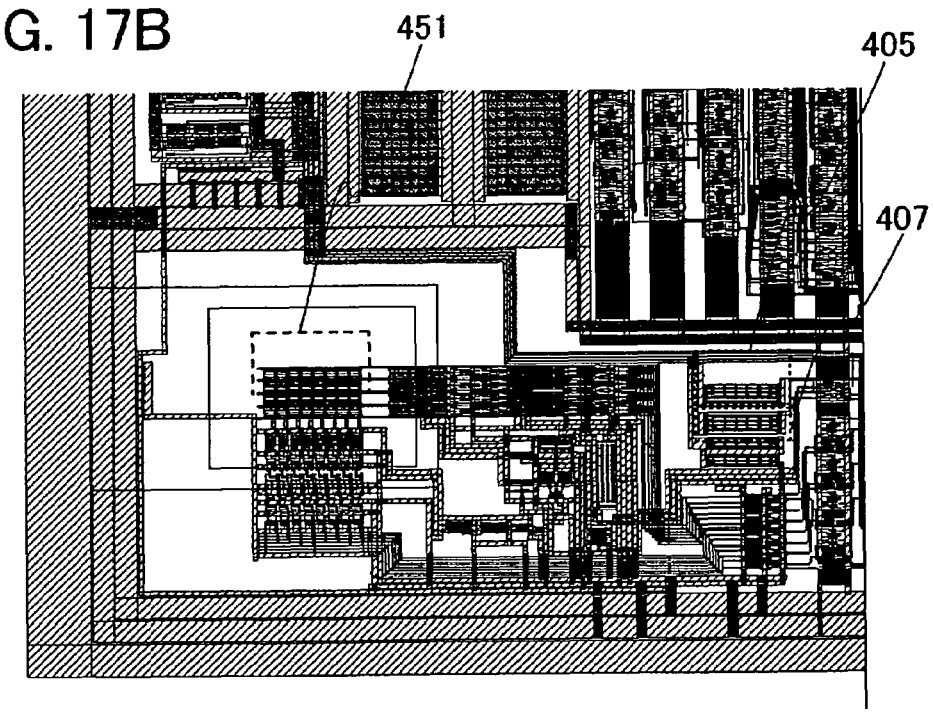

Top views of the semiconductor device of this embodiment mode are FIGS. 17A and 17B. An enlarged view of the memory element portion 404 in FIG. 17A is FIG. 17B, and as shown in FIG. 17B, a memory element 451 is formed.

An RF input portion 401 includes a high-potential power supply (VDD) terminal, a low-potential power supply terminal, and a clock signal (CLK) terminal. In this embodiment mode, a ground potential (GND) is used as a low-potential power supply. The RF input portion 401 generates VDD by rectifying an electric wave received from an antenna (not shown) while generates CLK by frequency-dividing the electric wave received. A logic circuit portion 402 is connected to a high-potential power supply and the ground potential, into which the clock signal is inputted.

A plurality of pads are provided in an external input portion 403; for example, a signal output (DATAOUT) pad, a writing-signal input (WEB) pad, a reading-signal input (REB) pad, a clock signal (CLK) pad, a ground potential (GND) pad, a high-potential power supply (VDD) pad, and a writing power supply (VDDH) pad are included.

In the memory element portion 404, a VDDH terminal into which a signal through the VDDH pad is inputted, a VDD terminal into which a signal through the VDD pad is inputted, a GND terminal into which a signal through the GND pad is inputted, a CLK terminal into which a signal through the CLK pad is inputted, an REB terminal into which a signal through the REB pad is inputted, and a WEB terminal into which a signal through the WEB pad is inputted are provided. In addition, the high-potential power supply (VDD) terminal of the RF input portion 401 and the VDDH terminal of the memory element portion 404 are connected to each other via a diode 406. By thus connecting via the diode, short circuit between the power supply connected to the tip of the high-potential power supply (VDD) terminal and the VDDH terminal can be prevented in writing data into the memory element portion. In the semiconductor device shown in FIGS. 17A and 17B, a protection circuit is preferably provided between the CLK pad and the CLK terminal, between the REB pad and the REB terminal, or between the WEB pad and the WEB terminal.

A regulating circuit portion 405 includes a plurality of resistors. The CLK terminal in the memory element portion 404 is connected to the logic circuit portion 402 via any one of the resistors. In addition, the REB terminal in the memory element portion 404 is connected to the logic circuit portion 402 via another one of the resistors. The regulating circuit portion 405 regulates so as not to input an unnecessary control signal from the logic circuit portion 402 to the memory element portion 404 in writing data into or reading data from the memory element portion 404 by using an external signal. Similarly, a resistor 407 also regulates so as not to input a signal from the logic circuit portion 402 to the memory element portion 404 in writing data into the memory element portion 404. That is, the resistor 407 functions as a regulating circuit.

By using such a semiconductor device, a power supply voltage or a signal is inputted directly into the memory element portion 404 from the external input portion 403, so that data (corresponding to information) can be written into or read from the memory element portion 404.

Further, in the case where a signal is not directly inputted into the external input portion 403, a power supply and a signal can be generated internally through the RF input portion from an electric wave received by the antenna portion, so that data can be read from the memory element portion 404.

In the circuit constitution of the invention, a signal from the external input portion 403 is blocked by the diode 406 in writing data into the memory element portion 404, whereas VDDH of the memory element portion 404 is fixed at VDD of the RF input portion 401 for stabilization in reading data from the memory element portion 404 by a signal from the antenna.

Figure 18A:
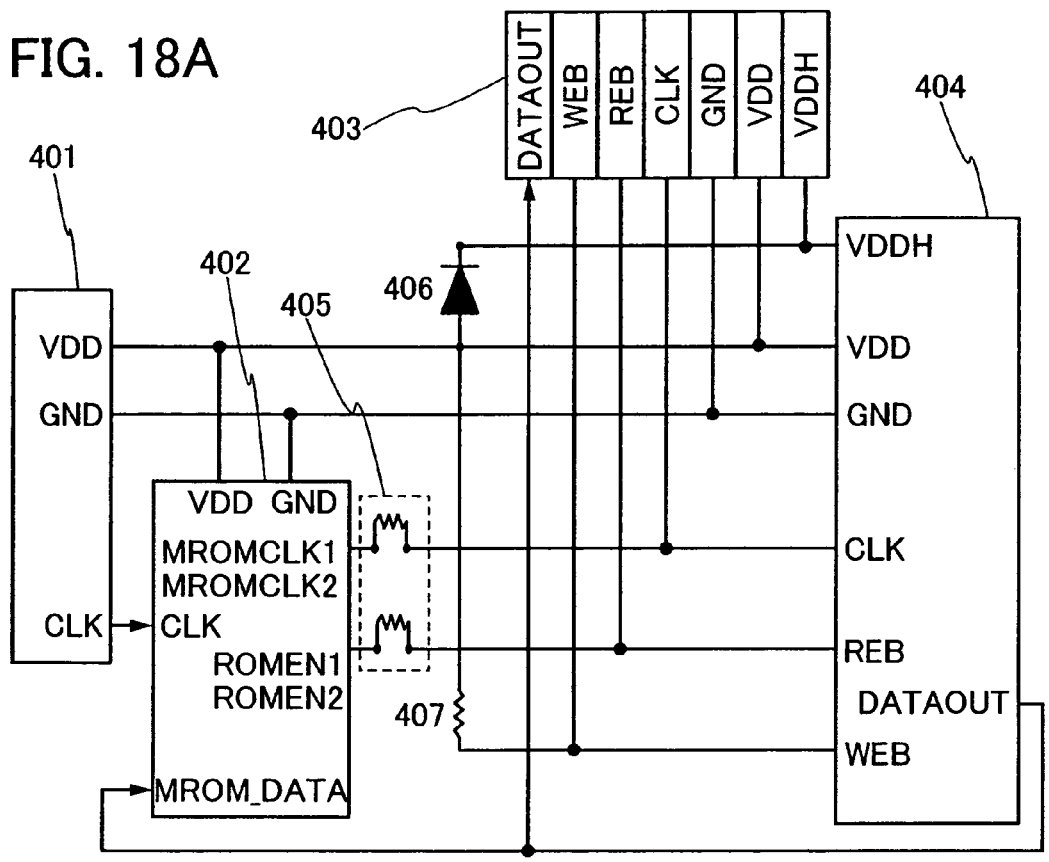
FIGS. 18A and 18B each show a semiconductor device of the invention.
Figure 18B:
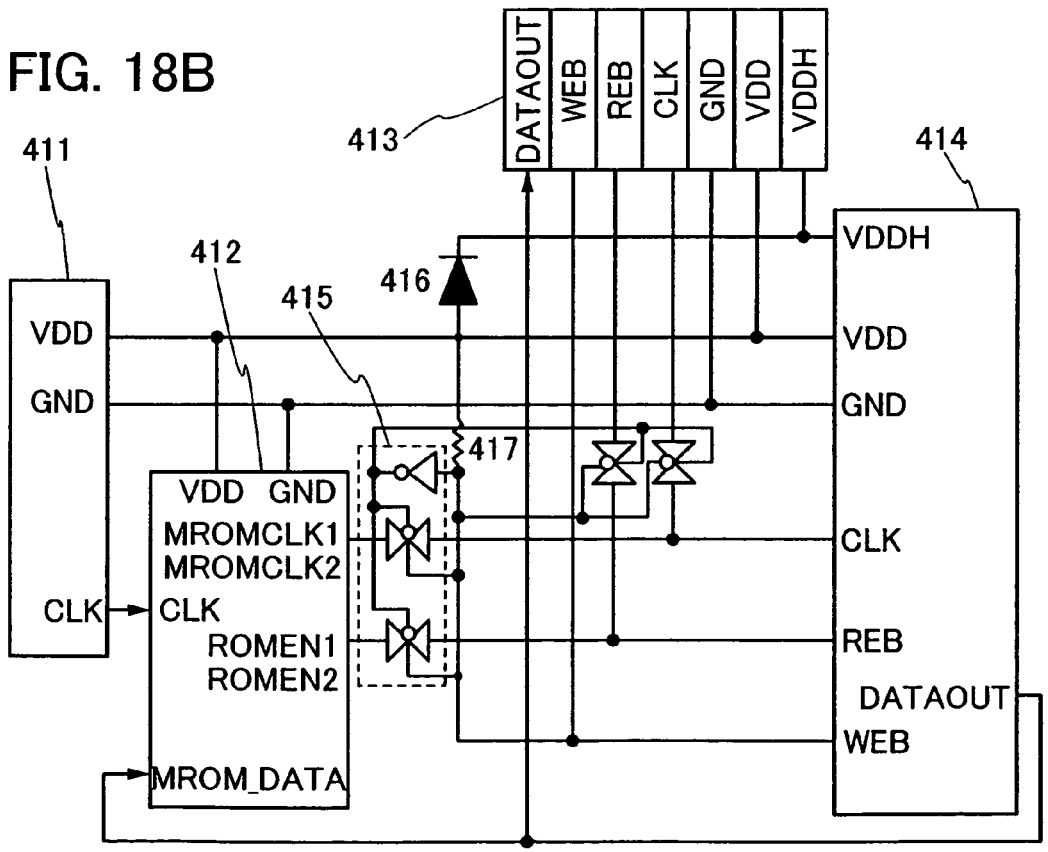

Next, constitution of a semiconductor device which is different from FIG. 18A in the constitution of the regulating circuit portion 405 is shown in FIG. 18B. The semiconductor device shown in FIG. 18B includes an RF input portion 411, a logic circuit portion 412, an external input portion 413, a memory element portion 414, a regulating circuit portion 415, a diode 416, and a resistor 417. The regulating circuit portion 415 in the semiconductor device of FIG. 18B is constituted from switches. As the switch, an inverter, an analog switch, or the like can be used. In this embodiment mode, an inverter and an analog switch are used; an input terminal of the inverter and the analog switch are connected between the resistor 417 and the WEB terminal, and an output terminal of the inverter and the analog switch are connected to each other. The resistor 417 is disposed such that VDD is inputted into WEB when there is no external input into WEB whereas when there is an external input, the input has priority. The regulating circuit portion 415 supplies a signal stably to the memory element portion 414 in the following manner: an unnecessary signal from the logic circuit portion 412 is blocked in the case where a Low signal is inputted into WEB by an external input, namely in the case of an external input, whereas signals of REB and CLK by an external input are blocked in the case where a High signal is inputted into WEB or in the case where there is no external input.

Such a semiconductor device can also be operated similarly to the semiconductor device which is described based on a block diagram of FIG. 18A. However, since the regulating circuit portion 415 including the inverter and the analog switch can be dedicated to generate a power supply, such a problem that the potential of VDDH is reduced by the threshold voltage of the diode 416 does not occur.

Figure 22:
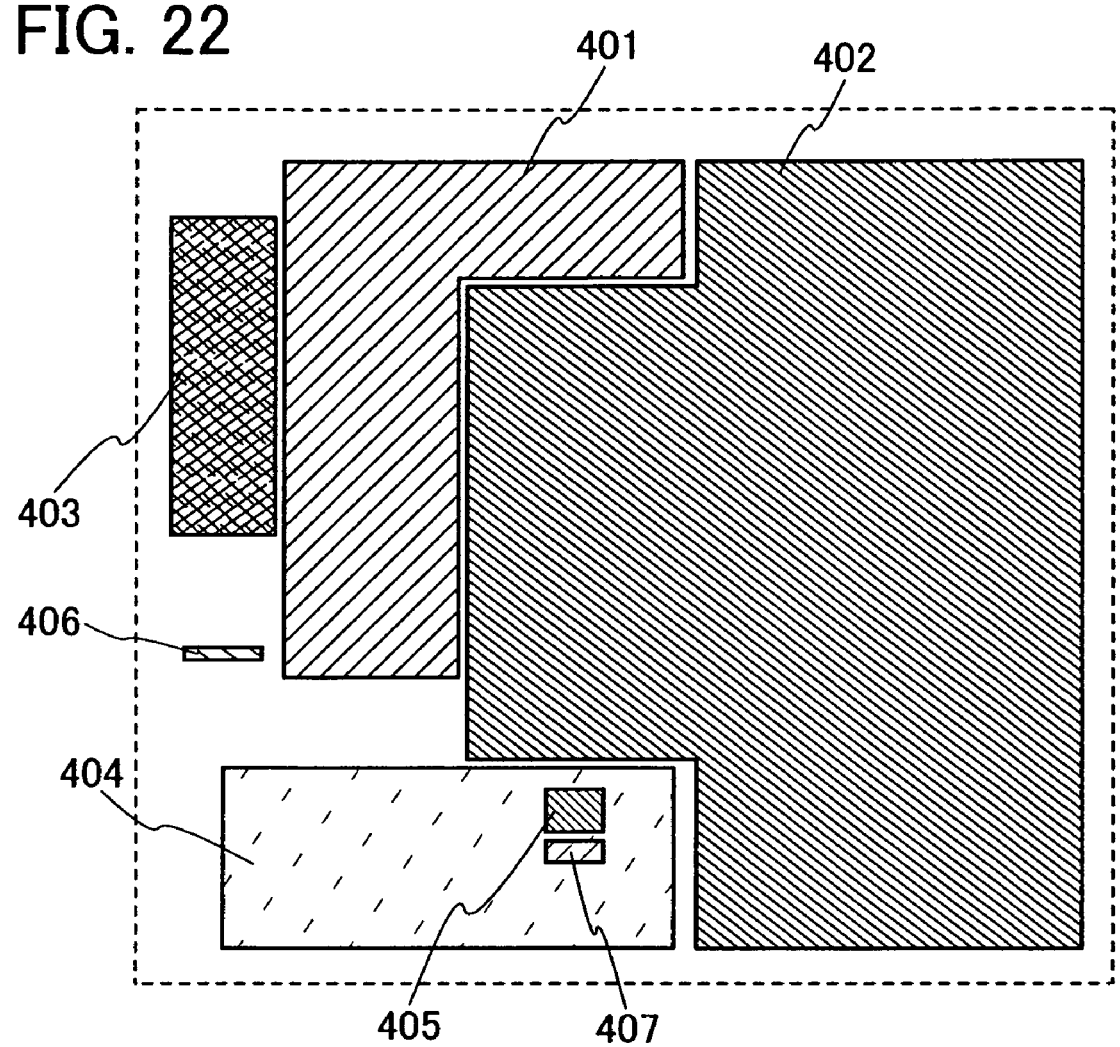
FIG. 22 shows a semiconductor device of the invention.

FIG. 22 is a schematic view corresponding to FIG. 18A of the circuits of the semiconductor device shown in FIGS. 17A and 17B. In the semiconductor device, the logic circuit portion 402 which occupies the largest area is provided, and the RF input portion 401 and the memory element portion 404 are provided adjacently to the logic circuit portion 402. The regulating circuit portion 415 and the resistor 407 are provided adjacently to each other in one region of the memory element portion 404. The external input portion 403 is provided adjacently to the RF input portion 401. The external input portion 403 which includes the pads may preferably be provided in a region which is in contact with one side of the semiconductor device. This is because attachment in pad connection can be performed using one side of the semiconductor device as a criterion. These circuits and the like can be manufactured by the manufacturing method described in the above embodiment modes. FIGS. 18A and 18B are block diagrams of the circuits of the semiconductor device shown in FIGS. 17A and 17B. The block diagram of the semiconductor device in FIG. 18A includes the RF input portion 401, the logic circuit portion 402, the external input portion 403, the memory element portion 404, the regulating circuit portion 405, the diode 406, and the resistor 407. The block diagram in FIG. 18B includes the RF input portion 411, the logic circuit portion 412, the external input portion 413, the memory element portion 414, the regulating circuit portion 415, the diode 416, and the resistor 417.

A voltage and a signal inputted from an external input terminal are inputted into the memory element portion 404 to write data (information) into the memory element portion 404. The written data is read from the memory element portion 404 again in the following manner: an AC signal is received by an antenna, and the RF input portion 401 inputs a signal and a voltage into the logic circuit portion 402; then the signal becomes a control signal through the logic circuit portion 402, and the control signal is inputted into the memory element portion 404.

The semiconductor devices shown in FIGS. 18A and 18B are different from each other in the constitution of the regulating circuit portion; the regulating circuit portion 405 is constituted from a resistor whereas the regulating circuit portion 415 is constituted from a switch. Each of the resistors 407 and 417 is a pull-up circuit, which functions as a regulating circuit portion. The regulating circuit portion 405 regulates so as not to input an unnecessary control signal from the logic circuit portion 402 to the memory element portion 404 in writing data into the memory element portion 404. Similarly, the resistor 407 also regulates so as not to input a signal from the logic circuit portion 402 to the memory element portion 404 in writing data into the memory element portion 404. A signal from the external input portion 403 is blocked by the diode 406 in writing data into the memory element portion 404, whereas VDDH of the memory element portion 404 is fixed at VDD applied from the RF input portion 401, for stabilization in reading data from the memory element portion 404. The description which is made based on the block diagram of FIG. 18A can also be applied to the case of FIG. 18B.

Further, the antenna may be provided either so as to overlap the memory element portion or so as to surround the memory element portion without overlapping the memory element portion. In the case of overlapping the memory element portion, the antenna may overlap the memory element portion either entirely or partially. A structure where an antenna portion and a memory element portion are overlapped each other improves reliability since defective operation of a semiconductor device caused by noise or the like superposed on a signal when communication is performed by the antenna, or fluctuation or the like of electromotive force generated by electromagnetic induction can be reduced. Furthermore, the semiconductor device can also be downsized.

As a signal transmission system in the aforementioned semiconductor device that is capable of transmitting and receiving data in a non-contact manner, an electromagnetic coupling system, an electromagnetic induction system, a microwave system, or the like can be used. The transmission system can be appropriately selected considering an intended use, and an optimum antenna may be provided in accordance with the transmission system.

Figure 21A:
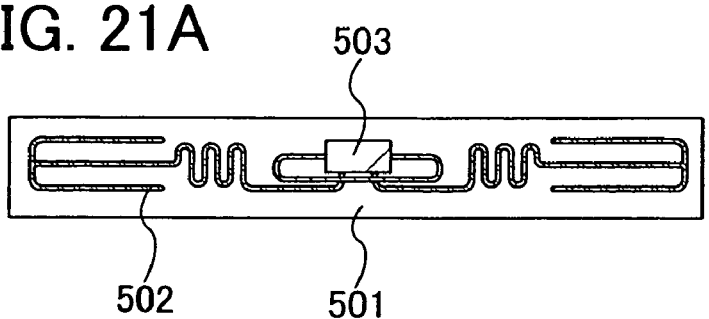
FIGS. 21A to 21D each show a semiconductor device of the invention.
Figure 21B:
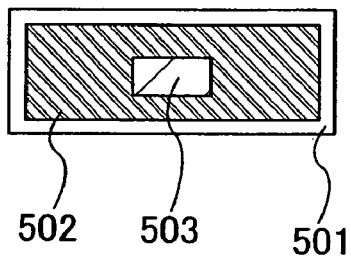
Figure 21C:
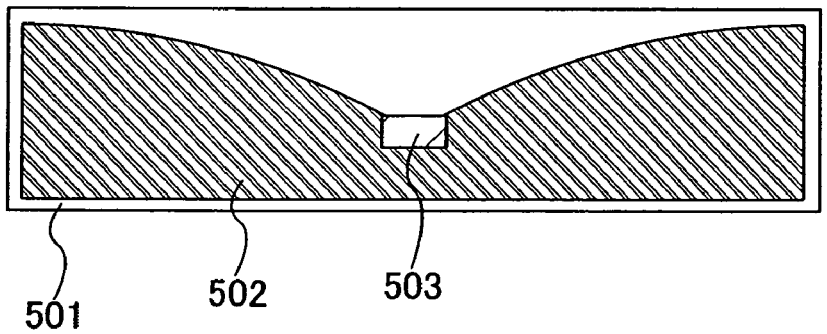

For example, if an electromagnetic coupling system or an electromagnetic induction system (e.g., a 13.56 MHz band) is used as the signal transmission system in the semiconductor device, electromagnetic induction caused by change in magnetic field density is utilized; therefore, a conductive layer functioning as an antenna is formed into an annular shape (e.g., a loop antenna) or a spiral shape (e.g., a spiral antenna). FIGS. 21A to 21C show examples of a conductive layer 502 functioning as an antenna and a chip semiconductor device 503 including an integrated circuit which are formed over a substrate 501.

Figure 21D:
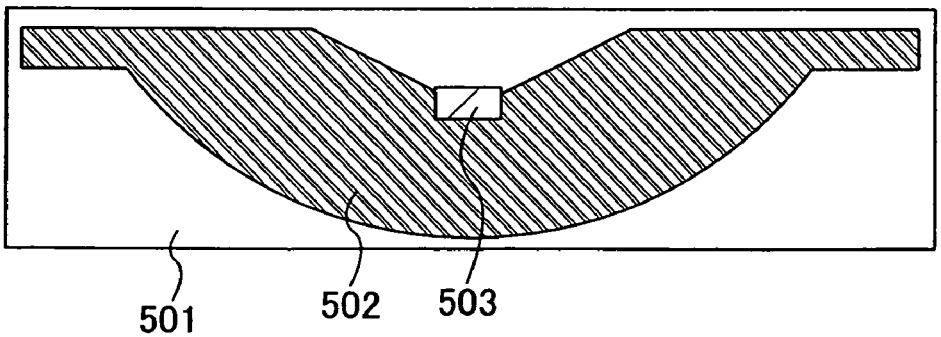

If a microwave system (e.g., an UHF band (a 860 to 960 MHz band), a 2.45 GHz band, or the like) is used as the signal transmission system in the semiconductor device, the shape such as the length of the conductive layer functioning as an antenna may be appropriately set considering the wavelength of an electromagnetic wave used for signal transmission. For example, the conductive layer functioning as an antenna can be formed into a linear shape (e.g., a dipole antenna, see FIG. 21A), a flat shape (e.g., a patch antenna, see FIG. 21B), a ribbon shape (see FIGS. 21C and 21D), or the like. The shape of the conductive layer functioning as an antenna is not limited to the form of a line; the conductive layer functioning as an antenna may also be provided in the form of a curve, a meander, or a combination of them, considering the wavelength of the electromagnetic wave.

The conductive layer functioning as an antenna is formed of a conductive material by CVD, sputtering, a printing method such as screen printing or gravure printing, a droplet discharge method, a dispensing method, a plating method, or the like. The conductive layer is formed with a single-layer structure or a multi-layer structure of an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing the element as its main component.

In the case of forming the conductive layer functioning as an antenna by using screen printing, for example, the conductive layer can be provided by selectively printing conductive paste in which conductive particles each having a particle size of several nm to several tens of μm are dissolved or dispersed in an organic resin. As the conductive particle, a metal particle of one or more of silver (Ag), gold (Au), copper (Cu), nickel (Ni), platinum (Pt), palladium (Pd), tantalum (Ta), molybdenum (Mo), and titanium (Ti), a fine particle of silver halide, or a dispersive nanoparticle can be used. In addition, as the organic resin included in the conductive paste, one or a plurality of organic resins each functioning as a binder, a solvent, a dispersant, or a coating member of the metal particle can be used. Typically, an organic resin such as an epoxy resin or a silicon resin can be used. When forming the conductive layer, baking may be preferably performed after the conductive paste is applied. For example, in the case of using fine particles (e.g., the particle size is 1 nm or more and 100 nm or less) containing silver as its main component, as a material of the conductive paste, the conductive layer can be obtained by curing by baking at a temperature of 150 to 300° C. Alternatively, fine particles containing solder or lead-free solder as its main component may be used; In this case, it is preferable to use a fine particle having a particle size of 20 μm or less. Solder or lead-free solder has an advantage of low cost.

Further, as well as the above-described materials, ceramic, ferrite, or the like may be applied to an antenna.

Further, in the case of applying an electromagnetic coupling system or an electromagnetic induction system, and providing a semiconductor device having an antenna, in contact with metal, a magnetic material having magnetic permeability may be preferably provided between the semiconductor device and the metal. In the case of providing a semiconductor device having an antenna, in contact with metal, an eddy current flows in the metal in accordance with change in magnetic field, and a demagnetizing field generated by the eddy current impairs the change in magnetic field to reduce the communication distance. Therefore, by providing a material having magnetic permeability between the semiconductor device and the metal, eddy current of the metal can be suppressed, thereby suppressing reduction in communication distance. Note that ferrite or a metal thin film having high magnetic permeability and little loss of high frequency wave can be used as the magnetic material.

Further, when providing an antenna, a semiconductor element such as a transistor and a conductive layer functioning as an antenna may be directly formed over one substrate, or alternatively, a semiconductor element and a conductive layer functioning as an antenna may be provided over different substrates and then attached to be electrically connected to each other.

As for the memory element 443 including the first conductive layer 457d, the organic compound layer 458, and the second conductive layer 459, since adhesion within the memory element is good, a defect such as film peeling does not occur at an interface between the layers by force applied at a step of transposition to the second substrate after the formation over the substrate 400 which is the first substrate. Consequently, the memory element can be peeled off and transposed with a good form, to manufacture a semiconductor device.

The semiconductor device having a memory element manufactured in this embodiment mode has good adhesion inside the memory element; therefore, a peeling and transposing process can be performed with a good state. Therefore, transposition can be freely performed to any substrate, and therefore, selectivity for a substrate material is increased. Further, an inexpensive material can also be selected for the substrate, so that the semiconductor device can be manufactured at low cost as well as having a wide function in accordance with the intended purpose.

By the present invention, a semiconductor device having a memory element having good adhesion inside the memory element, so that a transposition step can be performed with a good state can be manufactured. Therefore, a semiconductor device having higher reliability can be manufactured with a high yield without complexing the apparatus or process.

Embodiment Mode 7

In this embodiment mode, reading and writing of data in a semiconductor device having the above-described constitution will be described.

First, operation when data writing is performed to the memory element in the semiconductor device of passive matrix type will be described using FIGS. 2A to 2C, and 3A to 3C. Data writing can be performed by optical action or electrical action. Described first is the case where data writing is performed by electrical action (see FIGS. 3A to 3C). Note that the writing is performed by changing the electrical characteristics of a memory cell; and an initial state (a state before electrical action is applied) of the memory cell is denoted by data "0" while the state after the electrical characteristics are changed is denoted by data "1".

In the case of writing data "1" into the memory cell 721, the memory cell 721 is selected by the decoders 723 and 724 and a selector 725 first. Specifically, a predetermined voltage V2 is applied by the decoder 724 to a word line W3 connected to the memory cell 721. A bit line B3 connected to the memory cell 721 is connected to the circuit 726 by the decoder 723 and the selector 725. Then, a writing voltage V1 is outputted from the circuit 726 to the bit line B3. In this manner, a voltage Vw (=V1−V2) is applied between the first conductive layer and the second conductive layer for structuring the memory cell 721. By selecting the potential Vw appropriately, the organic compound layer between the conductive layers can be changed physically or electrically, thereby data "1" is written. Specifically, the electrical resistance between the first conductive layer and the second conductive layer in the state of data "1" at the reading operation voltage may be changed so as to be much smaller than that in the state of data "0". For example, the voltages may be selected appropriately within the range of (V1, V2)=(0 V, 5 to 15 V) or (3 to 5 V, −12 to −2 V). The voltage Vw may be in the range of 5 to 15 V or −15 to −5 V.

Note that unselected word and bit lines are controlled such that the data "1" is not written in memory cells connected thereto. For example, the unselected word and bit lines may be made into a floating state. Between the first conductive layer and the second conductive layer for structuring each memory cell, it is necessary to provide a characteristic for securing selectivity, such as diode characteristic.

Meanwhile, in the case of writing data "0" into the memory cell 721, electrical action is not applied to the memory cell 721. As circuit operation, for example, the memory cell 721 is selected by the decoders 723 and 724 and the selector 725, similarly to the case of writing data "1"; however, the output potential from the circuit 726 to the bit line B3 is set to be the same degree as the potential of the selected word line W3 or the potential of an unselected word line, so that a voltage (e.g., −5 to 5 V) within the degree where electrical characteristics of the memory cell 721 are not changed is applied between the first conductive layer and the second conductive layer for structuring the memory cell 721.

Figure 20A:
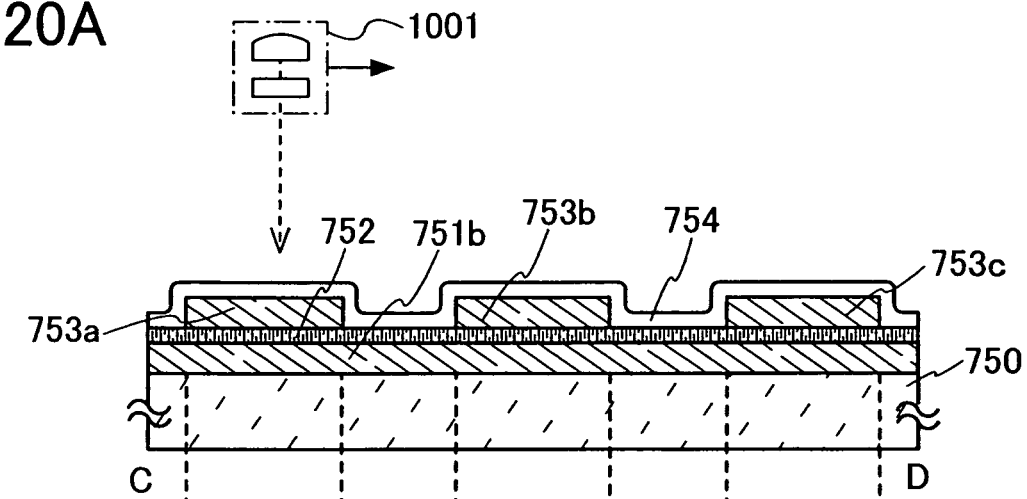
FIGS. 20A to 20C each show a semiconductor device of the invention.
Figure 20B:
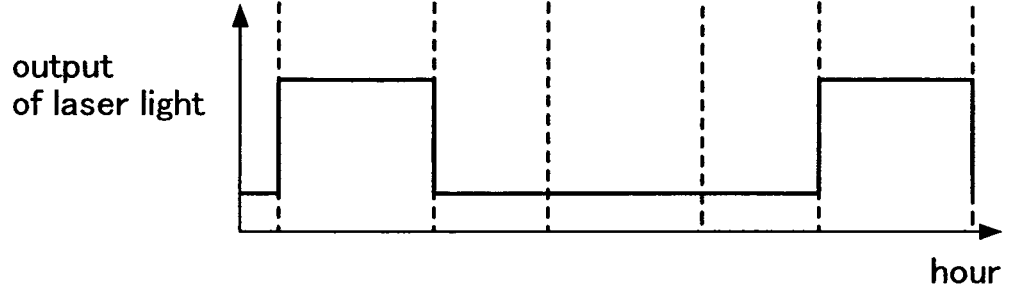

Described next is the case: where data writing is performed by optical action (see FIGS. 20A to 20C). In this case, it is necessary that the second conductive layer 753a transmits laser light. Data is written by irradiating the organic compound layer 752 with laser light from a side of a conductive layer having light-transmitting property (the second conductive layer 753a here); here, the organic compound layer 752 is broken by selectively irradiating a desired part of the organic compound layer 752 with laser light. The broken organic compound layer is insulated, thereby having much larger resistance than the other portion. In this manner, utilizing the change in electrical resistance between the two conductive layers provided with the organic compound layer 752 interposed therebetween by laser light irradiation, data is written. For example, where data of the organic compound layer to which no laser light irradiation is performed is assumed to be "0", the electrical resistance is increased by selectively irradiating a desired part of the organic compound layer with laser light and destroying the organic compound layer when data of "1" is written.

Further, in the case where a conjugated polymer doped with a compound (a photoacid generator) which generates acid by absorbing light is used for the organic compound layer 752, when the organic compound layer 752 is irradiated with laser light, the conductivity is increased only in the irradiated portion of the organic compound layer 752 whereas the non-irradiated portion thereof does not have conductivity. Accordingly, the data is written utilizing the change in electrical resistance of the organic compound layer by selectively irradiating a desired part of the organic compound layer with laser light. For example, where data of the organic compound layer to which no laser light irradiation is performed is assumed to be "0", the conductivity is increased by selectively irradiating a desired part of the organic compound layer with laser light when data of "1" is written.

In the case of laser light irradiation, the change in electrical resistance of the organic compound layer 752 is realized by laser light irradiation for which a beam spot is narrowed down on the order of μm, though it depends on the size of the memory cell 721. For example, when a laser beam with a diameter of 1 μm passes at a linear velocity of 10 m/sec, the length of time for which the organic compound layer included in each memory cell is irradiated with the laser light, is 100 nsec. In order to change the phase within the short time of 100 nsec, laser power may be 10 mW and power density may be 10 kW/mm$^2$. Furthermore, in the case of selective irradiation with laser light, a pulsed laser irradiation apparatus is preferably used.

Figure 20C:
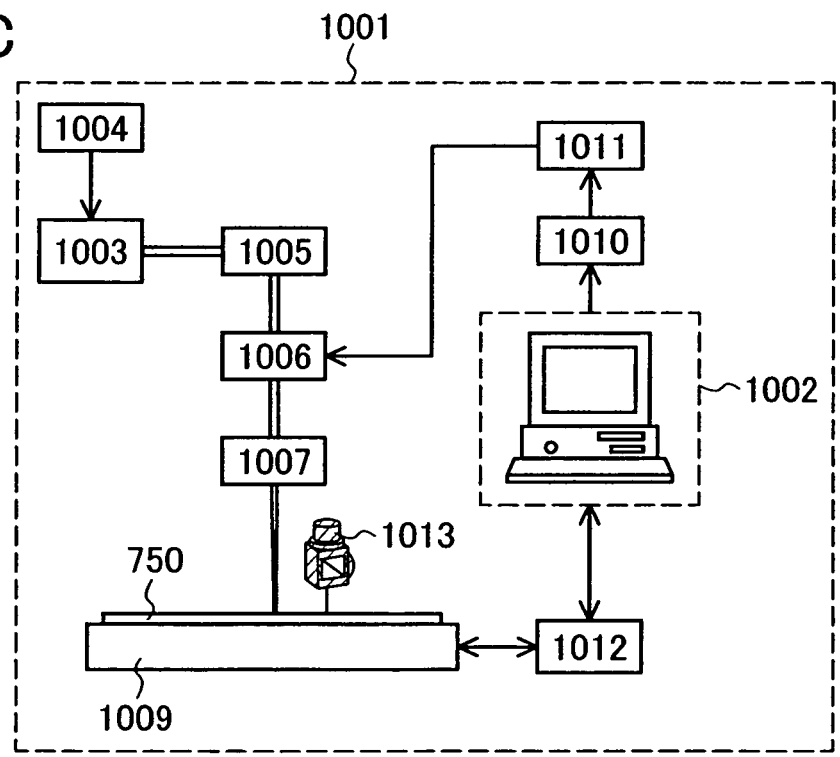

Here, an example of a laser irradiation apparatus will be briefly described using FIG. 20C. A laser irradiation apparatus 1001 is equipped with a computer (hereinafter referred to as a PC) 1002 which carries out various controls at laser light irradiation; a laser oscillator 1003 which outputs laser light; a power supply 1004 of the laser oscillator 1003; an optical system (an ND filter) 1005 for attenuating laser light; an acousto-optic modulator (AOM) 1006 for modulating the intensity of laser light; an optical system 1007 which is structured by a lens for condensing a cross-section of laser light, a mirror for changing an optical path, and the like; a movement mechanism 1009 having an x-axis stage and a y-axis stage; a D/A converter portion 1010 for digital-analog conversion of a control data outputted from the PC; a driver 1011 which controls the acousto-optic modulator 1006 in accordance with an analog voltage outputted from the D/A converter portion; a driver 1012 which outputs a driving signal for driving the movement mechanism 1009; and an auto-focus mechanism 1013 for focusing laser light on an object to be irradiated (see FIG. 20C).

As the laser oscillator 1003, a laser oscillator which is capable of oscillating ultraviolet light, visible light, or infrared light can be used. As the laser oscillator, an excimer laser oscillator of KrF, ArF, XeCl, Xe, or the like; a gas laser oscillator of He, He—Cd, Ar, He—Ne, HF, or the like; a solid-state laser oscillator using a crystal of YAG, GdVO$_4$, YVO$_4$, YLF, YAlO$_3$ or the like doped with Cr, Nd, Er, Ho, Ce, Co, Ti, or Tm; or a semiconductor laser oscillator of GaN, GaAs, GaAlAs, InGaAsP, or the like can be used. As for the solid-state laser oscillator, the fundamental wave or the second to the fifth harmonic may be preferably applied.

Next, an irradiation method using the laser irradiation apparatus will be described. When the substrate provided with the organic compound layer is placed in the movement mechanism 1009, the PC 1002 detects a position of the organic compound layer which is to be irradiated with laser light, with a camera that is outside the figure. Subsequently, based on the detected position data, the PC 1002 generates movement data for moving the movement mechanism 1009.

Then, the PC 1002 controls the output amount of light of the acousto-optic modulator 1006 via the driver 1011, thereby laser light outputted from the laser oscillator 1003 is attenuated by the optical system 1005 and then the light amount thereof is controlled by the acousto-optic modulator 1006 so as to be a predetermined light amount. On the other hand, an optical path and a beam spot form of the laser light outputted from the acousto-optic modulator 1006 are changed by the optical system 1007, and condensed by the lens, and then, the substrate 750 is irradiated with the light.

At this time, the movement mechanism 1009 is controlled to move in an x direction and a y direction in accordance with the movement data generated by the PC 1002. As a result, a predetermined position is irradiated with laser light, the light energy density of laser light is converted to heat energy, and the organic compound layer provided over the substrate 750 can be selectively irradiated with laser light. Note that although the case where laser light irradiation is performed by moving the movement mechanism 1009 is described here, laser light may also be moved in the x direction and the y direction by adjusting the optical system 1007.

According to the structure of the invention in which data writing is performed by laser light irradiation as described above, a semiconductor device can be manufactured easily and in large quantity. Accordingly, a semiconductor device can be provided at low cost.

Next, operation when data reading is performed from the memory element in the semiconductor device of passive matrix type will be described (see FIGS. 3A to 3C). The data reading is performed by utilizing difference in electrical characteristics between the first conductive layer and the second conductive layer for structuring each memory cell, between a memory cell having data "0" and a memory cell having data "1". For example, when the effective electrical resistance between the first conductive layer and the second conductive layer for structuring each memory cell (hereinafter called merely the electrical resistance of each memory cell) having data "0" is R0 at a reading voltage whereas the electrical resistance of each memory cell having data "1" is R1 at the reading voltage, a method of reading data by utilizing the difference in electrical resistance will be described. Noted that R1<<R0. In the reading/writing circuit, the circuit 726 using a resistor 746 and a differential amplifier 747 shown in FIG. 3B can be considered, for example, as constitution of a reading portion. The resistor 746 has a resistance value Rr, and R1<Rr<R0. A transistor 748 may be provided instead of the resistor 746 and a clocked inverter 749 may be provided instead of the differential amplifier (FIG. 3C). A signal φ or an inverted signal $\bar{\phi}$ which is High in the case of reading and is Low in the case of not reading is inputted into the clocked inverter 749. It is needless to say that the circuit constitution is not limited to FIGS. 3A to 3C.

When data is read from the memory cell 721, the memory cell 721 is selected by the decoders 723 and 724 and the selector 725 first. Specifically, a predetermined voltage Vy is applied by the decoder 724 to a word line Wy connected to the memory cell 721. A bit line Bx connected to the memory cell 721 is connected to a terminal P of the circuit 726 by the decoder 723 and the selector 725. As a result, a potential Vp of the terminal P is determined by resistance division by a resistor 246 (a resistance value Rr) and the memory cell 721 (a resistance value R0 or R1). Therefore, in the case where the memory cell 721 has data "0", Vp0=Vy+(V0−Vy)×R0/(R0+Rr); in the case where the memory cell 721 has data "1", Vp1=Vy+(V0−Vy)×R1/(R1+Rr). Accordingly, Vref is selected so as to be between Vp0 and Vp1 in FIG. 3B whereas the point of change of the clocked inverter is selected so as to be between Vp0 and Vp1 in FIG. 3C, so that Low/High (or High/Low) is outputted as an output potential Vout in accordance with the data "0"/"1", thereby performing data reading.

For example, the differential amplifier is operated at Vdd of 3 V, and Vy is set to be 0 V, V0 is set to be 3 V, and Vref is set to be 1.5 V. If R0/Rr=Rr/R1=9, Vp0 is 2.7 V and High is outputted as Vout when data of the memory cell is "0", while Vp1 is 0.3 V and Low is outputted as Vout when data of the memory cell is "1". In this manner, data reading from the memory cell can be performed.

In the above method, the electrical resistance of the organic compound layer 752 is read by a voltage value by utilizing the difference in resistance value and the resistance division. It is needless to say that the reading method is not limited to this. For example, as well as utilizing the difference in electrical resistance, difference in current value may also be utilized to read data. Further, in the case where the electrical characteristics of the memory cell have a diode characteristic in which threshold voltage is different between the cases of data "0" and "1", data may also be read utilizing difference in threshold voltage.

Next, operation when data writing is performed to the memory element in the semiconductor device of active matrix type will be described (see FIGS. 4A and 4B, and 5A to 5C).

Described first is the case where data writing is performed by electrical action. Note that the writing is performed by changing the electrical characteristics of a memory cell; and an initial state (a state before electrical action is applied) of the memory cell is denoted by data "0" while the state after the electrical characteristics are changed is denoted by data "1".

Described here is made of the case of data writing into the memory cell 231 in the n-th row and m-th column. In the case of writing data "1" into the memory cell 231 in the n-th row and m-th column, the memory cell 231 is selected by the decoders 223 and 224 and a selector 225 first. Specifically, a predetermined voltage V22 is applied by the decoder 224 to a word line Wn connected to the memory cell 231. A bit line B3 connected to the memory cell 231 is connected to the circuit 226 including the reading circuit and the writing circuit by the decoder 223 and the selector 225. Then, a writing voltage V21 is outputted from the circuit 226 to the bit line B3.

Thus, the transistor 210a for constituting the memory cell is turned on and the memory element 215b is electrically connected to the bit line, and then a voltage of approximately Vw (=Vcom−V21) is applied. Note that one electrode of the memory element 215b is connected to a common electrode of a potential Vcom. By selecting the potential Vw appropriately, the organic compound layer between the conductive layers is changed physically or electrically, thereby data "1" is written. Specifically, the electrical resistance between the first electrode layer and the second electrode layer in the state of data "1" at a reading operation voltage may be changed so as to be much smaller than that in the state of data "0", or the circuit may be simply shorted. Note that, the potentials may be selected appropriately within the range of (V21, V22, Vcom) =(5 to 15 V, 5 to 15 V, 0 V) or (−12 to 0 V, −12 to 0 V, 3 to 5V). The voltage Vw may be in the range of 5 to 15 V or −15 to −5 V.

Note that unselected word and bit lines are controlled such that the data "1" is not written in memory cells connected thereto. For example, a potential (e.g., 0 V) for turning off the transistor of each memory cell may be applied to the unselected word lines connected to the memory cell to make the unselected bit lines into a floating state, or a potential which is approximately equal to Vcom may be applied.

On the other hand, in the case of writing data "0" into the memory cell 231, electrical action is not applied to the memory cell 231. As circuit operation, for example, the memory cell 231 is selected by the decoders 223 and 224 and the selector 225, similarly to the case of writing data "1"; however, the output potential from the circuit 226 to the bit line B3 is set to be the same degree as Vcom or the bit line B3 is made into a floating state. Consequently, a low voltage (e.g., −5 to 5 V) or no voltage is applied to the memory element 215b so that the electrical characteristics are not changed, thereby writing of data "0" is achieved.

Described next is the case where data writing is performed by optical action. In this case, data is written by irradiating the organic compound layer with laser light from a side of a conductive layer having light-transmitting property, using a laser irradiation apparatus. As the laser irradiation apparatus, the same apparatus described using FIGS. 20A to 20C, for the semiconductor device of passive matrix type may be used.

In the case where an organic compound material is used as the organic compound layer, the organic compound layer is oxidized or carbonized to be insulated by laser light irradiation. Thus, the resistance value of a memory element that is irradiated with laser light is increased, while the resistance value of a memory element that is not irradiated with laser light is not changed. In the case where a conjugated polymer material doped with a photoacid generator is used, conductivity is provided for the organic compound layer by laser light irradiation. That is, conductivity is provided for a memory element that is irradiated with laser light, while conductivity is not provided for a memory element that is not irradiated with laser light.

Next, operation when data reading is performed by electrical action will be described. Here, the circuit 226 has constitution including the resistor 246 and a differential amplifier 247; however, the constitution of the circuit 226 is not limited to this, and any constitution can be employed.

Operation when data reading is performed by electrical action in the semiconductor device of active matrix type will be described. The data reading is performed by utilizing difference in electrical characteristics of the memory element 215b, between a memory cell having data "0" and a memory cell having data "1". For example, when the electrical resistance of the memory element for structuring each memory cell having data "0" is R0 at a reading voltage whereas the electrical resistance of the memory element for structuring each memory cell having data "1" is R1 at the reading voltage, a method of reading data by utilizing the difference in electrical resistance will be described. Noted that R1<<R0. In the reading/writing circuit, the circuit 226 using the resistor 246 and the differential amplifier 247 shown in FIG. 5B can be considered, for example, as constitution of a reading portion. The resistor has a resistance value Rr, and R1<Rr<R0. A transistor 249 may be provided instead of the resistor 246 and a clocked inverter 248 may be provided instead of the differential amplifier (FIG. 5C). It is needless to say that the circuit constitution is not limited to FIGS. 5A to 5C.

When data is read from the memory cell 231 in the x-th row and y-th column, the memory cell 231 is selected by the decoders 223 and 224 and the selector 225 first. Specifically, a predetermined voltage V24 is applied by the decoder 224 to the word line Wy connected to the memory cell 231. The bit line Bx connected to the memory cell 231 is connected to a terminal P of the circuit 226 by the decoder 223 and the selector 225. As a result, a potential Vp of the terminal P is determined by resistance division by the resistor 246 (the resistance value Rr) and the memory cell 215b (a resistance value R0 or R1). Therefore, in the case where the memory cell 231 has data "0", Vp0=Vcom+(V0−Vcom)×R0/(R0+Rr); in the case where the memory cell 231 has data "1", Vp1=Vcom+(V0−Vcom)×R1/(R1+Rr). Accordingly, Vref is selected so as to be between Vp0 and Vp1 in FIG. 5B whereas the point of change of the clocked inverter is selected so as to be between Vp0 and Vp1 in FIG. 5C, so that Low/High (or High/Low) is outputted as an output potential Vout in accordance with the data "0"/"1", thereby performing data reading.

For example, the differential amplifier is operated at Vdd of 3 V, and Vcom is set to be 0 V, V0 is set to be 3 V, and Vref is set to be 1.5 V. If R0/Rr=Rr/R1=9 and the on-resistance of the transistor 210a is not required to be considered, Vp0 is 2.7 V and High is outputted as Vout when data of the memory cell is "0", while Vp1 is 0.3 V and Low is outputted as Vout when data of the memory cell is "1". In this manner, data reading from the memory cell can be performed.

In the above method, data is read by a voltage value by utilizing the difference in resistance value of the memory element 215b and the resistance division. Of course, the reading method is not limited to this. For example, as well as utilizing the difference in electrical resistance, difference in current value may also be utilized to read data. Further, in the case where the electrical characteristics of the memory cell have a diode characteristic in which threshold voltage is different in the data "0" and "1", data may also be read utilizing difference in threshold voltage.

Each of the memory element and the semiconductor device provided with the memory element, having the above-described constitution is a nonvolatile memory; therefore, it is not necessary to incorporate a battery for keeping data, and a small, thin, and light-weight semiconductor device can be provided. Moreover, by using the insulating material used in the above embodiment modes, as an organic compound layer, data can be written (added), but rewriting of data can not be performed; accordingly, forgery is prevented so that a semiconductor device with security ensured can be provided.

Note that this embodiment mode can be implemented freely combining with the constitution of the memory element and the semiconductor device having the memory element described in the above embodiment modes.

Embodiment Mode 8

Figure 12A:
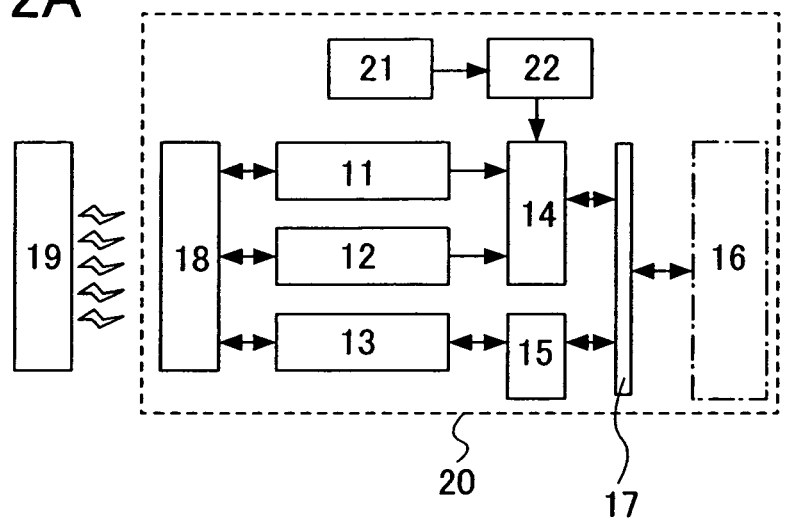
FIGS. 12A and 12B each show a semiconductor device of the invention.

Constitution of a semiconductor device of this embodiment mode will be described using FIG. 12A. As shown in FIG. 12A, a semiconductor device 20 of the invention has a function of communicating data in a non-contact manner, which includes a power supply circuit 11, a clock generating circuit 12, a data modulating/demodulating circuit 13, a controlling circuit 14 for controlling another circuit, an interface circuit 15, a memory circuit 16, a data bus 17, and an antenna (an antenna coil) 18, a sensor 21, and a sensor circuit 22.

The power supply circuit 11 is a circuit generating various power supplies to be supplied to the respective circuits in the semiconductor device 20 based on an alternating signal inputted from the antenna 18. The clock generating circuit 12 is a circuit generating various clock signals to be supplied to the respective circuits in the semiconductor device 20 based on an alternating signal inputted from the antenna 18. The data modulating/demodulating circuit 13 has a function of modulating/demodulating data to be communicated with a reader/writer 19. The controlling circuit 14 has a function of controlling the memory circuit 16. The antenna 18 has a function of transmitting and receiving an electromagnetic wave or an electric wave. The reader/writer 19 communicates with the semiconductor device, controls the semiconductor device, and controls processing of the data thereof. The semiconductor device is not limited to the above constitution; for example, another element such as a limiter circuit of power supply voltage or hardware dedicated for code processing may be added.

The memory circuit 16 includes a memory element in which an organic compound layer or a phase-change layer is sandwiched between a pair of conductive layers. Note that the memory element 16 may include only the memory element in which an organic compound layer or a phase-change layer is sandwiched between a pair of conductive layers or include a memory circuit having another constitution. The memory circuit having another constitution corresponds, for example, to one or a plurality of the following: a DRAM, an SRAM, a FeRAM, a mask ROM, a PROM, an EPROM, an EEPROM, and a flash memory.

The sensor 21 is constituted from a semiconductor circuit such as a resistor, a capacitive coupling element, an inductive coupling element, a photovoltaic element, a photoelectric conversion element, a thermo-electromotive force element, a transistor, a thermistor, or a diode. By the sensor circuit 22, a change of impedance, reactance, inductance, voltage, or current, is detected and is subjected to analog/digital conversion (A/D conversion), so that a signal is outputted to the controlling circuit 14.

Embodiment Mode 9

According to the present invention, a semiconductor device functioning as a chip having a processor circuit (hereinafter also called a processor chip, a wireless chip, a wireless processor, a wireless memory, or a wireless tag) can be formed. The application range of the semiconductor device of the invention is wide. For example, the semiconductor device of the invention can be used by providing for paper money, coins, securities, certificates, bearer bonds, packing containers, books, recording media, personal belongings, vehicles, food, clothing, health products, commodities, medicine, electronic devices, or the like.

The semiconductor device having a memory element using the invention has good adhesion inside the memory element; therefore, a peeling and transposing process can be performed with a good state. Therefore, transposition can be freely performed to any substrate, and therefore, an inexpensive material can also be selected for the substrate, so that the semiconductor device can be manufactured at low cost as well as having a wide function in accordance with the intended purpose. Therefore, the chip having a processor circuit has also characteristics of low-cost, small and thin size, and light-weight according to the invention, and thus is suitable for currency, coins circulating widely, or books, personal belongings, clothing, or the like which tends to be carried.

Paper money and coins are money circulated in the market and include in its category ones (cash vouchers) valid in a certain area similarly to currency, memorial coins, and the like. Securities refer to checks, certificates, promissory notes, or the like, and can be provided with a chip 90 having a processor circuit (see FIG. 13A). Certificates refer to driver's licenses, certificates of residence, or the like, and can be provided with a chip 91 having a processor circuit (see FIG. 13B). Personal belongings refer to bags, glasses, or the like, and can be provided with a chip 97 having a processor circuit (see FIG. 13C). Bearer bonds refer to stamps, rice coupons, various gift certificates, or the like. Packing containers refer to wrapping paper for food containers and the like, plastic bottles, or the like, and can be provided with a chip 93 having a processor circuit (see FIG. 13D). Books refer to hardbacks, paperbacks, or the like, and can be provided with a chip 94 having a processor circuit (see FIG. 13E). Recording media refer to DVD software, video tapes, or the like, and can be provided with a chip 95 having a processor circuit (see FIG. 13F). Vehicles refer to wheeled vehicles such as bicycles, ships, or the like, and can be provided with a chip 96 having a processor circuit (see FIG. 13G). Food refers to food articles, drink, or the like. Clothing refers to clothes, footwear, or the like. Health products refer to medical instruments, health instruments, or the like. Commodities refer to furniture, lighting equipment, or the like. Medicine refers to medical products, pesticides, or the like. Electronic devices refer to liquid crystal display devices, EL display devices, television devices (TV sets and thin TV sets), cellular phones, or the like.

The semiconductor device of the invention is fixed to such an article by being mounted onto a printed-circuit board, by being attached to a surface thereof, or by being embedded therein. For example, in the case of a book, the semiconductor device may be embedded in paper thereof; in the case of a package made from an organic resin, the semiconductor device may be embedded in the organic resin. The semiconductor device of the invention which can realize small and thin size and light weight does not damage the design of an article itself even after being fixed to the article. Further, by providing the semiconductor device of the invention for paper money, coins, securities, certificates, bearer bonds, or the like, an identification function can be provided, and forgery can be prevented by utilizing the identification function. Further, efficiency of a system such as an inspection system can be improved by providing the semiconductor device of the invention for packing containers, recording media, personal belongings, food, clothing, commodities, electronic devices, or the like.

Figure 12B:
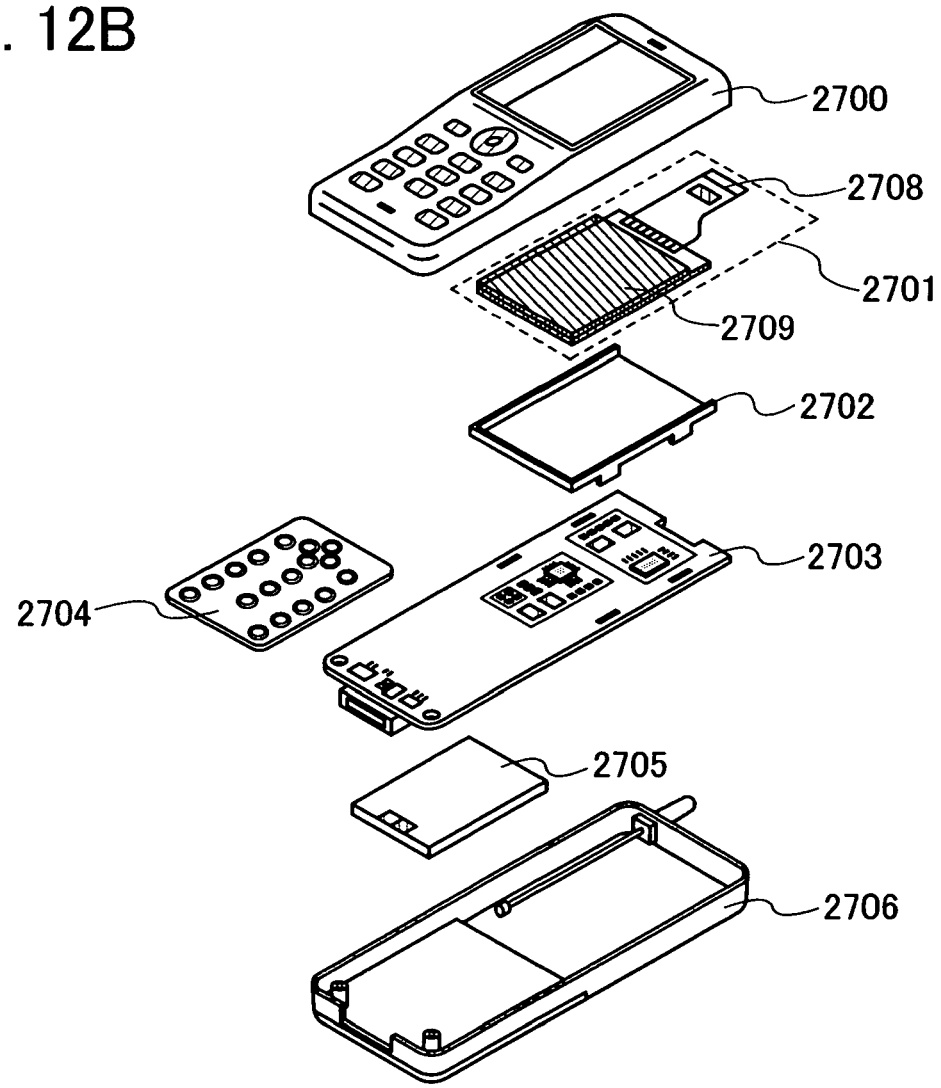

Next, one mode of the electronic device to which the semiconductor device of the invention has been mounted will be described with reference to the drawing. The electronic device exemplified here is a mobile phone, which includes cases 2700 and 2706, a panel 2701, a housing 2702, a printed-wiring board 2703, operation buttons 2704, and a battery 2705 (see FIG. 12B). The panel 2701 is detachably incorporated in the housing 2702 and the housing 2702 is fitted into the printed-wiring board 2703. The shape and size of the housing 2702 is changed appropriately in accordance with the electronic device into which the panel 2701 is incorporated. On the printed-wiring board 2703, a plurality of packaged semiconductor devices are mounted; the semiconductor device of the invention can be used as one of the packaged semiconductor devices. The plurality of semiconductor devices mounted on the printed-wiring board 2703 have any function selected from a controller, a central processing unit (CPU), a memory, a power supply circuit, an audio processing circuit, a sending/receiving circuit, and the like.

The panel 2701 is connected to the printed-wiring board 2703 via a connection film 2708. The above-described panel 2701, housing 2702, and printed-wiring board 2703 are contained together with the operation buttons 2704 and the battery 2705, inside the cases 2700 and 2706. A pixel region 2709 in the panel 2701 is provided so as to be viewed through an opening window provided in the case 2700.

As described above, the semiconductor device of the present invention has characteristics of small and thin size, and light-weight. The characteristics make it possible to efficiently use the limited space inside the cases 2700 and 2706 of the electronic device.

Further, since the semiconductor device of the invention includes a memory element having a simple structure in which an organic compound layer is sandwiched between a pair of conductive layers, an electronic device using an inexpensive semiconductor device can be provided. Moreover, since high integration is easy with the semiconductor device of the invention, an electronic device using a semiconductor device having a memory circuit with large capacity can be provided.

Further, the memory element included in the semiconductor device of the invention, to which data is written by optical action or electrical action, has characteristics of being nonvolatile and capable of additional writing of data. The characteristics make it possible to prevent forgery caused by rewriting and to additionally write new data. Therefore, an electronic device that uses a highly functional and highly value-added semiconductor device can be provided.

It is to be noted that the shapes of the cases 2700 and 2706 are just an example of exterior shape of a mobile phone; the electronic device of this embodiment mode can be modified into various modes in accordance with the function and intended use.

Embodiment 1

Results obtained by manufacturing a memory element by using the invention and performing a transposition step are shown in this embodiment.

A titanium film as a first conductive layer, a polyimide film with a thickness of 1.5 μm covering a part of the first conductive layer, as a partition, a calcium fluoride ($CaF_2$) film with a thickness of 1 nm as an insulating layer, and an NPB film with a thickness of 10 nm as an organic compound layer were stacked on a glass substrate, and different materials and manufacturing methods were used for forming a second conductive layer, so that Samples 1 to 7 were manufactured. As a comparative example, a sample in which an aluminum film was used as a second conductive layer was manufactured. Note that in this embodiment, after the polyimide film was formed over the first conductive layer so as to have an opening, oxygen ($O_2$) ashing was performed in order to remove a polyimide residue on the first conductive layer.

The second conductive layer was: an indium film (thickness: 200 nm) in Sample 1; a stacked-layer of an indium film (thickness: 100 nm) and an aluminum film (thickness: 200 nm) in Sample 2; an indium-tin alloy film (thickness: 200 nm) containing tin at 10 wt % in Sample 3; an indium-tin alloy film (thickness: 200 nm) containing tin at 1 wt % in Sample 4; a stacked-layer of an indium-tin alloy film (thickness: 100 nm) containing tin at 10 wt % and an aluminum film (thickness: 200 nm) in Sample 5; a magnesium-indium alloy film (thickness: 150 nm) containing magnesium at 10 wt % in Sample 6; and a manganese film (thickness: 80 nm) in Sample 7. In Samples 1, 2, and 7, the films were formed by evaporation. The indium-tin alloy films in Samples 3 to 5 were films formed by co-evaporating indium and tin, and the magnesium-indium alloy film in Sample 6 was a film formed by co-evaporating magnesium and indium. The aluminum film in the comparative example was also formed by evaporation with a thickness of 200 nm. Note that the area of each organic compound layer was approximately 100 $mm^2$ in all samples, and the area of each second conductive layer was approximately 170 $mm^2$. Note also that in the indium-tin alloy film, the electrical resistance is reduced by adding tin into indium at 0.1 wt % or more, which is preferable in that conductivity to an external terminal can be easily kept.

On each memory element formed over the glass substrate, of Samples 1 to 7 and the comparative example, an epoxy resin was applied by permeographic printing, and heated at 110° C. for 60 minutes in a nitrogen atmosphere, to form an epoxy resin layer at a thickness of 100 to 200 μm. After that, each memory element of Samples 1 to 7 and the comparative example was peeled off and transposed to the epoxy resin layer. Respective transposition states are shown in Chart 1.

CHART 1

| Sample | Structure | Transposition state | Remarks |
| --- | --- | --- | --- |
| 1 | In | o | |
| 2 | In\Al | o | |
| 3 | InSn | o | Sn 10 wt % |
| 4 | InSn | o | Sn 1 wt % |
| 5 | InSn\Al | o | Sn 10 wt % |
| 6 | InMg | o | Mg 10 wt % |
| 7 | Mn | o | |
| Comparative Example | Al | x | |

In all of Samples 1 to 7 in this embodiment which were manufactured using the invention, the peeling could be performed with a good state without film peeling, a peeling residual, or the like when viewing. On the other hand, in the case of the memory element of the comparative example in which the aluminum film was formed as the second conductive layer, only the aluminum film was transposed to the epoxy resin layer so that the memory element could not be peeled entirely from the glass substrate.

As described above, it could be confirmed that, since the memory element manufactured using the invention had good adhesion inside the memory element, a peeling and transposing process could be performed with a good state. Therefore, transposition can be freely performed to any substrate, and therefore, selectivity for a substrate material is increased. Further, an inexpensive material can also be selected for the substrate, so that the semiconductor device can be manufactured at low cost as well as having a wide function in accordance with the intended purpose.

By the invention, a semiconductor device including a memory element which has high adhesion inside the memory element so as to perform a transposition step with a good state can be manufactured. Therefore, a semiconductor device having higher reliability can be manufactured with a high yield without complexing the process.

Embodiment 2

Results obtained by manufacturing a memory element by using the invention and performing a transposition step are shown in this embodiment.

Similarly to Embodiment 1, a titanium film as a first conductive layer, a calcium fluoride ($CaF_2$) film with a thickness of 1 nm as an insulating layer, and an NPB film with a thickness of 10 nm as an organic compound layer were stacked on a glass substrate, and a second conductive layer was formed. In this embodiment, an indium-tin alloy film was formed as the second conductive layer with a thickness of 200 nm by evaporation using an indium-alloy alloy containing tin at 5 wt %, as an evaporation source. Note that the area of the organic compound layer was approximately 1 $mm^2$, and the area of the second conductive layer was approximately 170 $mm^2$. Note also that in this embodiment, after the polyimide film was formed over the first conductive layer so as to have an opening, oxygen ($O_2$) ashing was performed in order to remove a polyimide residue on the first conductive layer.

Over the memory element formed over the glass substrate, of this embodiment, an epoxy resin was applied by permeographic printing, and heated at 110° C. for 60 minutes in a nitrogen atmosphere, to form an epoxy resin layer at a thickness of 100 to 200 μm. After that, the memory element of this embodiment was peeled off and transposed to the epoxy resin layer.

The memory element of this embodiment manufactured using the invention could be peeled off with a good state without film peeling, a peeling residual, or the like when viewing.

As described above, it could be confirmed that, since the memory element manufactured using the invention had good adhesion inside the memory element, a peeling and transposing process could be performed with a good state. Therefore, transposition can be freely performed to any substrate, and therefore, selectivity for a substrate material is increased. Further, an inexpensive material can also be selected for the substrate, so that the semiconductor device can be manufactured at low cost as well as having a wide function in accordance with the intended purpose.

By the invention, a semiconductor device including a memory element which has high adhesion inside the memory element so as to perform a transposition step with a good state can be manufactured. Therefore, a semiconductor device having higher reliability can be manufactured with a high yield without complexing the process.

This application is based on Japanese Patent Application serial no. 2005-325448 filed in Japan Patent Office on Nov. 9, 2005, the entire contents of which are hereby incorporated by reference.

The invention claimed is:

1. A manufacturing method of a semiconductor device, comprising the steps of;
   forming a first electrode over a first substrate;
   performing oxidation treatment to a surface of the first electrode;
   performing nitriding treatment to the surface of the first electrode:
   forming an organic compound layer to be in contact with the surface of the first electrode;
   forming a second electrode over the organic compound layer to manufacture a memory element including the first electrode, the organic compound layer, and the second electrode;
   attaching a second substrate having flexibility to the second electrode;
   peeling the memory element from the first substrate; and
   attaching the memory element to a third substrate with an adhesion layer,
   wherein the oxidation treatment is performed to reduce an interface tension of an interface between the first electrode and the organic compound layer.

2. The manufacturing method of a semiconductor device according to claim 1, wherein at least one of the first electrode and the second electrode comprises one kind or plural kinds of indium, tin, lead, bismuth, calcium, manganese, and zinc.

3. The manufacturing method of a semiconductor device according to claim 1, wherein one of the first electrode and the second electrode is electrically connected to a transistor.

4. The manufacturing method of a semiconductor device according to claim 1, further comprising the step of performing oxidation treatment to a surface of the second electrode, wherein the surface of the second electrode is in contact with the organic compound layer.

5. The manufacturing method of a semiconductor device according to claim 1, further comprising the step of performing treatment for reducing an interface tension to a surface of the second electrode,
   wherein the surface of the second electrode is in contact with the organic compound layer.

6. A manufacturing method of a semiconductor device, comprising the steps of:
   forming a first electrode;
   performing treatment for reducing an interface tension to a surface of the first electrode;
   performing nitriding treatment to the surface of the first electrode;
   forming an organic compound layer to be in contact with the surface of the first electrode; and
   forming a second electrode over the organic compound layer to manufacture a memory element.

7. The manufacturing method of a semiconductor device according to claim 6, wherein at least one of the first electrode and the second electrode comprises one kind or plural kinds of indium, tin, lead, bismuth, calcium, manganese, and zinc.

8. The manufacturing method of a semiconductor device according to claim 6, wherein one of the first electrode and the second electrode is electrically connected to a transistor.

9. The manufacturing method of a semiconductor device according to claim 6, further comprising the step of performing oxidation treatment to a surface of the second electrode, wherein the surface of the second electrode is in contact with the organic compound layer.

10. The manufacturing method of a semiconductor device according to claim 6, further comprising the step of performing treatment for reducing an interface tension to a surface of the second electrode,
    wherein the surface of the second electrode is in contact with the organic compound layer.

11. A manufacturing method of a semiconductor device, comprising the steps of:
    forming a first electrode;
    performing oxidation treatment to a surface of the first electrode;
    performing nitriding treatment to the surface of the first electrode;
    forming an organic compound layer to be in contact with the surface of the first electrode;
    forming a second electrode over the organic compound layer to manufacture a memory element,
    wherein the oxidation treatment is performed to reduce an interface tension of an interface between the first electrode and the organic compound layer.

12. The manufacturing method of a semiconductor device according to claim 11, wherein at least one of the first electrode and the second electrode comprises one kind or plural kinds of indium, tin, lead, bismuth, calcium, manganese, and zinc.

13. The manufacturing method of a semiconductor device according to claim 11, wherein one of the first electrode and the second electrode is electrically connected to a transistor.

14. The manufacturing method of a semiconductor device according to claim 11, further comprising the step of performing oxidation treatment to a surface of the second electrode, wherein the surface of the second electrode is in contact with the organic compound layer.

15. The manufacturing method of a semiconductor device according to claim 11, further comprising the step of performing treatment for reducing an interface tension to a surface of the second electrode, wherein the surface of the second electrode is in contact with the organic compound layer.

16. A manufacturing method of a semiconductor device, comprising the steps of:
forming a first electrode over a first substrate;
performing treatment for reducing an interface tension to a surface of the first electrode;
performing nitriding treatment to the surface of the first electrode;
forming an organic compound layer to be in contact with the surface of the first electrode;
forming a second electrode over the organic compound layer to manufacture a memory element including the first electrode, the organic compound layer, and the second electrode;
attaching a second substrate having flexibility to the second electrode;
peeling the memory element from the first substrate; and
attaching the memory element to a third substrate with an adhesion layer.

17. The manufacturing method of a semiconductor device according to claim 16, wherein at least one of the first electrode and the second electrode comprises one kind or plural kinds of indium, tin, lead, bismuth, calcium, manganese, and zinc.

18. The manufacturing method of a semiconductor device according to claim 16, wherein one of the first electrode and the second electrode is electrically connected to a transistor.

19. The manufacturing method of a semiconductor device according to claim 16, further comprising the step of performing oxidation treatment to a surface of the second electrode, wherein the surface of the second electrode is in contact with the organic compound layer.

20. The manufacturing method of a semiconductor device according to claim 16, further comprising the step of performing treatment for reducing an interface tension to a surface of the second electrode,
wherein the surface of the second electrode is in contact with the organic compound layer.

21. The manufacturing method of a semiconductor device, according to any one of claims 1, 6, 11, and 16,
wherein the second electrode is formed in an oxygen atmosphere.

22. The manufacturing method of a semiconductor device, according to claim 1 or 16, further comprising the step of forming a peeling layer interposed between the first substrate and the first electrode.

23. The manufacturing method of a semiconductor device according to any one of claims 1, 6, 11, and 16,
wherein the organic compound layer is one selected from polyimide, acrylic, polyamide, benzocyclobutene, and epoxy resins.

* * * * *